US009496885B2

(12) United States Patent
Takayama

(10) Patent No.: US 9,496,885 B2
(45) Date of Patent: Nov. 15, 2016

(54) ANALOG-TO-DIGITAL CONVERSION CIRCUIT

(71) Applicant: Socionext, Inc., Yokohama-shi, Kanagawa (JP)

(72) Inventor: Takeshi Takayama, Kasugai (JP)

(73) Assignee: SOCIONEXT, INC., Yokohama (JP)

( * ) Notice: Subject to any disclaimer, the term of this patent is extended or adjusted under 35 U.S.C. 154(b) by 0 days.

(21) Appl. No.: 14/630,422

(22) Filed: Feb. 24, 2015

(65) Prior Publication Data

US 2015/0256190 A1 Sep. 10, 2015

(30) Foreign Application Priority Data

Mar. 10, 2014 (JP) ................................ 2014-046559

(51) Int. Cl.
*H03M 1/10* (2006.01)
*H03M 1/46* (2006.01)

(52) U.S. Cl.
CPC ........... *H03M 1/1033* (2013.01); *H03M 1/109* (2013.01); *H03M 1/468* (2013.01)

(58) Field of Classification Search
CPC .............................. H03M 1/06–1/0612; H03M 1/1038–1/1042; H03M 1/403; H03M 1/466–1/468; H03M 1/802–1/804
See application file for complete search history.

(56) References Cited

U.S. PATENT DOCUMENTS

| 4,970,514 A | * | 11/1990 | Draxelmayr | ........ | H03M 1/1042 |
| | | | | | 324/130 |
| 6,707,403 B1 | * | 3/2004 | Hurrell | ............... | H03M 1/1061 |
| | | | | | 341/120 |

(Continued)

FOREIGN PATENT DOCUMENTS

| JP | 07-086947 A | 3/1995 |
| JP | 2010-263399 A | 11/2010 |

(Continued)

OTHER PUBLICATIONS

Ogawa, Tomohiko, et al., "Non-binary SAR ADC with Digital Error Correction for Low Power Applications", Circuits and Systems (APCCAS), IEEE Asia Pacific Conference, Dec. 6-9, 2010.

*Primary Examiner* — Howard Williams
(74) *Attorney, Agent, or Firm* — Arent Fox LLP

(57) ABSTRACT

An analog-to-digital conversion circuit includes capacitors coupled to a common line. Each capacitor has a capacitance less than or equal to a capacitance sum of lower order capacitors. Switches selectively supply an analog input signal, a first reference voltage, or a second reference voltage to the capacitors in response to a control signal. A reset switch supplies the common line with a first voltage between the first and second reference voltages. A comparator compares the first voltage with a second voltage at the common line to generate a determination signal. A conversion control circuit generates the control signal and a multiple-bit digital signal based on the determination signal. A measurement control circuit measures the capacitance of the capacitor corresponding to an upper order bit of the digital signal using lower order capacitors. A correction circuit corrects the digital signal based on the measured capacitance to generate a digital output signal.

8 Claims, 27 Drawing Sheets

(56) References Cited

U.S. PATENT DOCUMENTS

| | | | |
|---|---|---|---|
| 7,705,765 B1* | 4/2010 | Yang | H03M 1/1061 341/155 |
| 7,880,650 B2* | 2/2011 | Feddeler | H03M 1/1038 341/120 |
| 8,004,449 B2* | 8/2011 | Yoshioka | H03M 1/002 341/172 |
| 8,094,057 B2 | 1/2012 | Haneda | |
| 8,462,038 B2 | 6/2013 | Furuta | |

FOREIGN PATENT DOCUMENTS

| | | |
|---|---|---|
| JP | 2011-120001 A | 6/2011 |
| JP | 2013-048366 A | 3/2013 |

* cited by examiner

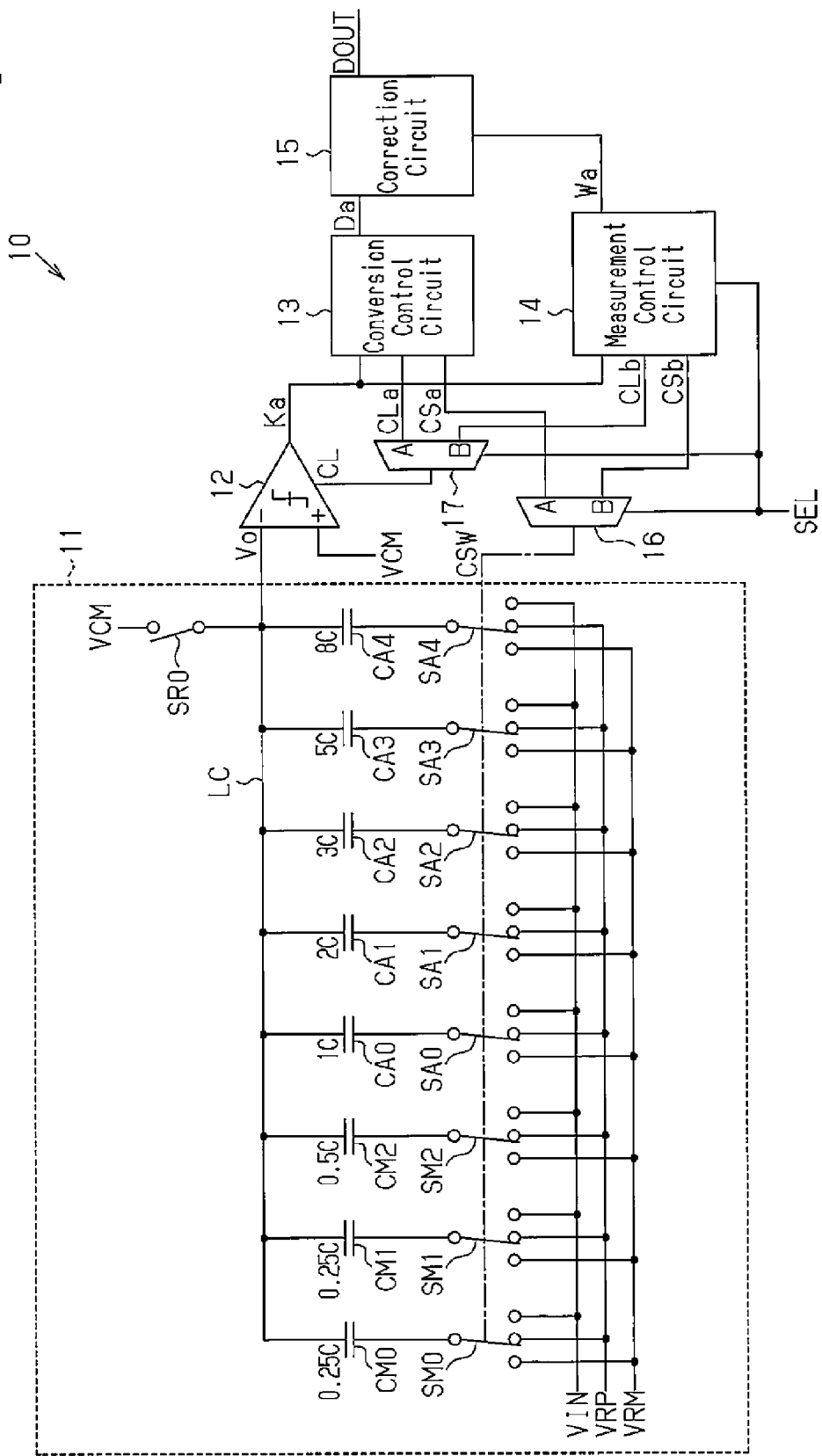

ANALOG-TO-DIGITAL CONVERSION CIRCUIT

CROSS-REFERENCE TO RELATED APPLICATIONS

This application is based upon and claims the benefit of priority from prior Japanese Patent Application No. 2014-046559, filed on Mar. 10, 2014, the entire contents of which are incorporated herein by reference.

FIELD

This disclosure relates to an analog-to-digital conversion circuit.

BACKGROUND

An analog-to-digital (A/D) conversion circuit that converts an analog input signal to a digital output signal is used in various fields. For example, a microcomputer or a system LSI includes a successive approximation register (SAR) A/D conversion circuit, which is a successive approximation type A/D conversion circuit. This A/D conversion circuit includes a charge redistribution type digital-to-analog (D/A) converter. The D/A converter includes binary-weighted capacitors. The capacitors are charged in accordance with the capacitance ratio of the capacitors. The A/D conversion circuit compares a common voltage with the output voltage of the D/A converter, which is output in accordance with the capacitance ratio of the capacitor. The A/D conversion circuit repeats the comparison from an upper order bit to a lower order bit of the digital output signal to determine the bit value of the digital output signal. Japanese Laid-Out Patent Publication No. 7-86947, Japanese Laid-Out Patent Publication No. 2011-120001, and Tomohiko Ogawa, et al., "Non-binary SAR ADC with Digital Error Correction for Low Power Applications", Circuits and Systems (APC-CAS), 2010 IEEE Asia Pacific Conference on Date 6-9 Dec. 2010 describe examples of successive approximation type A/D conversion circuits.

In the A/D conversion circuit, due to manufacturing differences, the capacitance of each capacitor may differ from the design value. The difference in the actual capacitance from the design value is referred to as a capacitor mismatch. A capacitor mismatch affects the properties of the digital output signal, for example, the differential non-linearity (DNL) of the digital output signal. Japanese Laid-Out Patent Publication No. 7-86947 describes a method for correcting such a capacitor mismatch. In this case, a correction capacitor is coupled to a node that generates voltage corresponding to an analog input voltage and a reference voltage to adjust the potential at the node with a correction value that corresponds to the capacitor mismatch.

However, in such a correction method, a correction value is calculated whenever determining each bit value of the digital output signal. The time required to calculate the correction value lengthens the A/D conversion time.

SUMMARY

One aspect of the present disclosure provides an analog-to-digital conversion circuit that converts an analog input signal to a digital output signal. The analog-to-digital conversion circuit includes a digital-to-analog converter. The digital-to-analog converter includes a plurality of capacitors, each including a first terminal and a second terminal. The first terminal is coupled to a common signal line, and each of the plurality of capacitors has a capacitance that is less than or equal to a sum of the capacitances of one or more lower order capacitors. The digital-to-analog converter further includes a plurality of switches that are respectively coupled to the second terminals of the capacitors. Each of the switches selectively supplies, in response to a control signal, one of the analog input signal, a first reference voltage, and a second reference voltage to the second terminal of the corresponding capacitor. The digital-to-analog converter further includes a reset switch that supplies the common signal line with a first voltage that is between the first reference voltage and the second reference voltage. A comparator compares the first voltage with a second voltage at the common signal line to generate a determination signal. A conversion control circuit generates the control signal and a multiple-bit digital signal in accordance with the determination signal. A measurement control circuit generates the control signal in accordance with the determination signal. The measurement control circuit measures the capacitance of one of the capacitors that corresponds to an upper order bit of the multiple-bit digital signal using one or more lower order capacitors. A correction circuit corrects the multiple-bit digital signal based on the capacitance measured by the measurement control circuit to generate the digital output signal.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

BRIEF DESCRIPTION OF THE DRAWINGS

The invention, together with objects and advantages thereof, may best be understood by reference to the following description of the presently preferred embodiments together with the accompanying drawings in which:

FIG. 1 is a schematic circuit diagram illustrating a first embodiment of an analog-digital (A/D) conversion circuit;

DESCRIPTION OF THE EMBODIMENTS

[First Embodiment]

Figure 2A:
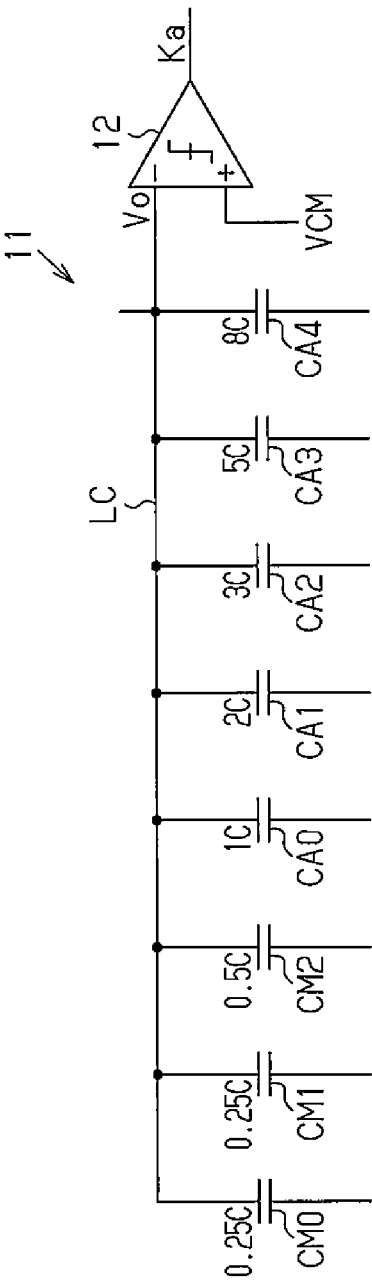
FIG. 2A is a schematic circuit diagram illustrating the capacitances of capacitors when designing the capacitors.

FIG. 1 illustrates a first embodiment of a successive approximation type analog-to-digital conversion circuit (hereinafter referred to as the A/D conversion circuit) 10. The A/D conversion circuit 10 converts an analog input signal VIN to a digital output signal DOUT.

The digital output signal DOUT includes, for example, four bits of digital output signals D3 to D0. The digital output signal D0 corresponds to the least significant bit (LSB), and the digital output signal D3 corresponds to the most significant bit (MSB).

The A/D conversion circuit 10 includes a digital-to-analog (D/A) converter 11, a comparator 12, a conversion control circuit 13, a measurement control circuit 14, a correction circuit 15, and selection circuits 16 and 17.

The D/A converter 11 generates an output voltage Vo based on an analog input signal VIN, a first reference voltage VRP, a second reference voltage VRM, a common voltage VCM, and a control signal CSW. The first reference voltage VRP and the second reference voltage VRM are set for the full-scale range (FSR) of the analog input signal VIN. The common voltage VCM is set as a voltage between the first reference voltage VRP and the second reference voltage VRM.

The D/A converter 11 is a capacitive digital-to-analog converter (CDAC) and may be of, for example, a charge redistribution type. The D/A converter 11 includes main capacitors CA4, CA3, CA2, CA1, and CA0 and main switches SA4, SA3, SA2, SA1, and SA0, which are respectively coupled to the capacitors CA4, CA3, CA2, CA1, and CA0. The main switches SA4, SA3, SA2, SA1, and SA0 selectively supply one of the analog input signal VIN, the first reference voltage VRP, and the second reference voltage VRM to the corresponding capacitors CA4, CA3, CA2, CA1, and CA0. Further, the D/A converter 11 includes a reset switch SR0 coupled to the main capacitors CA4 to CA0 to supply the main capacitors CA4 to CA0 with the common voltage VCM. The D/A converter 11 also includes measurement capacitors CM2, CM1, and CM0, which are used to measure the capacitances of the main capacitors CA4 to CA2, and measurement switches SM2, SM1, and SM0, which are coupled to the capacitors CM2, CM1, and CM0 to selectively supply one of the analog input signal VIN, the first reference voltage VRP, and the second reference voltage VRM to the capacitors CM2, CM1, and CM0.

The main capacitors CA4 to CA0 and the measurement capacitors CM2 to CM0 each include a first terminal coupled to a common signal line LC. The common signal line LC is coupled to a first terminal of the reset switch SR0. A second terminal of the reset switch SR0 is supplied with the common voltage VCM.

The main switches SA4 to SA0 and the measurement switches SM2 to SM0 are respectively coupled to second terminals of the main capacitors CA4 to CA0 and the measurement capacitors CM2 to CM0. In accordance with the control signal CSW, each of these switches selectively supplies one of the analog input signal VIN, the first reference voltage VRP, and the second reference voltage VRM. The control signal CSW includes signals that independently control the main switches SA4 to SA0 and the measurement switches SM2 to SM0. Further, the control signal CSW includes a signal that controls the reset switch SR0.

Each switch is not restricted to the configuration illustrated in FIG. 1. For example, the main switch SA4 may have any configuration as long as it is able to selectively supply one of the analog input signal VIN, the first reference voltage VRP, and the second reference voltage VRM. For example, three switches may be coupled to the main capacitor CA4, and the switches may be controlled to selectively supply one of the analog input signal VIN, the first reference voltage VRP, and the second reference voltage VRM to the main capacitor CA4. The same applies to the main switches SA3 to SA0 and the measurement switches SM2 to SM0.

When the A/D conversion circuit 10 determines the level of the analog input signal VIN, the D/A converter 11 generates the output voltage Vo in accordance with the analog input signal VIN, and the comparator 12 compares the output voltage Vo and the common voltage VCM to generate a determination signal Ka. For example, the control signal CSW for the main switch SA4 coupled to the main capacitor CA4 has a value corresponding to a digital signal Da output from the conversion control circuit 13. In the first embodiment, the digital signal Da includes five bit signals Da4 to Da0 corresponding to the main capacitors CA4 to CA0. In the description hereafter, the control signal CSW for the main switch SA4 may be referred to as the signal Da4. In the same manner, the control signals CSW for main switches SA3 to SA0 may respectively be referred to as the signals Da3 to Da0.

The common signal line LC is coupled to the comparator 12. The comparator 12 includes an inverting input terminal supplied with the output voltage Vo from the D/A converter 11 and a non-inverting input terminal supplied with the common voltage VCM. The comparator 12 compares the output voltage Vo and the common voltage VCM to generate a determination signal Ka having a level that is in accordance with the comparison result. The determination signal Ka is provided to the conversion control circuit 13 and the measurement control circuit 14.

Based on the determination signal Ka, the conversion control circuit 13 generates a latch signal CLa, a conversion control signal CSa, and the digital signal Da. For example, the conversion control circuit 13 includes a register that successively holds the value of the determination signal Ka and a logic circuit that generates the digital signal Da and the conversion control signal CSa. The conversion control circuit 13 outputs the digital signal Da in accordance with the value of the determination signal Ka held by the register. As described above, the digital signal Da includes five bit signals Da4 to Da0 corresponding to the main capacitors CA4 to CA0.

Based on the determination signal Ka, the measurement control circuit 14 generates a latch signal CLb, a measurement control signal CSb, and a capacitance signal Wa. For example, the measurement control circuit 14 includes a logic circuit that generates the measurement control signal CSb based on the determination signal Ka and a register that holds the value of the measurement control signal CSb. In the first embodiment, the measurement control circuit 14 changes the value of the measurement control signal CSb to sequentially measure capacitances Wa4 to Wa1 of the main capacitors CA4 to CA2 and store the value of the measurement control signal CSb whenever measuring each of the capacitances Wa4 to Wa2. Further, the measurement control circuit 14 outputs the capacitance signal Wa including one of the capacitances Wa4 to Wa2 that corresponds to the value of each measurement control signal CSb.

The measurement control circuit 14 of the first embodiment measures the capacitance of each capacitor subject to measurement (i.e., main capacitors CA4 to CA2) using the measurement capacitors CM2 to CM0 and one or more main capacitors at the lower order side (lower bit side) of the capacitor subject to measurement. For example, the measurement control circuit 14 measures the capacitance of the main capacitor CA2 using the main capacitors CA0 and CA1 and the measurement capacitors CM2 to CM0. In the same manner, the measurement control circuit 14 measures the capacitance of the main capacitor CA3 using the main capacitors CA2 to CA0 and the measurement capacitors CM2 to CM0. Likewise, the measurement control circuit 14 measures the capacitance of the main capacitor CA4 using the main capacitors CA3 to CA0 and the measurement capacitors CM2 to CM0.

The selection circuit 16 is provided with the conversion control signal CSa from the conversion control circuit 13 and the measurement control signal CSb from the measurement control circuit 14. The selection circuit 16 is also provided with a selection signal SEL. The selection signal SEL is used to select the operation of the A/D conversion circuit 10. In the first embodiment, the operations of the A/D conversion circuit includes a capacitance measurement process, which measures the capacitances Wa4 to Wa2 of the main capacitors CA4 to CA2 in the D/A converter 11, and an A/D conversion process, which converts the analog input signal VIN to the digital output signal DOUT. The selection signal SEL is provided from a circuit such as a CPU. When the selection signal SEL has a first level (e.g., high level), the A/D conversion circuit 10 performs the A/D conversion process. When the selection signal SEL has a second level (e.g., low level), the A/D conversion circuit 10 performs the capacitance measurement process. The selection circuit 16 selects the conversion control signal CSa when the selection signal SEL has the first level and outputs the conversion control signal CSa as the control signal CSW. The selection circuit 16 selects the measurement control signal CSb when the selection signal SEL has the second level and outputs the measurement control signal CSb as the control signal CSW.

The selection circuit 17 is provided with the latch signal CLa from the conversion control circuit 13, the latch signal CLb from the measurement control circuit 14, and the selection signal SEL. When the selection signal SEL has a first level, the selection circuit 17 selects the latch signal CLa and outputs the latch signal CLa as a latch signal CL. When the selection signal SEL has a second level, the selection circuit 17 selects the latch signal CLb and outputs the latch signal CLb as the latch signal CL. The comparator 12 uses the latch signal CL (CLa or CLb) to obtain the determination signal Ka. Accordingly, during the A/D conversion process, the conversion control circuit 13 controls the D/A converter 11 and the comparator 12. During the capacitance measurement process, the measurement control circuit 14 controls the D/A converter 11 and the comparator 12.

The correction circuit 15 corrects the digital signal Da, which is output from the conversion control circuit 13, based on the capacitance signal Wa, which is output from the measurement control circuit 14, to generate the digital output signal DOUT. The correction circuit 15 stores the capacitances of those other than the main capacitors CA4 to CA2 subject to measurement, namely, the main capacitors CA1 and CA0. The correction circuit 15 calculates the voltage of the analog input signal VIN based on each bit value of the digital signal Da, the capacitances Wa4 to Wa2 (capacitance signal Wa) of the main capacitors CA4 to CA2, and the pre-stored capacitances of the main capacitors CA1 and CA0. In other words, instead of the design values of the main capacitors CA4 to CA2, the correction circuit 15 uses the capacitances Wa4 to Wa2 of the main capacitors CA4 to CA2 measured by the measurement control circuit 14 to correct the voltage of the analog input signal VIN. The resolution of the A/D conversion circuit 10 is set by the capacitances of the main capacitors CA4 to CA0 of the D/A converter 11 for the input range of the analog input signal VIN that corresponds to the potential difference of the first reference voltage VRP and the second reference voltage VRM. In the first embodiment, the correction circuit 15 converts the voltage of the analog input signal VIN to the four bits of digital output signals D3 to D0 and outputs the digital output signal DOUT including the digital output signals D3 to D0.

The capacitances of the main capacitors CA4 to CA0 in the D/A converter 11 will now be described. FIG. 2A illustrates, in ratio, the design capacitances of the main capacitors CA4 to CA0.

The capacitances of the main capacitors CA4 to CA0 are weighted in a predetermined ratio, for example, 8:5:3:2:1. The capacitances of the measurement capacitors CM2 to CM0 are weighted in a predetermined ratio, for example, 2:1:1. Further, the capacitances of the measurement capacitors CM2 to CM0 are set based on the capacitance of the main capacitor CA0. In the first embodiment, the sum of the capacitances of the measurement capacitors CM2 to CM0 is set to be equal to the capacitance of the main capacitor CA0. Accordingly, the capacitances of the main capacitors CA4 to CA0 and the measurement capacitors CM2 to CM0 are respectively expressed as 8C, 5C, 3C, 2C, 1C, 0.5C, 0.25C, and 0.25 C. Here, C represents capacitance.

The capacitance of a manufactured capacitor, or the manufacture capacitance, may differ from the design capacitance of the capacitor. The difference between the manufacture capacitance and the design capacitance is referred to as a capacitor mismatch. When the capacitance of the capacitor is weighted with a large ratio, such a capacitance mismatch affects the properties of the A/D conversion circuit 10, for example, the integral non-linearity (INL) or the differential non-linearity (DNL).

Figure 2B:
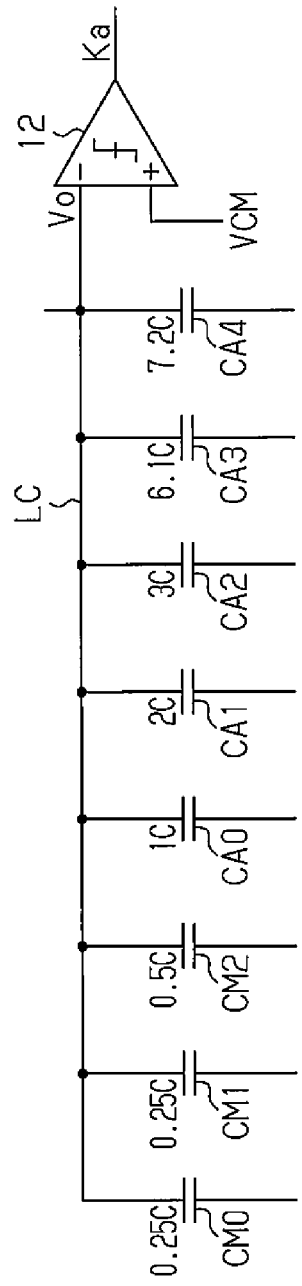
FIG. 2B is a schematic circuit diagram illustrating the capacitances of capacitors after manufacturing the capacitors.

FIG. 2B illustrates one example of a capacitor mismatch. The manufacture value 6.1C of the main capacitor CA3 is larger than the design value 5C of the main capacitor CA3. The manufacture value 7.2C of the main capacitor CA4 is smaller than the design value 8C of the main capacitor CA4. A capacitor mismatch does not occur with the main capacitor CA2.

The conversion control circuit 13 illustrated in FIG. 1 uses the manufacture values of the main capacitors CA4 to CA0 and the measurement capacitors CM2 to CM0 to generate five bits of digital signals Da corresponding to the analog input signal VIN. The measurement control circuit 14 measures the manufacture values of the main capacitors CA4 to CA2. The correction circuit 15 corrects the digital signals Da based on the measured capacitances Wa4 to Wa1 (manufacture values) of the main capacitors CA4 to CA2 and the stored capacitances (design values) of the main capacitors CA1 and CA0 to generate four-bit digital output signal DOUT.

The capacitances (design values) of the main capacitors CA4 to CA0 and the capacitances (design values) of the measurement capacitors CM2 to CM0 are set to satisfy conditions that enable the measurement described above. The set conditions are as described below.

(A1) The capacitance of a bit subject to correction is less than or equal to the sum of the capacitances of one or more lower order bits even when a manufacturing variation occurs.

(A2) The code width of a digital signal converted from an analog input signal by capacitors is greater than or equal to the code width of a digital output signal output from the analog-to-digital conversion circuit.

For example, as illustrated in FIGS. 2A and 2B, the manufacture value of a capacitor may be larger than the design value. For example, the manufacture value of the main capacitor CA3 is 6.1C. The main capacitors CA2 to CA0 and the measurement capacitors CM2 to CM0, which correspond to lower order bits of the main capacitor CA3, have manufacture values that total to 7C. Accordingly, the main capacitor CA3 illustrated in FIG. 2A having design value 5c satisfies condition (A1).

The sum of the manufacture values of the main capacitors CA4 to CA0 and the measurement capacitors CM2 to CM0 is 20.3C. The digital signal Da has a decimal value of 0 to 20. The four-bit digital output signal DOUT has a value of 0 to 15. Accordingly, the code width of the digital signal Da is greater than or equal to the code width of the digital output signal DOUT. This satisfies condition (A2).

A manufacturing variation changes the manufacture value of a capacitor from its design value. Accordingly, when a manufacturing variation does not occur in a capacitor, the A/D conversion circuit 10 satisfies the above conditions. For example, the main capacitors CA4 to CA0 illustrated in FIG. 2A satisfy the above conditions. Accordingly, the above conditions may be expressed as follows.

(B1) The capacitance of bit subject to correction is less than or equal to the sum of the capacitances of one or more lower order bits.

(B2) The code width of a digital signal converted from an analog input signal by capacitors is greater than or equal to the code width of a digital output signal output from the analog-to-digital conversion circuit.

[First Comparative Example]

A first comparative example for the first embodiment will now be described. In the description of the first comparative example, same reference numerals are given to those components that are the same as the corresponding components of the A/D conversion circuit 10 in the first embodiment.

Figure 15:
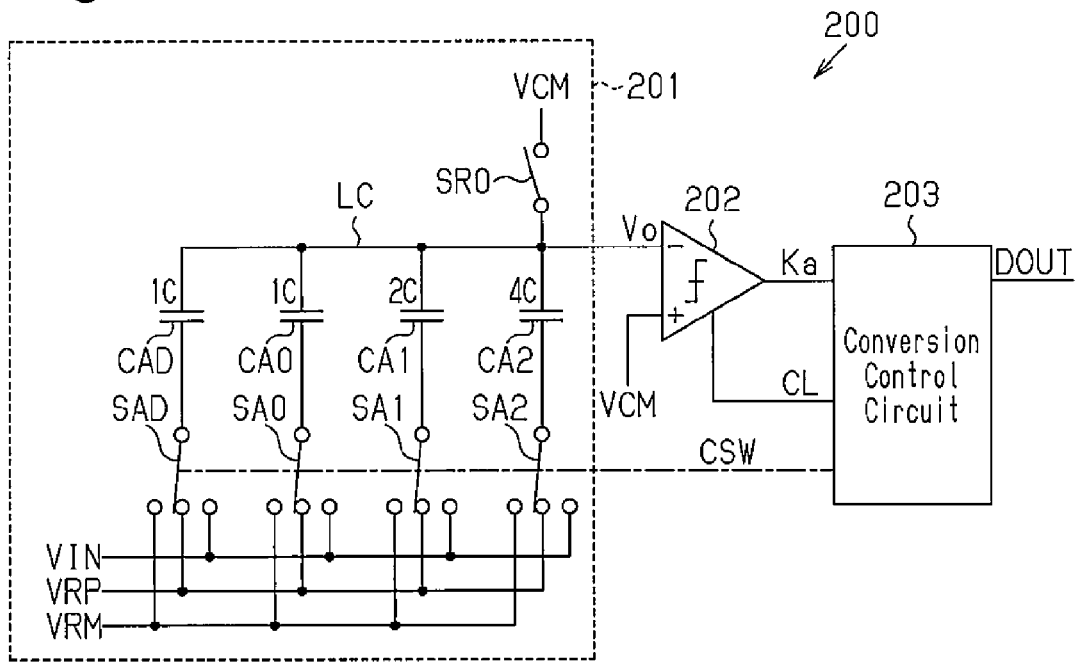
FIG. 15 is a circuit diagram of an A/D conversion circuit in a first comparative example.

As illustrated in FIG. 15, an A/D conversion circuit 200 includes a D/A converter 201, a comparator 202, and a conversion control circuit 203.

The D/A converter 201 includes three capacitors CA2 to CA0 and one dummy capacitor CAD. In a binary ratio, the capacitances of the dummy capacitor CAD and the capacitors CA2 to CA0 are weighted with a capacitance ratio of, for example, 4:2:1:1. The sum of the capacitance ratio of the capacitors CA2 to CA0 and the dummy capacitor CAD is equal to the code width of the digital output signal DOUT that has been converted. For example, a three-bit digital output signal DOUT (D2 to D0) has a code width of 8.

The D/A converter 201 includes the switches SA2 to SA0 and a dummy switch SAD. The switches SA2 to SA0 are coupled to the capacitors CA2 to CA0 to selectively supply one of the analog input signal VIN, the first reference voltage VRP, and the second reference voltage VRM to the capacitors CA2 to CA0. The dummy switch SAD is coupled to the dummy capacitor CAD to selectively supply one of the analog input signal VIN, the first reference voltage VRP, and the second reference voltage VRM to the dummy capacitor CAD. The D/A converter 201 includes a reset switch SR0 that supplies the common voltage VCM to the common signal line LC, which is coupled to the capacitors CA2 to CA0 and the dummy capacitor CAD. The conversion control circuit 203 controls the switches SA2 to SA0, the dummy switch SAD, and the reset switch SR0.

The comparator 202 includes an inverting input terminal that is coupled to the common signal line LC and a non-inverting input terminal that receives the common voltage VCM. The comparator 202 compares the output voltage Vo and the common voltage VCM at the common signal line LC and generates the determination signal Ka having a level corresponding to the comparison result.

The conversion control circuit 203 is a SAR logic circuit and generates the control signal CSW in accordance with the determination signal Ka. Further, the conversion control circuit 203 successively stores the determination signal Ka and generates the digital output signal DOUT.

The A/D conversion process performed by the A/D conversion circuit 200 illustrated in FIG. 15 will now be described.

Figure 16:
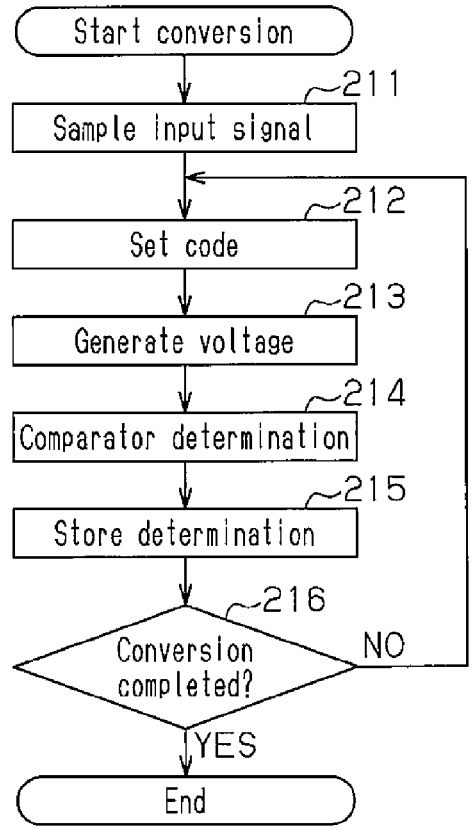
FIG. 16 is a flowchart illustrating an A/D conversion process performed by the A/D conversion circuit of FIG. 15.

As illustrated in FIG. 16, in step 211, the D/A converter 201 samples the analog input signal VIN with the capacitors CA2 to CA0 and the dummy capacitor CAD.

In step 212, the conversion control circuit 203 generates the control signal CSW as a code that controls the D/A conversion circuit 201.

In step 213, the D/A converter 201 supplies each capacitor with the first reference voltage VRP or the second reference voltage VRM in accordance with the control signal CSW to generate the output voltage Vo.

In step 214, the comparator 202 compares the output voltage Vo and the common voltage VCM at the common signal line LC of the D/A converter 201 and generates the determination signal Ka that indicates the comparison result.

In step 215, the conversion control circuit 203 stores the value of the determination signal Ka in a register.

In step 216, the conversion control circuit 203 determines whether or not a number of (e.g., five) determinations, which corresponds to the number of bits of the digital signal Da, has been completed. When the conversion has not been completed, the conversion control circuit 203 proceeds to step 212 and sets the next code.

The operation of the A/D conversion circuit 200 illustrated in FIG. 15 will now be described with reference to FIGS. 17A to 17E. FIGS. 17A to 17E do not illustrate the conversion control circuit 203, the switches SA2 to SA0, and the dummy switch SAD.

Figure 17D:
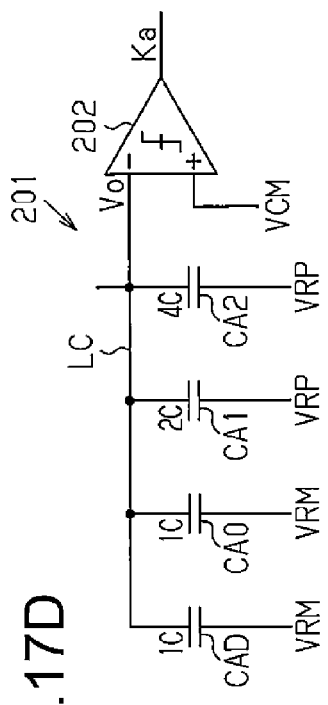
FIGS. 17A to 17E are schematic circuit diagrams illustrating a conversion operation performed by the A/D conversion circuit of FIG. 15.
Figure 17E:
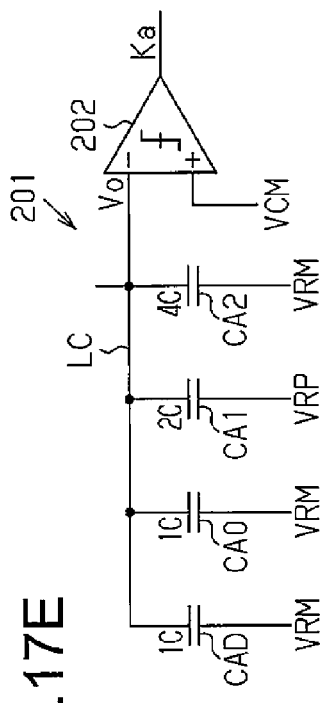
Figure 17A:
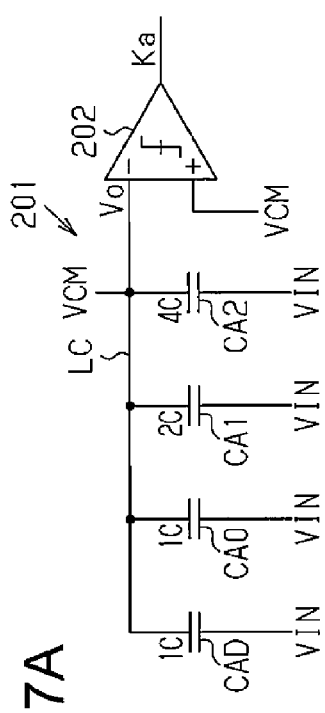
Figure 17B:
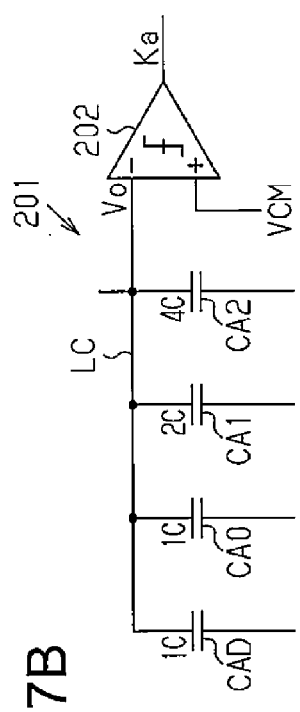

As illustrated in FIG. 17A, the capacitors CA2 to CA0 and the dummy capacitor CAD are first provided with the analog input signal VIN and the common signal line LC is supplied with the common voltage VCM. As a result, the D/A converter 201 samples the analog input signal VIN with the capacitors CA2 to CA0. Then, the reset switch SR0, the dummy switch SAD, and the switches SA2 to SA0 are deactivated. As illustrated in FIG. 17B, this holds the capacitors CA2 to CA0 and the dummy capacitor CAD charged in accordance with the analog input signal VIN and the common voltage VCM.

The charge Q stored through such sampling and holding is calculated through the following equation.

$$Q=(VCM-VIN)*8C=(Vo-CA2)*4C+(Vo-CA1)*2C+(Vo-CA0)*1C+(Vo-CAD)*1C$$

In the above equation, Vo represents the voltage at the common signal line LC, that is, the voltage at the first terminals of the capacitors CA2 to CA0 and the dummy capacitor CAD. The description hereafter also uses the reference character for a capacitor to indicate the voltage at a capacitor. Further, in the description hereafter, the value of a capacitance ratio will be used to express the capacitance of each capacitor. For example, the capacitance of the capacitor CA2 is 4.

With the above equation, the output voltage Vo is calculated with the following equation.

$$Vo=-(VR/CAL)*(VINa-(4*D2+2*D1+1*D0+1*DD))+VCM \quad (1)$$

where
VR=VRP−VRM
VINa=CAL*(VIN−VRM)/VR
CAL=8
D2=(CA2−VRM)/VR
D1=(CA1−VRM)/VR
D0=(CA0−VRM)/VR
DD=(CAD−VRM)/VR Here, VR is the reference voltage and indicates the voltage range of the convertible analog input signal VIN, and CAL is the sum of the capacitances. Further, VINa is the value of the analog input signal VIN expressed by the voltage of the 1 LSB in the digital output signal DOUT. The range in which the value of the analog input signal may be included is referred to as the input code range.

Accordingly, the voltage range of each of the convertible analog input signals VIN and VINa is expressed by the following expressions.

$$VRM \leq VIN \leq VRP$$

$$0 \leq VINa \leq 8$$

Figure 17C:
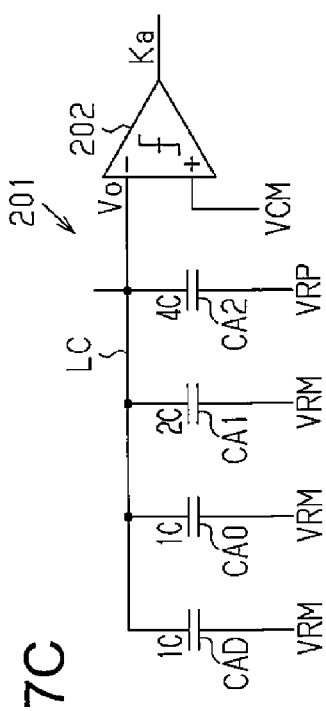

Referring to FIG. 17C, to perform the first determination, the capacitor CA2 is supplied with the firs reference voltage VRP. Further, the capacitors CA1 and CA0 and the dummy capacitor CAD is supplied with the second reference voltage VRM. In this case, the output voltage Vo is calculated from the following equation.

$$Vo=-(VR/CAL)*(VINa-4)+VCM$$

The comparator 202 compares the output voltage Vo and the common voltage VCM to generate the determination signal Ka. As will be understood from the above equation, this comparison is equivalent to comparing the value of the analog input signal VINa and the capacitance of 4 for the capacitor CA2. Accordingly, the comparator 202 generates the determination signal Ka indicating the comparison result of the value of the analog input signal VINa and the capacitance of 4 of the capacitor CA2.

When the determination signal Ka has a high level, the signal D2, which is the MSB of the digital output signal DOUT, is set to 1. In this case, referring to FIG. 17D, in the second determination, the capacitor CA1 is supplied with the first reference voltage VRP. Accordingly, the output voltage Vo is calculated with the following equation.

$$Vo=-(VR/8)*(VINa-(4+2))+VCM$$

In this case, the comparison of the output voltage Vo and the common voltage VCM at the comparator 202 is equivalent to comparing the analog input signal VINa with the capacitance sum of the capacitors CA2 and CA1.

When the determination signal Ka has a low level in a first determination, the signal D2 is set to 0. In this case, referring to FIG. 17E, in a second determination, the capacitor CA2 is supplied with the second reference voltage VRM, and the capacitor CA1 is supplied with the first reference voltage VRP. Accordingly, the output voltage Vo is calculated from the next equation.

$$Vo=-(VR/8)*(VINa-2)+VCM$$

In this case, the comparison of the output voltage Vo and the common voltage VCM at the comparator 202 is equivalent to comparing the analog input signal VINa with the capacitance of the capacitor CA1. The conversion control circuit 203 determines the value of the signal D1 based on the determination signal Ka obtained in the second determination. Then, in the same manner, the conversion control circuit 203 sets the reference voltage for the capacitor CA0 and determines the value of the signal D0 based on the determination signal Ka.

In this manner, the A/D conversion circuit 200 performs a binary search and determines the values of the signals D2 to D0 so that (VINa−(4*D2+2*D1+1*D0+1*DD)) in equation (1) approaches 0. As a result, the digital output signal DOUT is calculated in the following equation.

$$DOUT=4*D2+2*D1+1*D0+1*D0$$

[Second Comparative Example]

A second comparative example will now be described. In the description of the second comparative example, same reference numerals are given to those components that are the same as the corresponding components in the A/D conversion circuit 10 of the first embodiment illustrated in FIG. 1.

Figure 18:
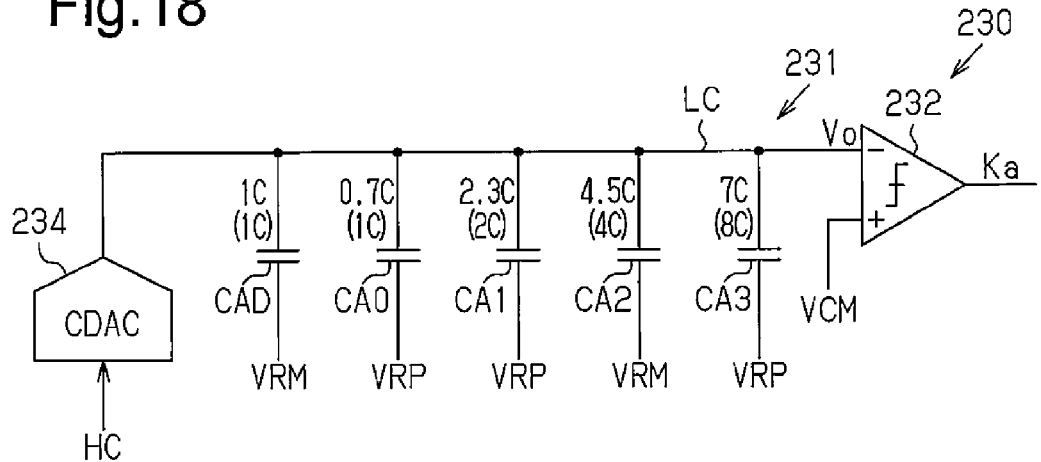
FIG. 18 is a circuit diagram of an A/D conversion circuit in a second comparative example.

As illustrated in FIG. 18, an A/D conversion circuit 230 includes a D/A converter 231, a comparator 232, and a capacitive D/A converter 234. FIG. 18 does not illustrate the conversion control circuit coupled to the comparator 232. In the second comparative example, the D/A converter 234 corrects capacitor mismatches.

The D/A converter 231 includes a plurality of (four in FIG. 18) capacitors CA3 to CA0 and a dummy capacitor CAD. In a binary ratio, the capacitances of the dummy capacitor CAD and the capacitors CA3 to CA0 are weighted with a capacitance ratio of, for example, 8:4:2:1:1. In FIG. 18, the capacitances in parentheses are design values, and the capacitances that are not in parentheses are manufacture values.

The common signal line LC, which is coupled to the capacitors CA3 to CA0 and the dummy capacitor CAD, is coupled to the output terminal of the D/A converter 234. The D/A converter supplies the common signal line LC with voltage corresponding to a correction value HC.

An A/D conversion process performed by the A/D conversion circuit 230 will now be briefly described.

Figure 19:
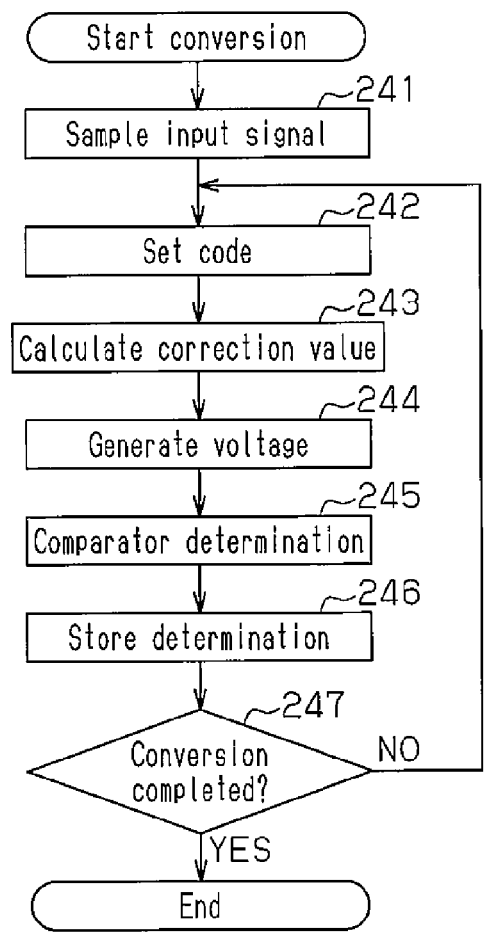
FIG. 19 is a flowchart illustrating an A/D conversion process performed by the A/D conversion circuit of FIG. 18.

Steps 241 and 242 in FIG. 19 correspond to steps 211 and 212 in FIG. 16. In step 243, the capacitance errors of the capacitors used for capacitance determination are added to calculate the correction value HC. The D/A converter 234 sets the correction value HC. Steps 244 to 247 correspond to steps 213 to 216 in FIG. 16.

The correction value HC set by the D/A converter 234 is calculated for each determination in correspondence with the pre-measured capacitances of the capacitors CA3 to CA0.

FIG. 18 illustrates a situation in which LSB determination is performed. In accordance with the determination, the capacitors CA3 and CA1 are supplied with the first reference voltage VRP, and the capacitor CA2 is supplied with the second reference voltage VRM. Further, the capacitor CA0 is supplied with the first reference voltage VRP for LSB determination. In this case, the correction value HC is calculated as the capacitance error of the capacitors CA3, CA1, and CA0 used for the determination. The error of the capacitor CA3 is −1C, the error of the capacitor CA1 is +0.3C, and the error of the capacitor CA0 is −0.3C. Accordingly, the correction value HC is 1 (i.e., HC=−(1+0.3−0.3)). The correction value HC is set by the D/A conversion circuit 234.

The correction value HC is obtained in a full-adding process. Thus, an increase in the number of bits lengthens the calculation time of the correction value HC. The initiation of step 244 illustrated in FIG. 19 is delayed until the correction value HC is determined. Accordingly, the calculation of the correction value HC lowers the A/D conversion speed of the A/D conversion circuit 230.

In the second comparative example, the correction value HC may be stored in a memory. In this case, a correction value needs to be stored for each pattern of the bit values of the digital output signal. In a high resolution A/D conversion circuit, the digital output signal DOUT includes a large number of bits, and an enormous amount of correction values would have to be stored. Thus, a memory having a large memory would be necessary, and the area occupied by the A/D conversion circuit would be increased.

The operation of the A/D conversion circuit 10 in the first embodiment will now be briefly described. The capacitance measurement process performed by the A/D conversion circuit 10 will first be described with reference to the flowchart of FIG. 3B.

In step 31, the D/A converter 11 samples the first reference voltage VRP with the capacitor that is subject to measurement.

In step 32, the measurement control circuit 14 sets the measurement control signal CSb as a code that controls the D/A converter 11.

In step 33, the D/A converter 11 supplies the first reference voltage VRP or the second reference voltage VRM to one or more capacitors at the lower order side (lower bit side) of the capacitor subject to measurement in accordance with the measurement control signal CSb.

In step 34, the comparator 12 compares the output voltage Vo at the common signal line of the D/A converter 11 with the common voltage VCM and generates the determination signal Ka having a level that is in accordance with the comparison result.

In step 35, the measurement control circuit 14 determines whether or not the level of the determination signal Ka has changed from the previous level. When determining that the level of the determination signal Ka has changed, the measurement control circuit 14 completes the measurement and proceeds to step 36. When determining that the level of the determination signal Ka has not changed, the measurement control circuit 14 returns to step S32 and sets the next code.

In step 36, the measurement control circuit 14 stores the code of the D/A converter 11, that is, the value of the measurement control signal CSb, in a register.

In step 37, the measurement control circuit 14 determines whether or not the measurement has been completed for every one of the capacitors that are subject to measurement. When the measurement has not been completed for every one of the capacitors subject to measurement, the measurement control circuit 14 returns to step 31 and selects the next capacitor that is subject to measurement.

Figure 3A:
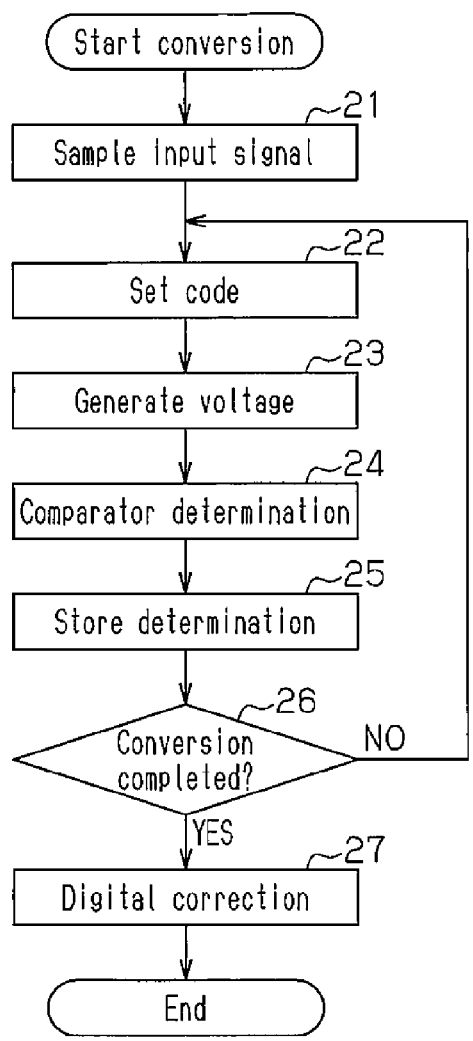
FIG. 3A is a schematic flowchart illustrating an A/D conversion process for the A/D conversion of FIG. 1.
Figure 3B:
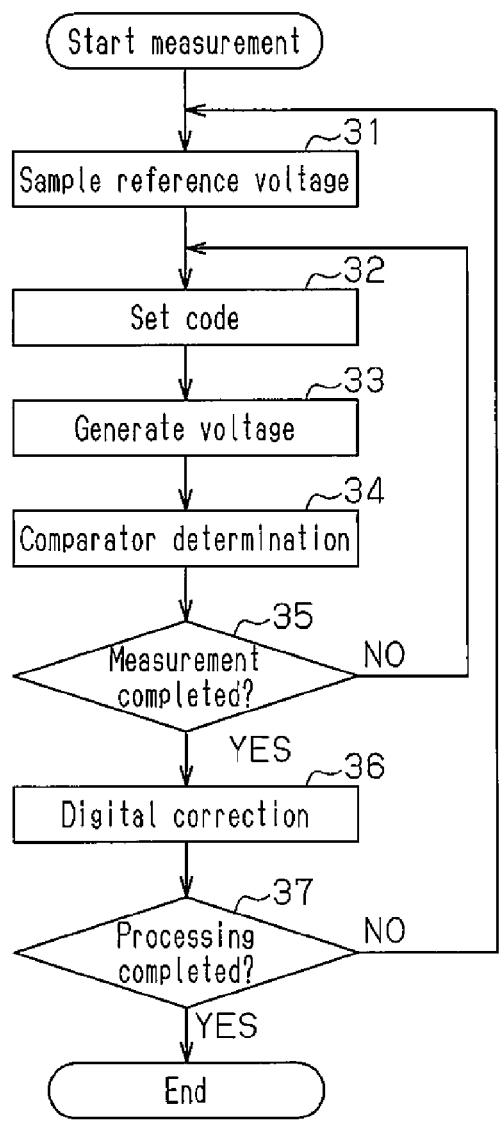
FIG. 3B is a schematic flowchart illustrating a capacitance measurement process for the A/D conversion circuit of FIG. 1.

The A/D conversion process performed by the A/D conversion circuit 10 will now be described with reference to the flowchart illustrated in FIG. 3A.

In step 21, the D/A converter 11 samples the analog input signal VIN with the main capacitors CA4 to CA0 and the measurement capacitors CM2 to CM0.

In step 22, the conversion control circuit 13 generates the conversion control signal CSa as a code for controlling the D/A converter 11.

In step 23, the D/A converter 11 supplies each capacitor with the first reference voltage VRP or the second reference voltage VRM.

In step 24, the comparator 12 compares the output voltage Vo at the common signal line of the D/A converter 11 with the common voltage VCM and outputs the determination signal Ka having a level that is in accordance with the comparison result.

In step 25, the conversion control circuit 13 stores the value of the determination signal Ka in a register.

In step 26, the conversion control circuit 13 determines whether or not the determination has been performed for a number of times (e.g., five time) corresponding to the number of bits of the digital signal Da. When the conversion has been completed, the conversion control circuit 13 proceeds to step 27. When the conversion has not been completed, the conversion control circuit 13 proceeds to step 22 and sets the next code.

In step 27, the correction circuit 15 performs a digital correction. In the first embodiment, the conversion control circuit 13 outputs a digital signal Da that corresponds to the value of the determination signal Ka stored in the register. The measurement control circuit 14 outputs the capacitance signal Wa (capacitance values Wa4 to Wa2). The correction circuit 15 calculates the voltage in a decimal value from the digital signal Da based on the capacitance signal Wa. Then, the correction circuit 15 converts the voltage to the four bits of the digital output signals D3 to D0.

The operation of the A/D conversion circuit 10 during capacitance measurement will now be described. In the description hereafter, FIGS. 4A to 5D illustrate the capacitors CA4 to CA0, the measurement capacitors CM2 to CM0, and the comparator 12 but do not illustrate other components.

The capacitance measurement process of the main capacitor CA3 will now be described with reference to FIGS. 4A to 4D.

Figure 4A:
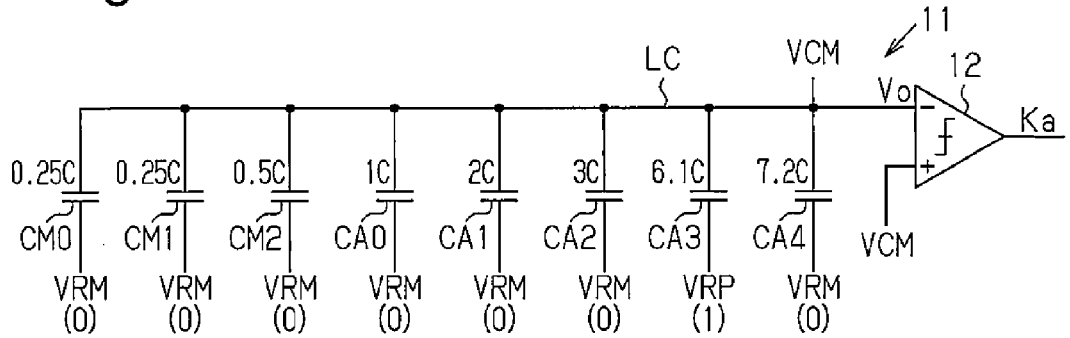
FIGS. 4A to 4D and 5A to 5D are schematic circuit diagrams illustrating the capacitance measurement process.

Referring to FIG. 4A, the D/A converter 11 first samples the first reference voltage VRP with the main capacitor CA3 that is subject to measurement. The main capacitor CA3 is supplied with the first reference voltage VRP, and the main capacitors CA4 and CA2 to CA0 and the measurement capacitors CM2 to CM0 are supplied with the second reference voltage VRM. The common signal line LC is supplied with the common voltage VCM. Accordingly, the main capacitor CA3 is charged in accordance with the difference between the first reference voltage VRP and the common voltage VCM. Then, the main switches SA4 to SA0, the measurement switches SM2 to SM0, and the reset switch SR0 (refer to FIG. 1) are deactivated to hold the main capacitor CA3 charged.

Figure 4B:
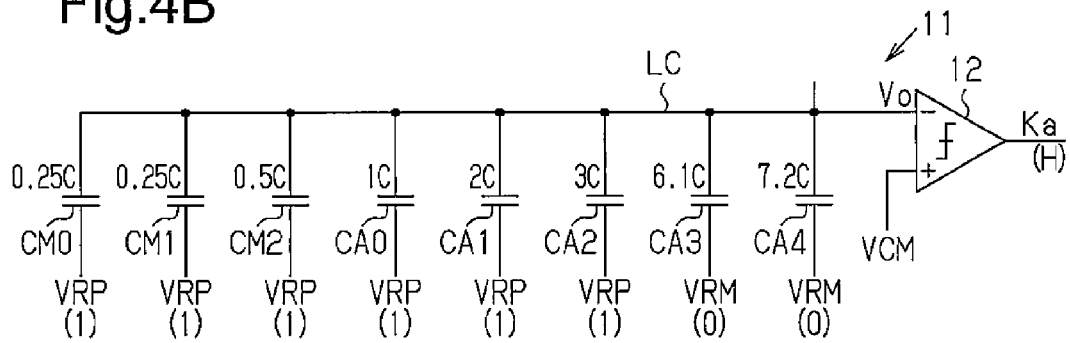

Referring to FIG. 4B, the main capacitor CA3 and the main capacitor CA4, which is at the upper order side of the main capacitor CA3, are supplied with the second reference voltage VRM. The main capacitors CA2 to CA0, which are located at the lower order side of the main capacitor CA3, and the measurement capacitors CM2 to CM0 are supplied with the first reference voltage VRP. Accordingly, the output voltage Vo at the common signal line LC changes from the common voltage VCM in accordance with the difference of the capacitance of the main capacitor CA3 and the sum of the capacitances of the main capacitors CA2 to CA0 and the measurement capacitors CM2 to CM0. The comparator 12 compares the output voltage Vo and the common voltage VCM to generate the determination signal Ka. When the capacitance of the main capacitor CA3 is less than or equal to the sum of the capacitances of the main capacitors CA2 to CA0 and the measurement capacitors CM2 to CM0, the comparator 12 generates the determination signal Ka that has a high level. The capacitance of the main capacitor CA3 is 6.1C, and the sum of the capacitances of the main capacitors CA2 to CA0 and the measurement capacitors CM2 to CM0 is 7C. Accordingly, the comparator outputs the determination signal Ka that has a high level.

Figure 4C:
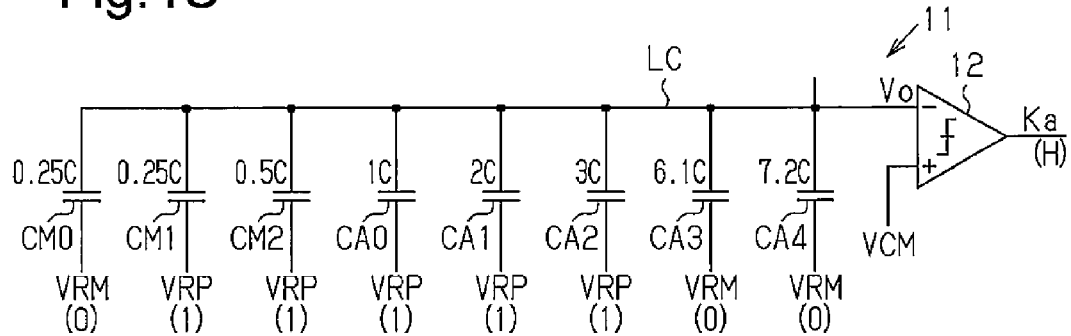

Referring to FIG. 4C, the measurement capacitor CM0 is supplied with the second reference voltage VRM in accordance with a code (measurement control signal CSb). The capacitance of a capacitor supplied with the second reference voltage VRM is not taken into consideration. Accordingly, the capacitance sum of 7 in FIG. 4B is decreased by the capacitance of the measurement capacitor CM0. In this manner, the capacitance sum becomes small by decreasing the value of the code (measurement control signal CSb) that controls the switches SA4 to SA0 and SM2 to SM0 of the D/A converter 11. This changes the output voltage Vo at the common signal line LC. The capacitance of the main capacitor CA3 is 6.1C, and the capacitance sum of the main capacitors CA2 to CA0 and the measurement capacitors CM1 and CM2 is 6.75. Accordingly, the comparator 12 outputs the determination signal Ka that has a high level.

Figure 4D:
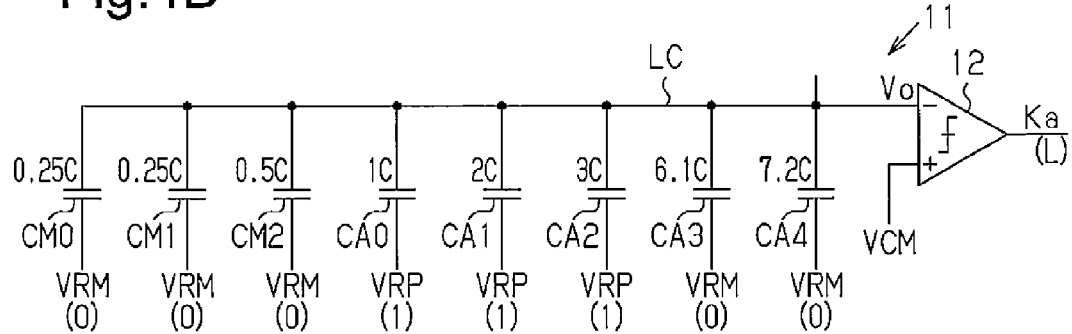

Referring to FIG. 4D, the value of the code (measurement control signal CSb) is further decreased, and the measurement capacitors CM2 to CM0 are supplied with the second reference voltage VRM. This further decreases the capacitance sum. The capacitance of the main capacitor CA3 is 6.1C, and the capacitance sum of the main capacitors CA2 to CA0 is 6C. Accordingly, the comparator 12 outputs the determination signal Ka that has a low level. In response to the low level determination signal Ka, the measurement control circuit 14 completes the capacitance measurement of the main capacitor CA3 and stores the capacitance Wa3 (6C) corresponding to the present code (measurement control signal CSb).

The capacitance measurement process of the main capacitor CA4 will now be described with reference to FIGS. 5A to 5D.

Figure 5A:
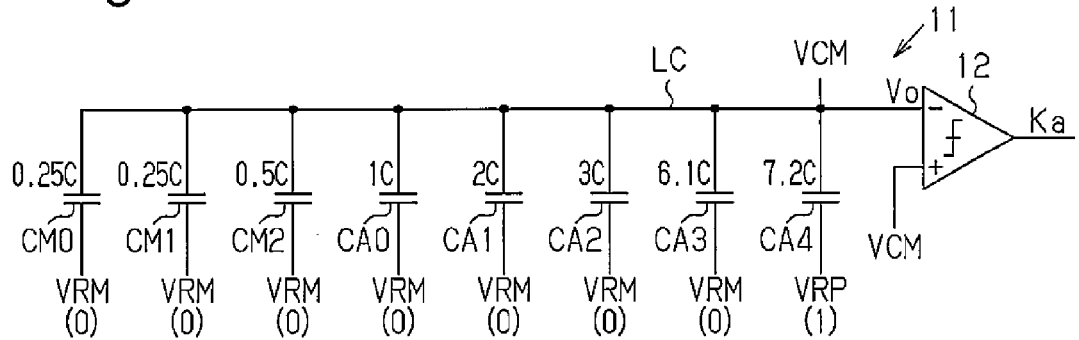

Referring to FIG. 5A, the D/A converter 11 first samples the first reference voltage VRP with the main capacitor CA4 that is subject to measurement. The main capacitor CA4 is supplied with the first reference voltage VRP, and the main capacitors CA3 to CA0 and the measurement capacitors CM2 to CM0 are supplied with the second reference voltage VRM. The common signal line LC is supplied with the common voltage VCM. Accordingly, the main capacitor CA4 is charged in accordance with the difference between the first reference voltage VRP and the common voltage VCM. Then, the main switches SA4 to SA0, the measurement switches SM2 to SM0, and the reset switch SR0 (refer to FIG. 1) are deactivated to hold the main capacitor CA4 charged.

Figure 5B:
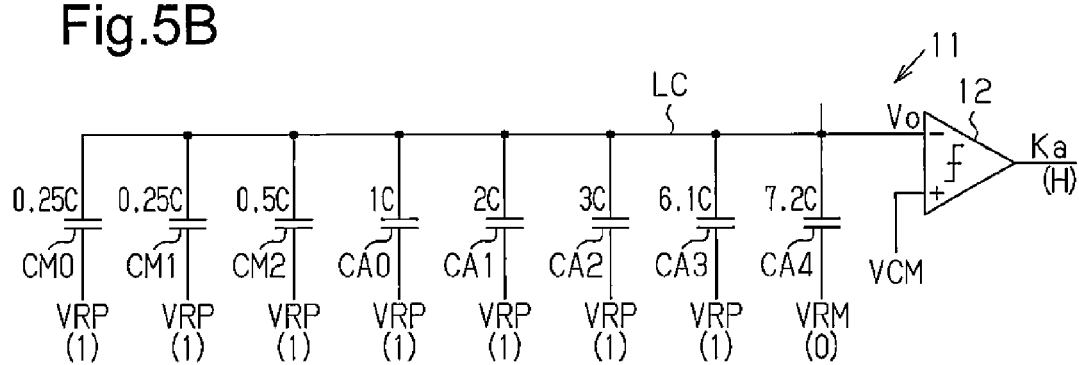

Referring to FIG. 5B, the main capacitor CA4 is supplied with the second reference voltage VRM. The main capacitors CA3 to CA0, which are located at the lower order side of the main capacitor CA4, and the measurement capacitors CM2 to CM0 are supplied with the first reference voltage VRP. Accordingly, the output voltage Vo at the common signal line LC changes in accordance with the difference of the capacitance of the main capacitor CA4 and the sum of the capacitances of the main capacitors CA3 to CA0 and the measurement capacitors CM2 to CM0. The capacitance of the main capacitor CA4 is 7.2C, and the sum of the capacitances of the main capacitors CA3 to CA0 and the measurement capacitors CM2 to CM0 is 13.1C. Accordingly, the comparator 12 outputs the determination signal Ka that has a high level.

Figure 5C:
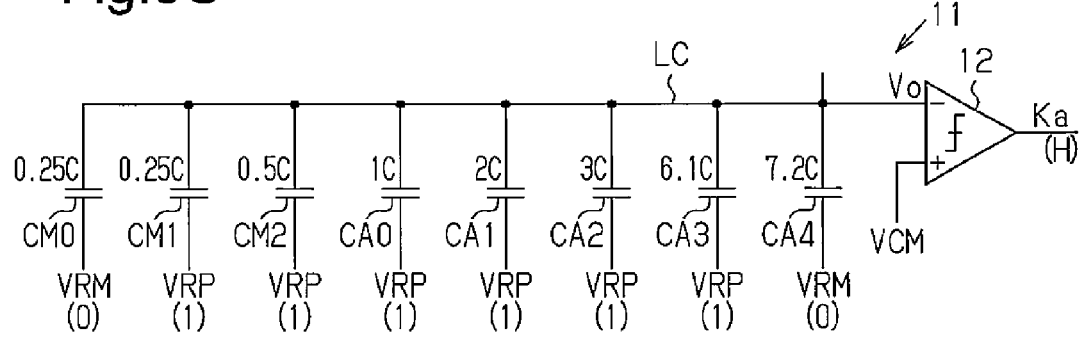

Referring to FIG. 5C, the value of the code (measurement control signal CSb) is decreased, and the measurement capacitor CM0 is supplied with the second reference voltage VRM. The capacitance of the main capacitor CA4 is 7.2C, and the capacitance sum of the main capacitors CA2 to CA0 at the lower order side and the measurement capacitors CM1 and CM2 is 12.85C. Accordingly, the comparator 12 outputs the determination signal Ka that has a high level.

Figure 5D:
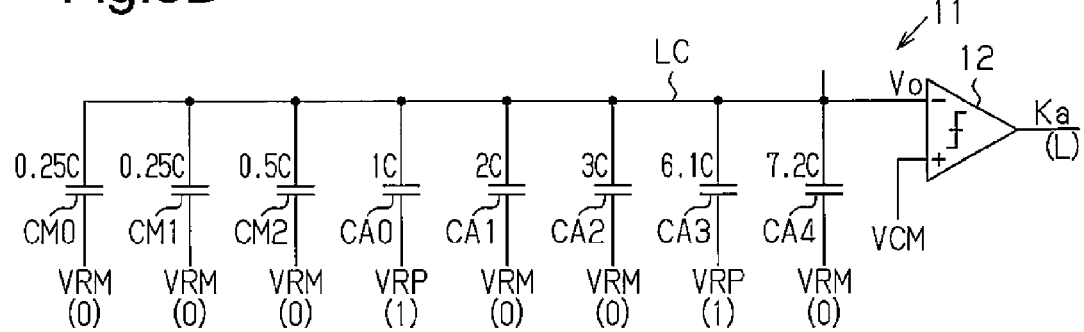

Referring to FIG. 5D, the value of the code (measurement control signal CSb) is further decreased, and the measurement capacitors CM2 to CM0 are supplied with the second reference voltage VRM. This further decreases the capacitance sum. The capacitance of the main capacitor CA4 is 7.2C, and the capacitance sum of the main capacitors CA3 and CA0 is 7.1C. Accordingly, the comparator 12 outputs the determination signal Ka that has a low level. In response to the low level determination signal Ka, the measurement control circuit 14 completes the capacitance measurement of the main capacitor CA4 and stores the capacitance Wa4 (i.e., Wa4=7C=6C+1C) corresponding to the present code (measurement control signal CSb).

The operation of the A/D conversion circuit 10 during A/D conversion will now be described. Like the capacitance measurement described above, in the description hereafter, FIGS. 6A to 7B illustrate the capacitors CA4 to CA0, the measurement capacitors CM2 to CM0, and the comparator 12 but do not illustrate other components.

Figure 6A:
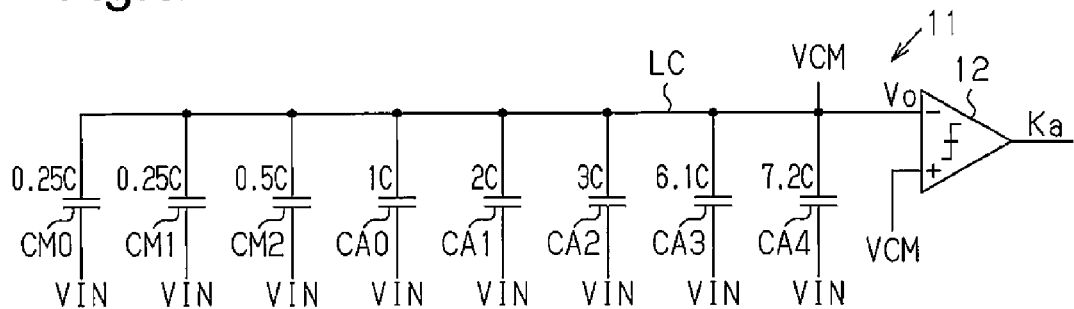
FIGS. 6A to 6D, 7A, and 7B are schematic circuit diagrams illustrating an A/D conversion process.

Referring to FIG. 6A, the D/A converter 11 first samples the analog input signal VIN with the main capacitors CA4 to CA0 and the measurement capacitors CM2 to CM0. The main capacitors CA4 to CA0 and the measurement capacitors CM2 to CM0 are provided with the analog input signal VIN. The common signal line LC is supplied with the common voltage VCM. Accordingly, the main capacitors CA4 to CA0 and the measurement capacitors CM2 to CM0 are charged in accordance with the analog input signal VIN and the capacitance sum of the main capacitors CA4 to CA0 and the measurement capacitors CM2 to CM0.

Figure 6B:
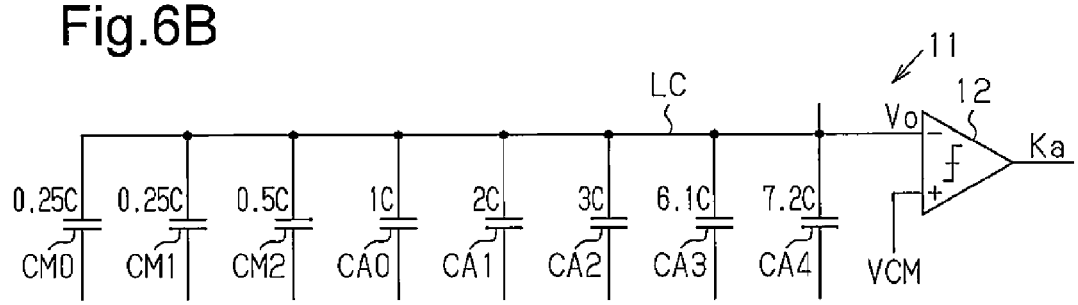

Referring to FIG. 6B, the main switches SA4 to SA0, the main switches SM2 to SM0, and the reset switch SR0 (refer to FIG. 1) are deactivated so that the main capacitors CA4 to CA0 and the measurement capacitors CM2 to CM0 are held charged.

The charge Q stored in the main capacitors CA4 to CA0 and the measurement capacitors CM2 to CM0 through such sampling and holding is calculated through the next equation.

$$Q=(VCM-VIN)*(7.2C+6.1C+3C+2C+0.5C+0.25C+0.25C)=(Vo-CA4)*7.2C+(Vo-CA3)*6.1C+(Vo-CA2)*3C+(Vo-CA1)*2C+(Vo-CA0)*1C+(Vo-CM2)*0.5C+(Vo-CM1)*0.25C+(Vo-CM0)*0.25C$$

Figure 6C:
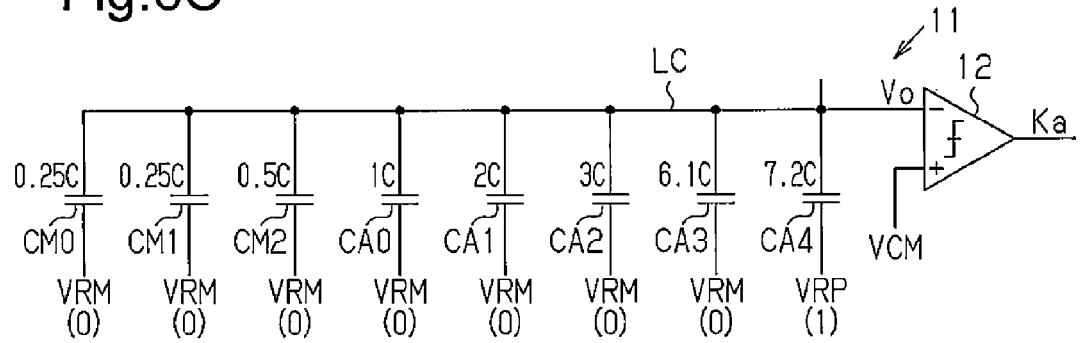

Accordingly, the output voltage Vo at the common signal line LC is calculated through the following equation.

$$Vo=-(VR/CAL)*(VINa-(7.2*Da4+6.1*Da3+3*Da2+2*Da1+1*Da0+0.5*DMa2+0.25*DMa1+0.25*DMa0))+VCM \quad (2)$$

where
VR=VRP−VRM
VINa=CAL*(VIN−VRM)/VR
CAL=7.2+6.1+3+2+1+0.5+0.25+0.25=20.3
Da4=(CA4−VRM)/VR
Da3=(CA3−VRM)/VR
Da2=(CA2−VRM)/VR
Da1=(CA1−VRM)/VR
Da0=(CA0−VRM)/VR
DMa2=(CM2−VRM)/VR
DMa1=(CM1−VRM)/VR
DMa0=(CM0−VRM)/VR Referring to FIG. 6C, the code (conversion control signal CSa) is changed, the MSB main capacitor CA4 is supplied with the first reference voltage VRP, and the lower order side main capacitors CA3 to CA0 and the measurement capacitors CM2 to CM0 are supplied with the second reference voltage VRM. In FIG. 6C, the numerals (0 or 1) in parentheses indicate the values of Da4 to Da0 and DMa2 to DMa0 in equation (2). Since Da4 is 1 and Da3 to Da0 and DMa2 to DMa0 are 0, the output voltage Vo is calculated in accordance with equation (2) through the following equation.

$$Vo=-(VR/CAL)*(VINa-7.2)+VCM$$

The comparator 12 compares the output voltage Vo and the common voltage VCM to generate the determination signal Ka. The determination signal Ka is output in accordance with the analog input signal VINa expressed by the unit of 1 LSB based on the capacitance Wa4 of the main capacitor CA4 and the capacitance sum of the main capacitors CA4 to CA0 and the measurement capacitors CM2 to CM0. The value of the signal Da4 is determined in accordance with the level of the determination signal Ka.

Figure 6D:
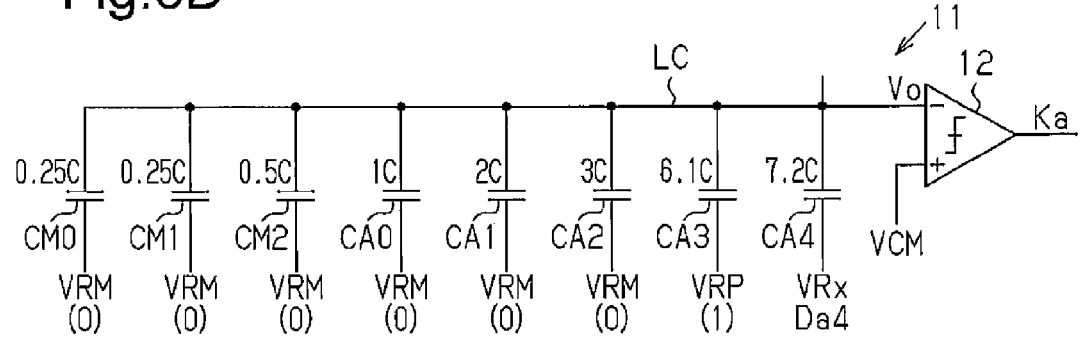

Referring to FIG. 6D, the main capacitor CA4 is supplied with reference voltage VRx (first reference voltage VRP or second reference voltage VRM) based on the value of the signal Da4 (0 or 1). Further, the main capacitor CA3, which is next subject to determination, is supplied with the first reference voltage VRP. For example, when the signal Da4 is 1 (determination signal Ka is high), the output voltage Vo is calculated through the next equation.

$$Vo=-(VR/CAL)*(VINa-(7.2+6.1))+VCM$$

When the signal Da4 is 0 (determination signal Ka is low), the output voltage Vo is calculated through the next equation.

$$Vo=-(VR/CAL)*(VINa-6.1)+VCM$$

The comparator 12 compares the output voltage Vo and the common voltage VCM to generate the determination signal Ka. The value of the signal Da3 is determined in accordance with the level of the determination signal Ka.

Figure 7A:
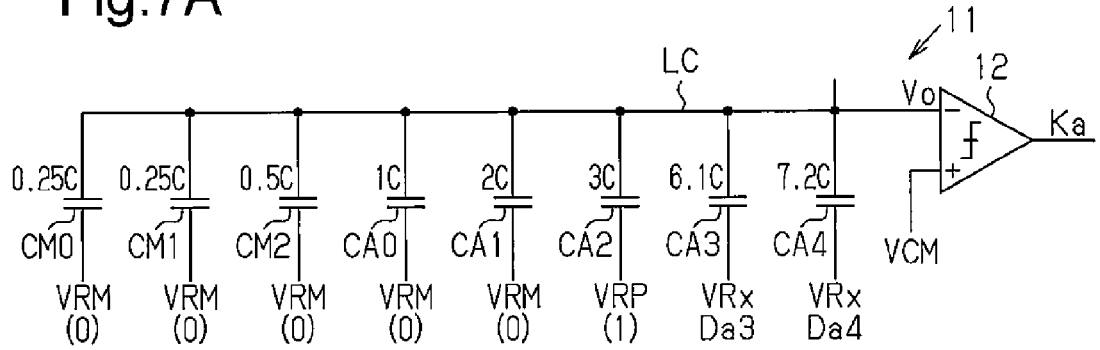

Referring to FIG. 7A, the main capacitor CA3 is supplied with the reference voltage VRx (first reference voltage VRP or second reference voltage VRM) based on the value of the signal Da3 (0 or 1). Further, the main capacitor CA2, which is next subject to determination, is supplied with the first reference voltage VRP. The comparator 12 outputs the determination signal Ka, which indicates the comparison result of the output voltage Vo and the common voltage VCM, and the value of the signal Da2 is determined in accordance with the level of the determination signal Ka.

In the same manner, the main capacitor CA2 is supplied with the reference voltage VRx (first reference voltage VRP or second reference voltage VRM) based on the value of the signal Da2 (0 or 1). Further, the main capacitor CA1, which is next subject to determination, is supplied with the first reference voltage VRP. The comparator 12 outputs the determination signal Ka, which indicates the comparison result of the output voltage Vo and the common voltage VCM, and the value of the signal Da1 is determined in accordance with the level of the determination signal Ka.

Figure 7B:
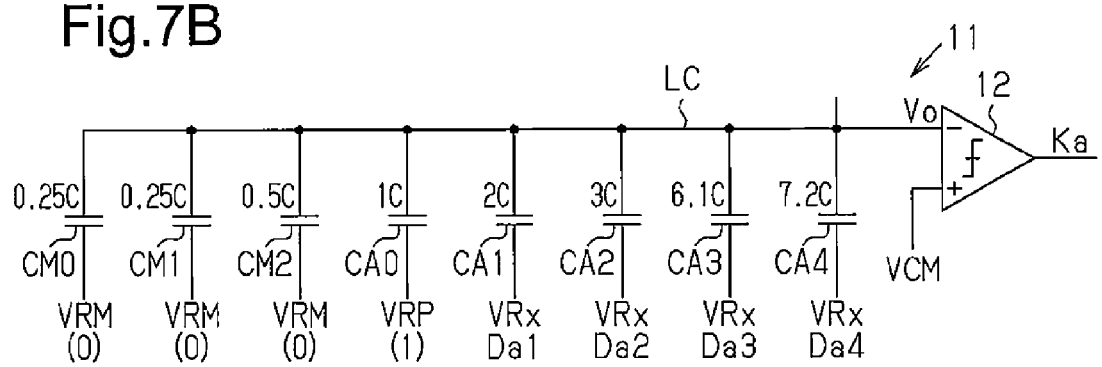

Then, referring to FIG. 7B, the main capacitors CA4 to CA1 are supplied with the reference voltage VRx (first reference voltage VRP or second reference voltage VRM) in accordance with the signals Da4 to Da1 of the code (conversion control signal CSa). Further, the main capacitor CA0, which is the LSB, is supplied with the first reference voltage VRP. The comparator 12 outputs the determination signal Ka, which indicates the comparison result of the output voltage Vo and the common voltage VCM, and the value of the signal Da0 is determined in accordance with the level of the determination signal Ka.

Through the above processes, the conversion control circuit 13 illustrated in FIG. 1 outputs the digital signal Da that includes the signals Da4 to Da0.

The correction circuit 15 corrects digital signal Da output from the conversion control circuit 13 based on the capacitance signal (capacitances Wa4 to Wa2) output from the measurement control circuit 14 to generate the digital signal DOa. The digital signal DOa is calculated through the following equation.

$$DOa = Wa4*Da4 + Wa3*Da3 + Wa2*Da2 + 2*Da1 + Da0$$

When substituting Wa4 to Wa2 in the equation, the digital signal DOa is calculated through the following equation.

$$DOa = 7*Da4 + 6*Da3 + 3*Da2 + 2*Da1 + Da0$$

The correction circuit 15 converts the value of the digital signal DOa to the digital output signal DOUT, which has a certain number of bits (e.g., four bits) in accordance with the following equation.

$$DOUT = 16*DOa/20$$

Here, 16 is the code width of a four-bit digital signal, and 20 is the code width (7+6+3+2+1+0.5+0.25+0.25) of the D/A converter 11 obtained with the capacitances Wa4 to Wa1. Accordingly, when the bit number is expressed by n and the capacitance sum of the capacitors in the D/A converter 11 is expressed by CAL, the digital output signal DOUT is calculated through the next equation.

$$DOUT = 2^n*DOa/CAL$$

The operation of the A/D conversion circuit during A/D conversion will now be described.

The comparator 12 compares the output voltage Vo of the D/A converter 11 and the common voltage VCM to generate the determination signal Ka. As will be understood from equation (1), the comparison is equivalent to a comparison of the analog input signal VINa and the capacitance sum of one or more capacitors. Hereafter, the operation of the comparator 12 will be described using the capacitance sum of the capacitors as a determination value and comparing the determination value with the analog input signal VINa. The determination value is calculated based on the actual capacitance.

Figure 8:
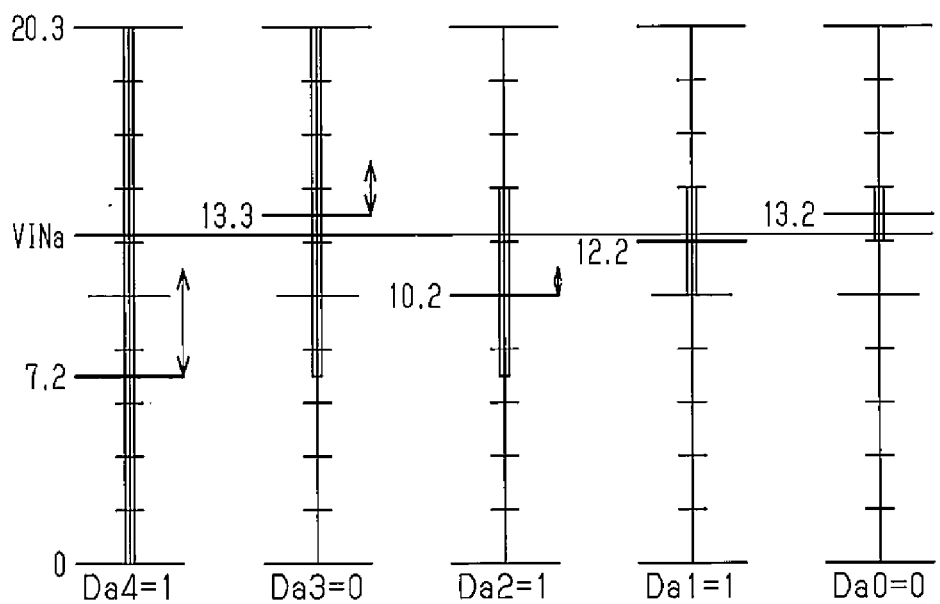
FIGS. 8 and 9 are diagrams illustrating the operation of the A/D conversion circuit illustrated in FIG. 1.

Referring to FIG. 8, the analog input signal VINa is first compared with the determination value of 7.2. Here, the value of the analog input signal VINa is 12.25. In this case, the signal Da4 is set to 1 based on the determination signal Ka.

The analog input signal VINa is compared with the determination value of 13.3 (i.e., 7.2+6.1). The signal Da3 is set to 0 based on the determination signal Ka, which indicates the comparison result.

The analog input signal VINa is compared with the determination value of 10.2 (i.e., 7.2+3). The signal Da2 is set to 1 based on the determination signal Ka, which indicates the comparison result.

The analog input signal VINa is compared with the determination value of 12.2 (i.e., 7.2+3+2). The signal Da1 is set to 1 based on the determination signal Ka, which indicates the comparison result.

The analog input signal VINa is compared with the determination value of 13.2 (i.e., 7.2+3+2+1). The signal Da0 is set to 0 based on the determination signal Ka, which indicates the comparison result.

The bit values of the digital signal Da (values of signals Da4 to Da0) are set in this manner for the conversion control circuit 13 illustrated in FIG. 1.

The correction circuit 15 illustrated in FIG. 1 calculates the digital signal DOa based on the bit value of the digital signal Da and the capacitance signal Wa (capacitances Wa4 to Wa1) output from the measurement control circuit 14. The digital signal DOa is calculated through the following equation.

$$DOa = 7*1 + 6*0 + 3*1 + 2*1 + 0 = 12$$

The correction circuit 15 converts the digital signal DOa to the digital output signal DOUT that includes the four bits of the digital output signals D3 to D0. The digital output signal DOUT is calculated through the following equation.

$$DOUT = 16*12/20 = 10 \text{(rounded)}$$

Figure 9:
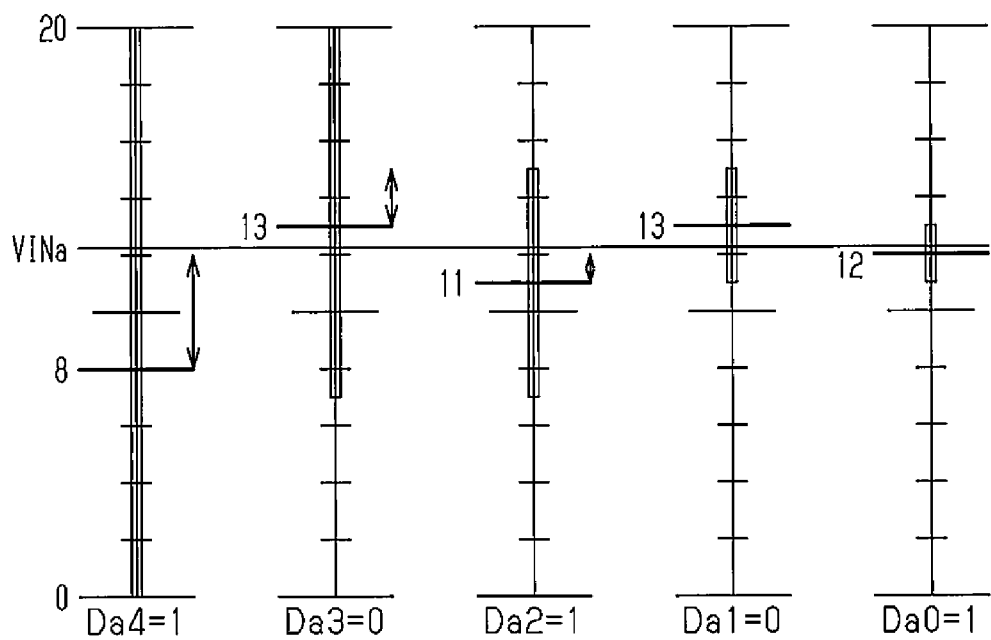

FIG. 9 illustrates the conversion operation of the A/D conversion circuit 10 when there is no capacitor mismatch. In this case, the capacitor ratio of the main capacitors CA4 to CA0 is 8:5:3:2:1. Accordingly, the determination values are sequentially set to 8, 13, 11, 13, and 12. The bits of the digital signal Da (Da4 to Da0) are set to 10101. The digital signal DOa is calculated through the following equation.

$$DOa = 8*1 + 5*0 + 3*1 + 2*0 + 1 = 12$$

Figure 10:
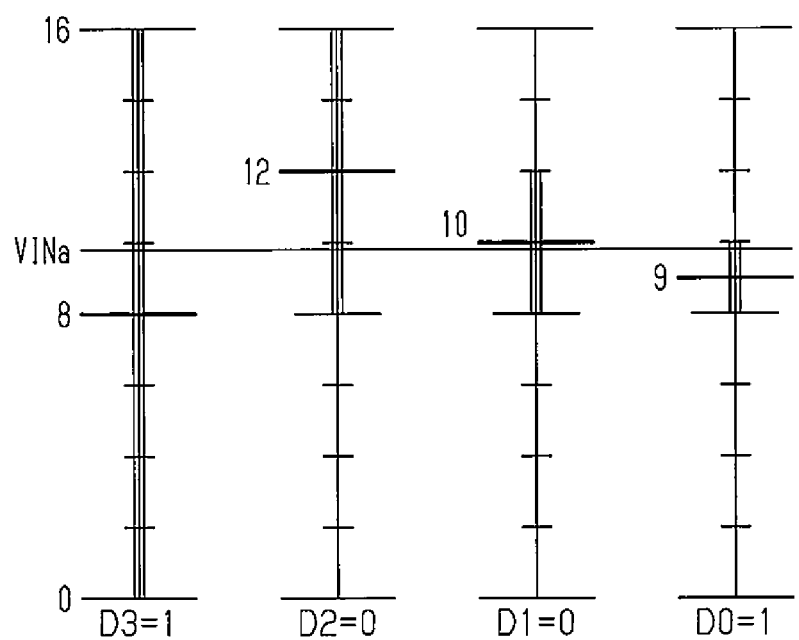
FIG. 10 is a diagram illustrating the operation of an analog-digital conversion circuit including a capacitive digital-to-analog converter (CDAC) having binary-weighted capacitors.

FIG. 10 illustrates the conversion operation of an A/D conversion circuit including capacitors that are weighted using the binary system (power of 2). For example, in the A/D conversion circuit 230 illustrated in FIG. 18, the capacitance ratio of the main capacitors CA3 to CA0 is 8:4:2:1. In this case, the value of the analog input signal VINa is 9.8. The determination values are sequentially set to 8, 12, 10, and 9. The bits (D3 to D0) of the digital output signal DOUT is set to 1001. That is, the value of the digital output signal DOUT is 9.

Figure 11:
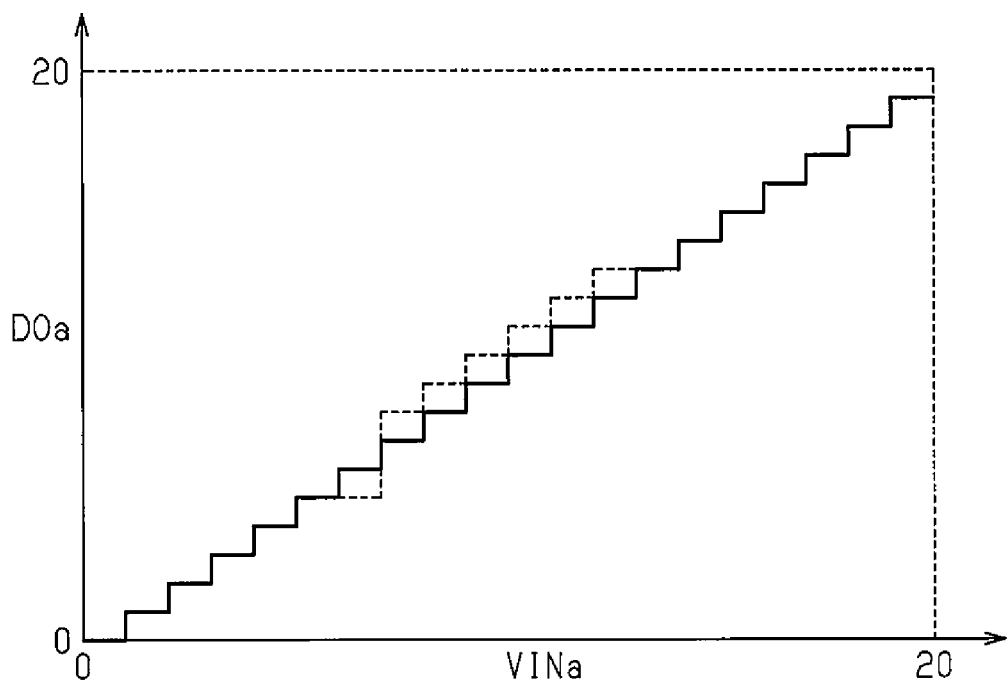
FIG. 11 is a diagram illustrating the operation of the A/D conversion circuit illustrated in FIG. 1.

FIG. 11 illustrates whether or not the digital signal Da is corrected. In FIG. 11, the horizontal axis represents the analog input signal Vina and illustrates the analog input signal VIN in voltage corresponding to 1 LSB of the D/A converter 11. The vertical axis represents the digital signal Da. The solid lines illustrate a corrected state, that is, the value of the digital signal DOa that is calculated from the capacitance signal Wa. The broken lines illustrate a non-corrected state, that is, the value of the digital signal DOa that is calculated from the design value. In this manner, the correction improves the conversion characteristics.

Figure 12:
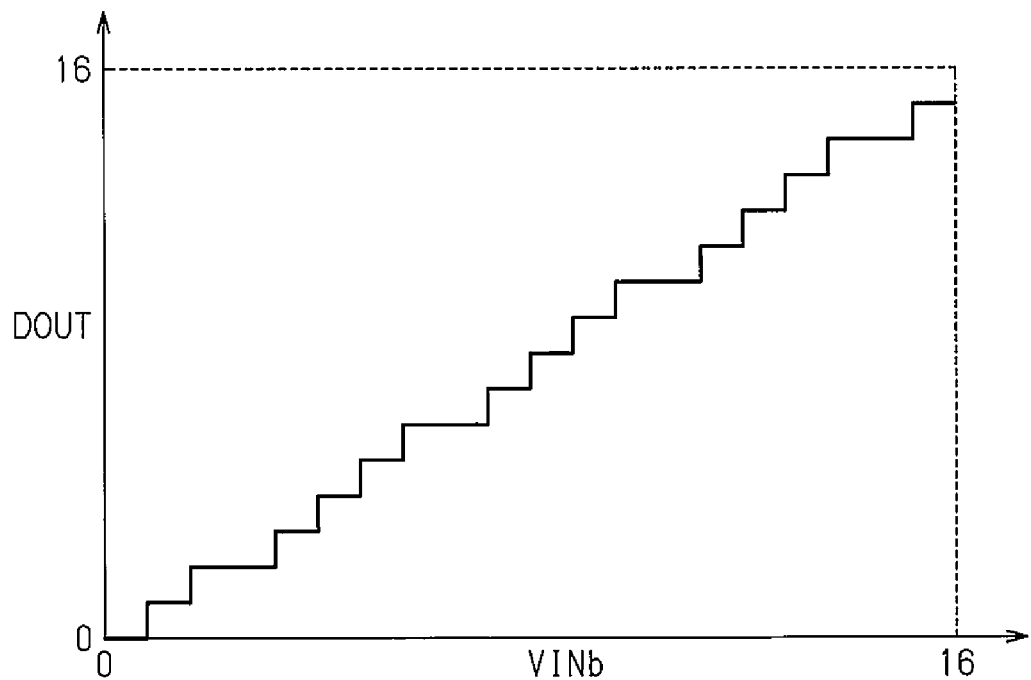
FIG. 12 is a diagram illustrating the operation of a comparative example.

FIG. 12 illustrates the four-bit digital output signal DOUT converted by the correction circuit 15. In FIG. 12, the horizontal axis represents the analog input signal Vinb and illustrates the analog input signal VIN in voltage corresponding to 1 LSB of the digital output signal DOUT. There are deviations from the ideal conversion characteristic illustrate ever, the digital signal Da, the code width (20) of which is greater than the code width (16) of the digital output signal DOUT, is converted to the digital output signal DOUT. Accordingly, the differential non-linearity (DNL) and the integral non-linearity (INL) are within 1 LSB.

[Description of Redundant Range]

In the D/A converter 11, the capacitance of the main capacitor CA4 is set to be less than or equal to the sum of the capacitances of the lower order side main capacitors CA3 to CA0 and the capacitances of the measurement capacitors DM2 to CM0. Accordingly, the use of the lower order side main capacitors CA3 to CA0 allows a voltage that is about the same as the output voltage Vo generated with the main capacitor CA4 to be generated on the common signal line LC. Thus, a determination that is the same as a determination performed with the main capacitor CA4 may be performed with the main capacitors CA3 to CA0. The same applies to the main capacitors CA3 and CA2.

Accordingly, a redundant range is set for the D/A converter 11. The redundant range allows for correction of a determination error of the analog input signal VINa based on a determination result using a lower order capacitor. That is, a redundant range is where a determination error is tolerable. A determination error may result from, for example, noise (power supply noise, heat noise, or the like) that mixes with an output signal of the D/A converter, noise generated at the comparator, or the like.

Figure 13:
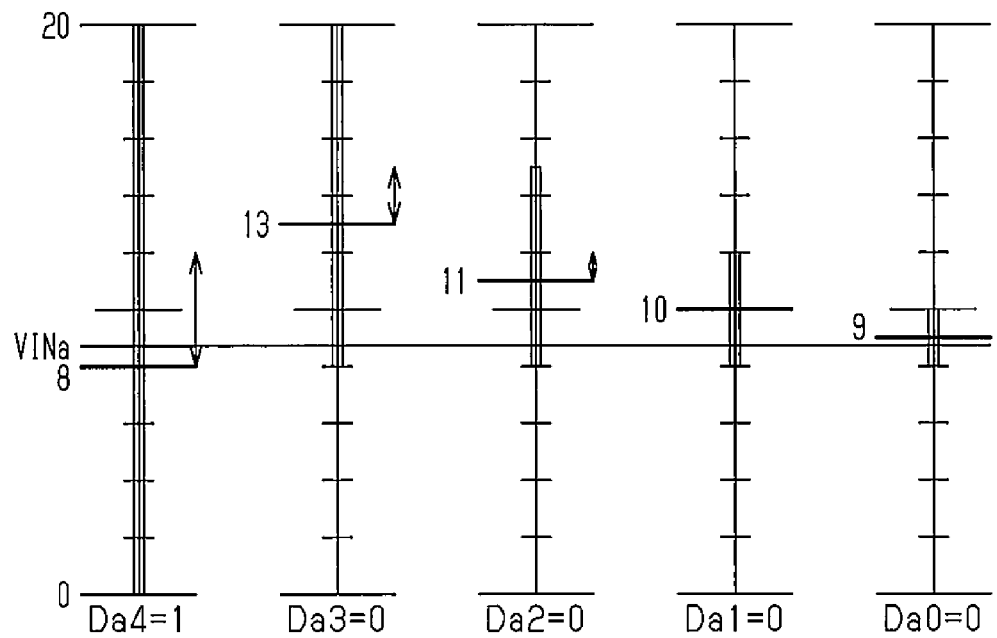
FIG. 13 is a diagram illustrating the operation of the A/D conversion circuit illustrated in FIG. 1 when there are no determination errors.
Figure 14:
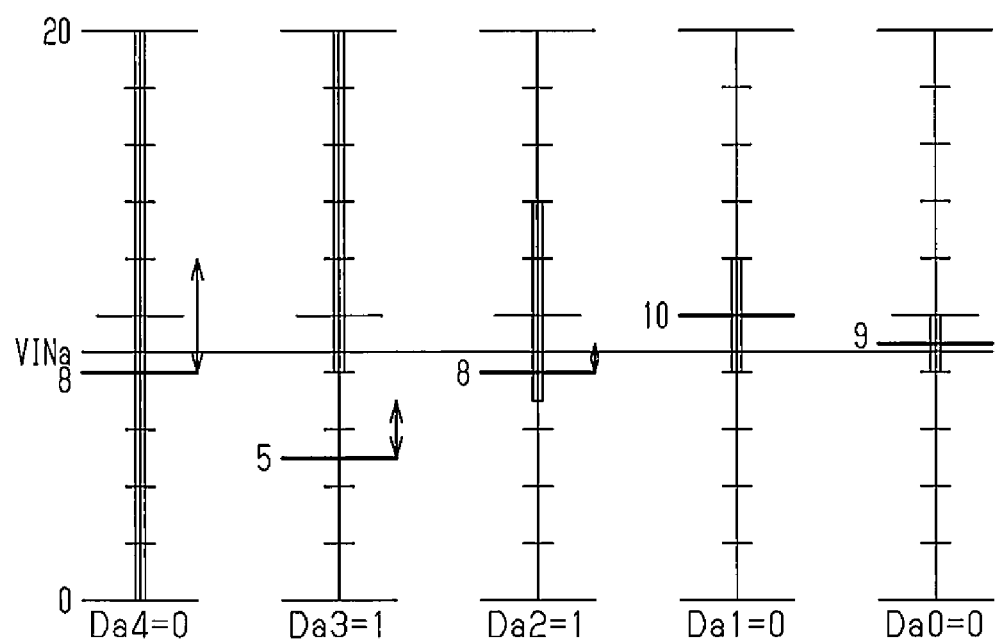
FIG. 14 is a diagram illustrating the operation of the A/D conversion circuit illustrated in FIG. 1 when correcting a determination error.

FIGS. 13 and 14 are diagrams illustrating redundant ranges in the D/A converter 11. In FIGS. 13 and 14, the vertical axis represents the code of the D/A converter 11, and the horizontal axis illustrates the determination number. In the vertical axis, the portions illustrated by triple lines indicate a determination range of the analog input signal, and the arrows indicate redundant ranges.

FIG. 13 illustrates a case when there are no determination errors. The value of the analog input signal VINa is 8.75.

The analog input signal VINa is first compared with the determination value of 8. The signal Da4 is set to 1 based on the determination signal Ka that indicates the comparison result.

The analog input signal VINa is then compared with the determination value of 13 (i.e., 8+5). The signal Da3 is set to 0 based on the determination signal Ka that indicates the comparison result.

Then, the analog input signal VINa is compared with the determination value of 11 (i.e., 8+3). The signal Da2 is set to 0 based on the determination signal Ka that indicates the comparison result.

Then, the analog input signal VINa is compared with the determination value of 10 (i.e., 8+2). The signal Da1 is set to 0 based on the determination signal Ka that indicates the comparison result.

Further, the analog input signal VINa is compared with the determination value of 9 (i.e., 8+1). The signal Da0 is set to 0 based on the determination signal Ka that indicates the comparison result.

Accordingly, the digital signal DOa is calculated through the following equation.

$$DOa=8*1+5*0+3*0+2*0+0=8$$

The correction circuit 15 converts the digital signal DOa to the four-bit digital output signal DOUT. Accordingly, the value of the digital output signal DOUT is calculated through the following equation.

$$DOUT=16*8/20=6(\text{rounded})$$

For example, referring to FIG. 14, an error occurs in the first determination and the signal Da4 is set to 0. As a result, in the next determination, the determination value is set to 5. The analog input signal VINa is compared with the determination value of 5, and the signal Da3 is set to 1 based on the determination signal Ka, which indicates the comparison result.

The analog input signal VINa is then compared with the determination value of 8 (i.e., 5+3), and the signal Da2 is set to 1 based on the determination signal Ka, which indicates the comparison result.

Then, the analog input signal VINa is compared with the determination value of 10 (i.e., 5+3+2), and the signal Da1 is set to 0 based on the determination signal Ka, which indicates the comparison result.

Further, the analog input signal VINa is compared with the determination value of 9 (i.e., 5+3+1), and the signal Da0 is set to 0 based on the determination signal Ka, which indicates the comparison result.

Accordingly, the digital signal DOa is calculated through the following equation.

$$DOa=8*0+5*1+3*1+2*0+0=8$$

The value of the digital signal DOa is equivalent to the result illustrated in FIG. 13. That is, the error of the first determination is corrected.

The first embodiment has the advantages described below.

(1-1) The analog-to-digital conversion circuit 10, which converts the analog input signal VIN to the digital output signal DOUT, includes the capacitive D/A converter 11, the comparator 12, the conversion control circuit 13, the measurement control circuit 14, and the correction circuit 15. The D/A converter 11 includes the main capacitors CA4 to CA0 and the measurement capacitors CM2 to CM0, which are coupled to the common signal line LC. The capacitance of each of the main capacitors CA4 to CA0 is set to be less than or equal to the sum of the capacitances of the lower order side main capacitors. The D/A converter 11 generates the output voltage Vo in accordance with the analog input signal VIN and the control signal CSW and supplies the output voltage Vo to the common signal line LC. The comparator 12 compares the output voltage Vo and the common voltage VCM to generate the determination signal CSb. The measurement control circuit 14 generates the measurement control signal CSb in accordance with the determination signal Ka and measures the capacitances Wa4 to Wa1 of the main capacitors CA4 to CA2 corresponding to the upper order bits Da4 to Da2 of the digital signal Da. Here, the measurement control circuit 14 measures the capacitances of the capacitors subject to measurement (main capacitors CA4 to CA2) using one or more main capacitors at the lower order side (lower bit side) of the capacitor subject to measurement and the measurement capacitor CM2 to CM0. The conversion control circuit 13 generates the conversion control signal CSa in accordance with the determination signal Ka. Further, the conversion control circuit 13 converts the analog input signal VIN to the digital signal Da based on the conversion control signal CSa. The correction circuit 15 corrects the digital signal Da based on the capacitances Wa4 to Wa2 measured by the measurement control circuit 14 and outputs the digital output signal DOUT.

In the A/D conversion circuit 10, the measurement control circuit 14 measures the capacitances Wa4 to Wa2 of the main capacitors CA4 to CA2 in the D/A converter 11. The conversion control circuit 13 performs charge redistribution on the main capacitors CA4 to CA0 and converts the analog signal VIN to the digital signal DOUT based on the output voltage Vo corresponding to the capacitances Wa4 to Wa2 of the main capacitors CA4 to CA0. The correction circuit 15 corrects the digital signal Da based on the capacitances Wa4 to Wa2 to generate the digital output signal DOUT. Accordingly, a correction is not performed when determining the voltage of the analog input signal VIN. This allows the conversion time to be shortened.

(1-2) The correction circuit 15 stores the capacitances Wa4 to Wa2 of the main capacitors CA4 to CA2 measured by the measurement control circuit 14. Accordingly, there is no need for the A/D conversion circuit 10 to store an enormous amount of data like the A/D conversion circuit 230 illustrated in FIG. 18. Thus, the capacity of the memory that stores data does not have to be increased, and the circuit area does not have to be increased.

[Second Embodiment]

A second embodiment will now be described. Same reference numerals are given to those components that are the same as the corresponding components of the first embodiment. Such components will not be described in detail.

Figure 20:
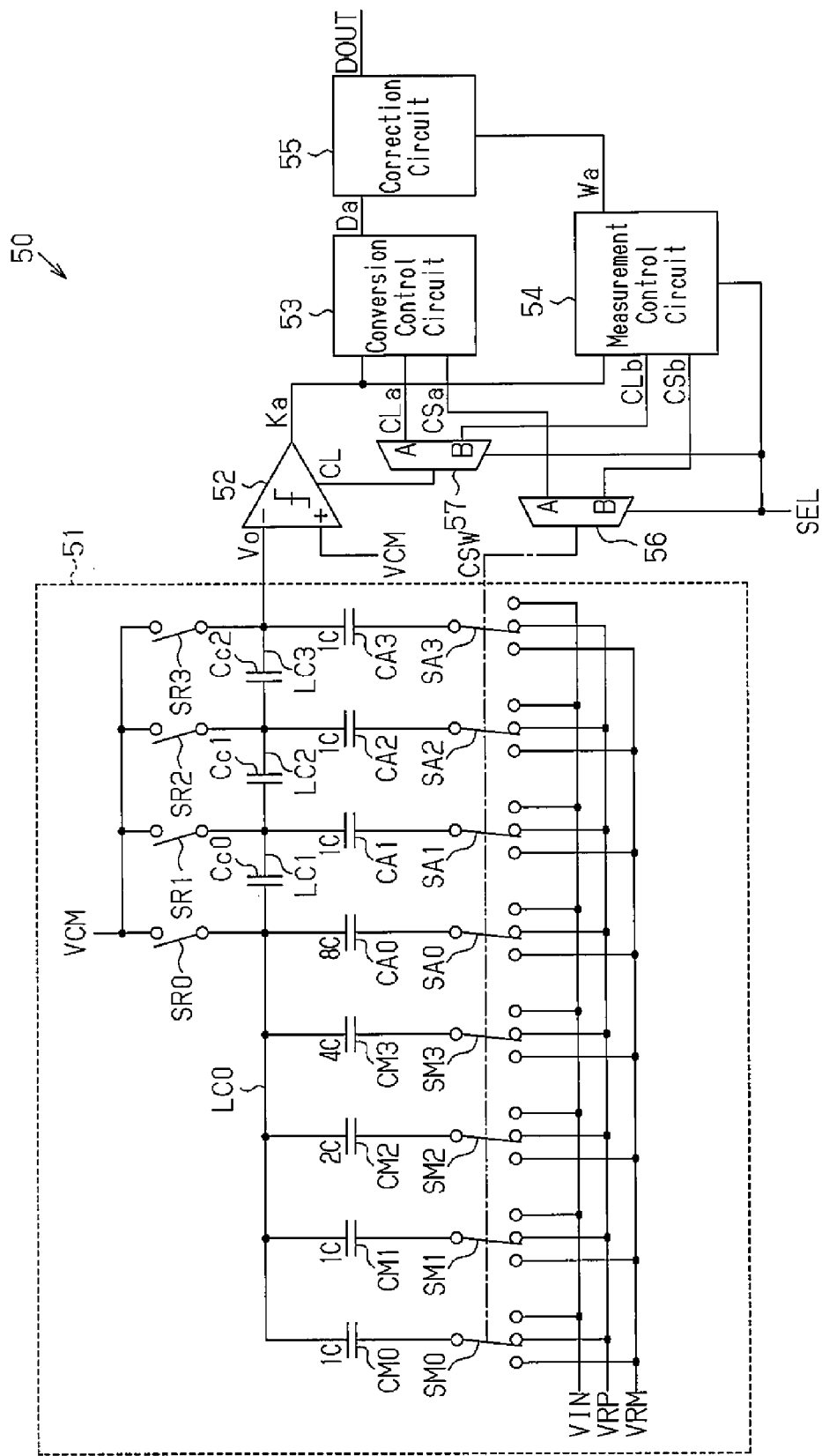
FIG. 20 is a schematic circuit diagram illustrating a second embodiment of an A/D conversion circuit.

Referring to FIG. 20, a successive approximation type A/D conversion circuit 50 converts an analog input signal VIN to a digital output signal DOUT having a plurality of bits (e.g., four bits). The A/D conversion circuit 50 includes a D/A converter 51, a comparator 52, a conversion control circuit 53, a measurement control circuit 54, a correction circuit 55, and selection circuits 56 and 57.

The D/A converter 51 is a charge redistribution type CDAC. The D/A converter 51 includes main capacitors CA3 to CA0 and main switches SA3 to SA0, which are respectively coupled to the main capacitors CA3 to CA0. The main switches SA3 to SA0 selectively supply one of the analog input signal VIN, the first reference voltage VRP, and the second reference voltage VRM to the corresponding capacitors CA3 to CA0. Further, the D/A converter 51 includes coupling capacitors Cc2 to Cc0. The main capacitors CA3 to CA0 are coupled to one another by the coupling capacitors Cc2 to Cc0. The coupling capacitors Cc2 to Cc0 may also be referred to as split capacitors.

A first terminal of the main capacitor CA3 is coupled to a first terminal of the coupling capacitor Cc2, and a second terminal of the coupling capacitor Cc2 is coupled to a first terminal of the main capacitor CA2. The first terminal of the main capacitor CA2 is coupled to the first terminal of the coupling capacitor Cc1, and a second terminal of the coupling capacitor Cc1 is coupled to a first terminal of the main capacitor CA1. The first terminal of the main capacitor CA1 is coupled to the first terminal of the coupling capacitor Cc0, and a second terminal of the coupling capacitor Cc0 is coupled to a first terminal of the main capacitor CA0. The second terminals of the main capacitors CA3 to CA0 are coupled to the main switches SA3 to SA0.

A node between the main capacitor CA3 and the coupling capacitor Cc2 is coupled to a common signal line LC3. The common signal line LC3 is coupled to a first terminal of a reset switch SR3. A node between the main capacitor CA2, the coupling capacitor Cc2, and the coupling capacitor Cc1 is coupled to a common signal line LC2. The common signal line LC2 is coupled to a first terminal of a reset switch SR2. A node between the main capacitor CA1, the coupling capacitor Cc1, and the coupling capacitor Cc0 is coupled to a common signal line LC1. The common signal line LC1 is coupled to a first terminal of a reset switch SR1. A node between the main capacitor CA0 and the coupling capacitor Cc0 is coupled to a common signal line LC0. The common signal line LC0 is coupled to a first terminal of a reset switch SR0. Second terminals of the reset switches SR3 to SR0 are supplied with the common voltage VCM.

Further, the D/A converter 51 includes measurement capacitors CM3 to CM0 and measurement switches SM3 to SM0. The measurement capacitors CM3 to CM0 are used to measure the capacitances of the main capacitors CA3 to CA1. The measurement switches SM3 to SM0 selectively supply one of the analog input signal VIN, the first reference voltage VRP, and the second reference voltage VRM to the corresponding measurement capacitors CM3 to CM0. The measurement capacitors CM3 to CM0 have first terminals coupled to the common signal line LC0 and second terminals coupled to the corresponding measurement switches SM3 to SM0.

The common signal line LC3 is coupled to the comparator 52. The comparator 52 includes an inverting input terminal supplied with the output voltage Vo from the D/A converter 51 and a non-inverting input terminal supplied with the common voltage VCM. The comparator 52 compares the output voltage Vo and the common voltage VCM to generate a determination signal Ka that indicates the comparison result. The determination signal Ka is provided to the conversion control circuit 53 and the measurement control circuit 54.

Based on the determination signal Ka from the comparator 52, the conversion control circuit 53 generates a latch signal CLa, a conversion control signal CSa, and a digital signal Da. The conversion control circuit 53 includes a register that successively holds the value of the determination signal Ka and a logic circuit that generates the digital signal Da and the conversion control signal CSa. The conversion control circuit 53 outputs the digital signal Da in accordance with the value of the determination signal Ka held by the register. The digital signal Da includes four bit signals corresponding to the main capacitors CA3 to CA0.

Based on the determination signal Ka, the measurement control circuit 54 generates a latch signal CLb, a measurement control signal CSb, and a capacitance signal Wa. For example, the measurement control circuit 54 includes a logic circuit that generates the measurement control signal CSb based on the determination signal Ka and a register that holds the value of the measurement control signal CSb. In the second embodiment, the measurement control circuit 54 changes the value of the measurement control signal CSb to sequentially measure capacitances Wa3 to Wa1 of the main capacitors CA3 to CA1 and store the value of the measurement control signal CSb whenever measuring each of the capacitances Wa3 to Wa1. Further, the measurement control circuit 54 outputs the capacitance signal Wa including one of the capacitances Wa3 to Wa1 that corresponds to the value of each measurement control signal CSb.

The measurement control circuit 54 of the second embodiment measures the capacitance of each capacitor subject to measurement (i.e., main capacitors CA3 to CA1) using the measurement capacitors CM3 to CM0 and one or more main capacitors at the lower order side (lower bit side) of the capacitor subject to measurement. For example, the measurement control circuit 54 measures the capacitance of the main capacitor CA3 using the main capacitors CA2 and CA0 and the measurement capacitors CM3 to CM0. In the same manner, the measurement control circuit 54 measures the capacitance of the main capacitor CA2 using the main capacitors CA1 and CA0 and the measurement capacitors CM3 to CM0. Likewise, the measurement control circuit 54 measures the capacitance of the main capacitor CA1 using the main capacitor CA0 and the measurement capacitors CM3 to CM0.

The selection circuit 56 is provided with the conversion control signal CSa from the conversion control circuit 53 and the measurement control signal CSb from the measurement control circuit 54. The selection circuit 56 is also provided with a selection signal SEL. In the same manner as the first embodiment, the selection signal SEL is used to select the operation of the A/D conversion circuit 50. The selection circuit 56 selects the conversion control signal CSa when the selection signal SEL has a first level and outputs the conversion control signal CSa as the control signal CSW. The selection circuit 56 selects the measurement control signal CSb when the selection signal SEL has a second level and outputs the measurement control signal CSb as the control signal CSW.

In the same manner as the first embodiment, the selection circuit 57 is provided with the latch signal CLa from the conversion control circuit 53, the latch signal CLb from the measurement control circuit 54, and the selection signal SEL. When the selection signal SEL has a first level, the selection circuit 57 selects the latch signal CLa and outputs the latch signal CLa as a latch signal CL. When the selection signal SEL has a second level, the selection circuit 57 selects the latch signal CLb and outputs the latch signal CLb as the latch signal CL.

The correction circuit 55 corrects the digital signal Da, which is output from the conversion control circuit 53, based on the capacitance signal Wa, which is output from the measurement control circuit 54, to generate the digital output signal DOUT. The correction circuit 55 stores the capacitances of those other than the main capacitors CA3 to CA1 subject to measurement, namely, the main capacitor CA0. The correction circuit 55 calculates the voltage of the analog input signal VIN based on each bit value of the digital signal Da, the capacitances Wa3 to Wa1 (capacitance signal Wa) of the main capacitors CA3 to CA1, and the pre-stored capacitance of the main capacitor CA0. In other words, instead of the design values of the main capacitors CA3 to CA1, the correction circuit 55 uses the capacitances Wa3 to Wa1 of the main capacitors CA3 to CA1 measured by the measurement control circuit 54 to correct the voltage of the analog input signal VIN. The resolution of the A/D conversion circuit 50 is set by the capacitances of the main capacitors CA3 to CA0 of the D/A converter 51 for the input range of the analog input signal VIN that corresponds to the potential difference of the first reference voltage VRP and the second reference voltage VRM. The correction circuit 55 converts the voltage of the analog input signal VIN to the three bit digital output signal DOUT and outputs the digital output signal DOUT.

The switches are not restricted to the configuration illustrated in FIG. 20. For example, the main switch SA2 may be configured in any manner as long as it selectively supplies one of the analog input signal VIN, the first reference voltage VRP, and the second reference voltage VRM to the main capacitor CA3. For example, three switches may be coupled to the main capacitor CA3, and the switches may be controlled to selectively supply one of the analog input signal VIN, the first reference voltage VRP, and the second reference voltage VRM to the main capacitor CA3. The same applies to the main switches SA2 to SA0 and the measurement switches SM3 to SM0.

The capacitances of the main capacitors CA3 to CA0 in the D/A converter 51 will now be described.

Figure 21A:
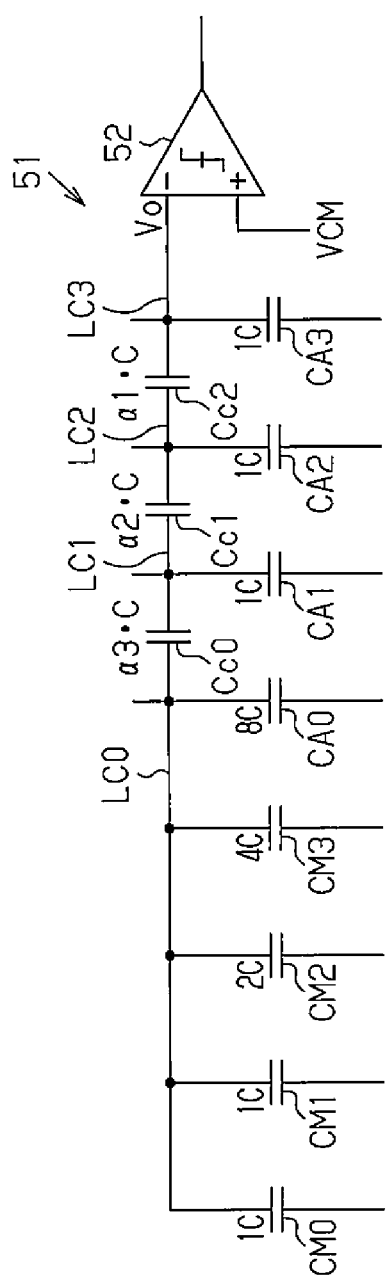
FIG. 21A is a schematic circuit diagram illustrating coupling capacitors.

As illustrated in FIG. 21A, the main capacitors CA3 to CA0 are set to have a predetermined capacitance ratio, for example, 1:1:1:8. The measurement capacitors CM3 to CM0 are set to have a capacitance ratio of 4:2:1:1. The capacitance sum of the measurement capacitors CM3 to CM0 is equal to the capacitance of the main capacitor CA0.

The capacitances of the coupling capacitors Cc0 to Cc2 are respectively set to $a3*C$, $a2*C$, and $a1*C$. The capacitance of each of the main capacitors CA3 to CA1 is 1C. Accordingly, a3 to a1 are each set expressing a capacitance ratio. That is, a3 to a1 are set expressing the ratio of the capacitances of the coupling capacitors Cc0 to Cc2 relative to the capacitances of the main capacitors CA3 to CA1.

As viewed from the common signal line LC1, a combined capacitance C (LC1) of the lower order side capacitors CA0 and CM3 to CM0 is expressed by the following equation.

$$C(LC1)=(16*a3/(a3+16))*C$$

The equation allows the combined capacitance of the lower order capacitors to be set using the capacitance $a3*C$ of the coupling capacitor Cc0.

The capacitance 1C of the main capacitor CA1 is set to be less than or equal to the capacitance sum of the main capacitor CA1, the measurement capacitors CM4 to CM0, and the coupling capacitor Cc0, which are at the lower order side of the main capacitor CA1. That is, the capacitance 1C of the main capacitor CA1 satisfies the following condition.

$$1C \leq (16*a3/(a3+16))*C, \text{ where } a3 \leq 16/15 \text{ is satisfied.}$$

The capacitance ratio a3 is set to be greater than or equal to 16/15 taking into consideration a capacitor mismatch. The same applies to the capacitance ratios a2 and a1. The capacitances of the main capacitors CA2 and CA3 are determined in accordance with the capacitances of the coupling capacitors Cc1 and Cc2.

Figure 21B:
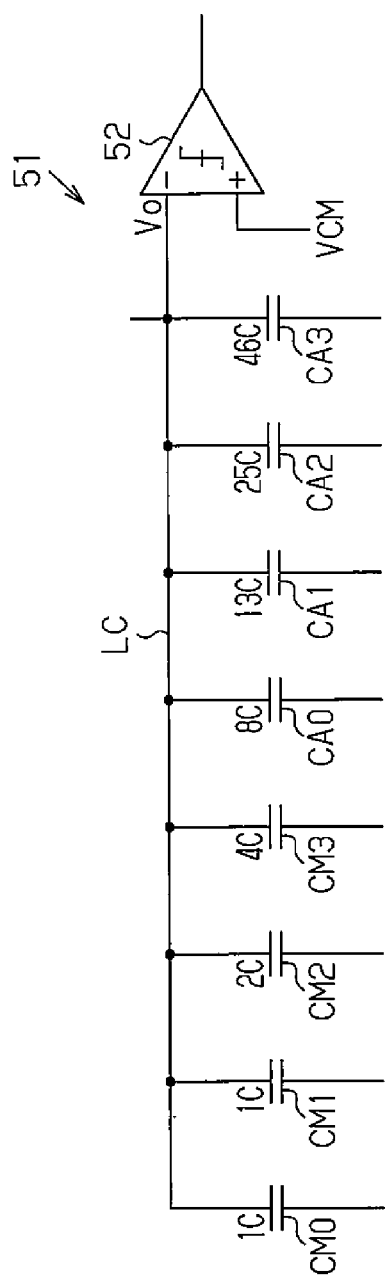
FIG. 21B is an equivalent circuit diagram of the circuit illustrated in FIG. 21A.

FIG. 21B illustrates an equivalent circuit of the circuit illustrated in FIG. 21A. In FIG. 21B, the capacitances Wa3 to Wa1 of the main capacitors CA3 to CA1 are measured by the measurement control circuit 54 illustrated in FIG. 20. In FIG. 21B, the capacitance Wa1 is 13C, the capacitance Wa1 is 25C, and the capacitance Wa3 is 46C. These values are measured values, that is, manufacture values. The measurement control circuit 54 outputs the capacitances Wa3 to Wa1 as the capacitance signal Wa.

Referring to FIG. 20, the conversion control circuit 53 performs an A/D conversion on the circuit illustrated in FIG. 21B and outputs the digital signal Da. Further, the correction circuit 55 corrects the digital signal Da based on the capacitance signal Wa (Wa3 to Wa1) to generate a digital signal DOa. The digital signal DOa is calculated through the following equation.

$$DOa=46*Da3+25*Da2+13*Da1+8*Da0$$

The correction circuit 55 converts the digital signal DOa to a three-bit digital output signal DOUT. The digital output signal DOUT is calculated through the following equation.

$$DOUT=8*Da/100=8*(46*Da3+25*Da2+13*Da1+8*Da0)/100$$

The denominator of 100, which corresponds to the code width of the digital signal DOa, is the sum of the capacitances of the main capacitors CA3 to CA0 and the measurement capacitors CM3 to CM0 illustrated in FIG. 21B.

Figure 22:
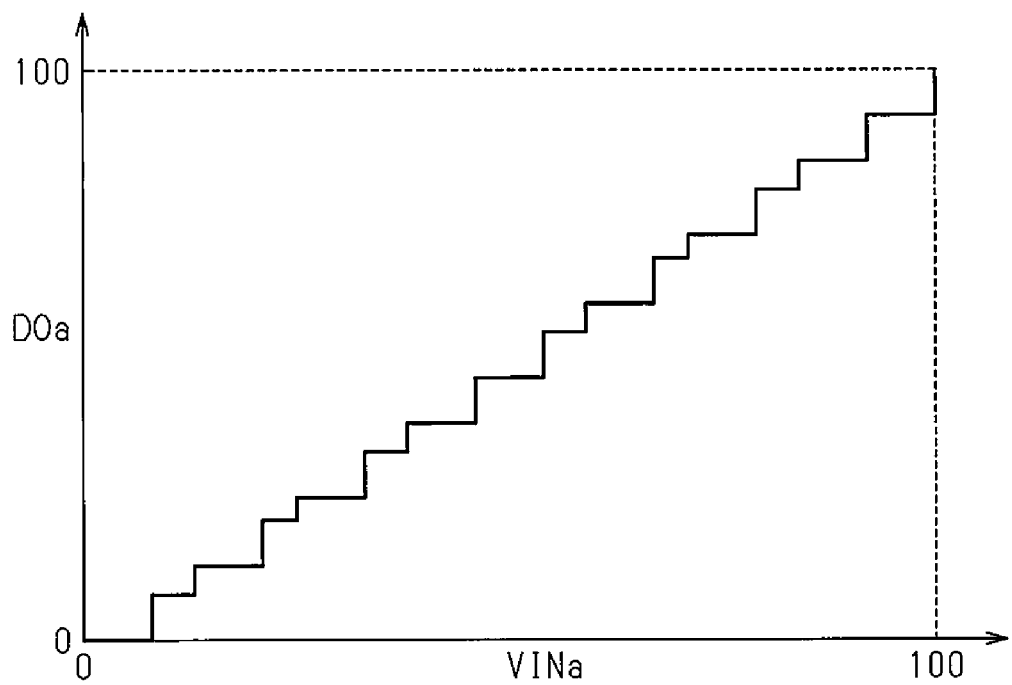
FIGS. 22 and 23 are diagrams illustrating the properties of the A/D conversion circuit illustrated in FIG. 20.
Figure 23:
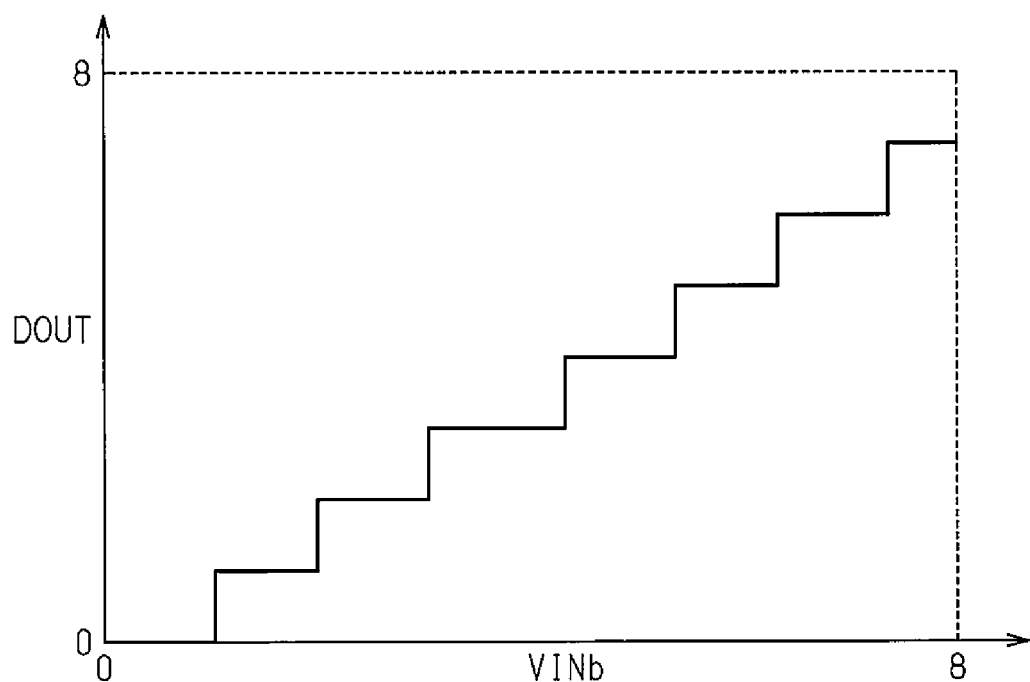

FIGS. 22 and 23 illustrate the characteristics of the A/D conversion circuit 50.

FIG. 22 illustrates the digital signal Da with respect to the analog input signal VINa. The analog input signal VINa illustrated by the horizontal axis is the value indicating the value of the analog input signal VIN in voltage corresponding to 1 LSB of the D/A converter 51.

FIG. 23 illustrates the digital output signal DOUT with respect to the analog input signal VINb. The analog input signal VINb illustrated by the horizontal axis is the value indicating the value of the analog input signal VIN in voltage corresponding to 1 LSB of the three-bit digital output signal DOUT.

The second embodiment has the advantages described below.

(2-1) In the same manner as the first embodiment, the correction circuit 55 generates the digital output signal DOUT by correcting the digital signal Da, which has been converted from the analog input signal VIN, using the capacitances Wa3 to Wa1 of the main capacitors CA3 to CA1 measured by the measurement control circuit 54. This configuration allows the A/D conversion time to be shortened.

(2-2) The use of the coupling capacitors Cc2 to Cc0 allow the capacitances of the main capacitors CA3 to Cal to be decreased. Thus, the main capacitors CA3 to CA1 may be reduced in size.

[Third Embodiment]

A third embodiment will now be described. Same reference numerals are given to those components that are the same or similar in the above embodiments. Such components will not be described in detail.

Figure 24:
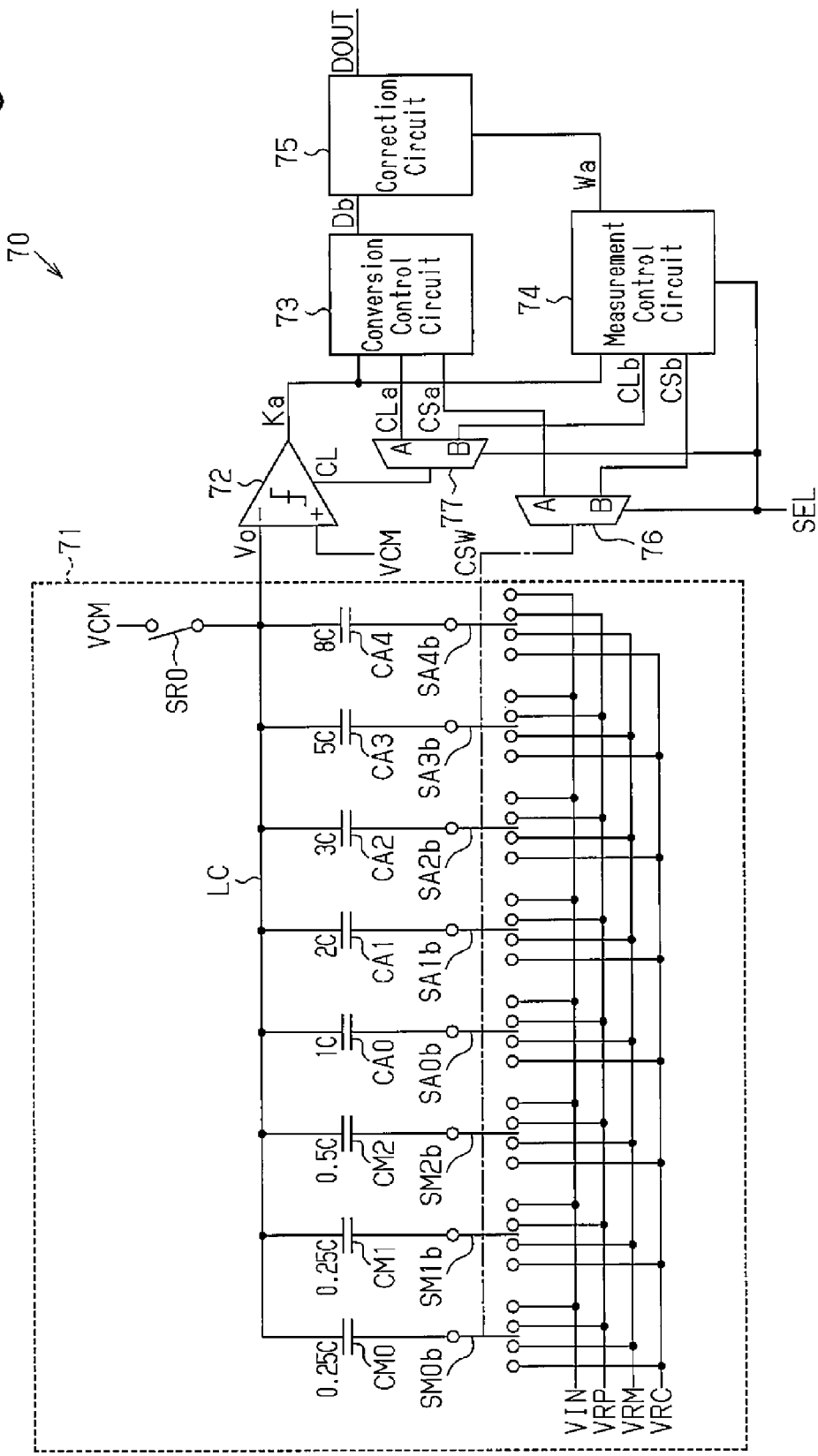
FIG. 24 is a schematic circuit diagram illustrating a third embodiment of an A/D conversion circuit.

As illustrated in FIG. 24, an A/D conversion circuit 70 includes a D/A converter 71, a comparator 72, a conversion control circuit 73, a measurement control circuit 74, a correction circuit 75, and selection circuits 76 and 77.

The D/A converter 71 generates the output voltage based on the analog input signal VIN, the first reference voltage VRP, the second reference voltage VRM, a middle voltage VRC, a common voltage VCM, and a control signal CSW. The middle voltage VRC is set as a middle voltage ((VRP+VRM)/2) between the first reference voltage VRP and the second reference voltage VRM.

The D/A converter 71 is a charge redistribution type CDAC. The D/A converter 71 includes main capacitors CA4 to CA0 and main switches SA4b to SA0b, which are respectively coupled to the main capacitors CA4 to CA0. The main switches SA4b to SA0b selectively supply one of the analog input signal VIN, the first reference voltage VRP, the second reference voltage VRM, and the middle voltage VRC to the corresponding capacitors CA4 to CA0. Further, the D/A converter 71 includes measurement capacitors CM2 to CM0 and measurement switches SM2b to SM0b, which are respectively coupled to the measurement capacitors CM2 to CM0. The measurement capacitors CM2 to CM0 are used to measure the capacitances of the main capacitors CA4 to CA2. The measurement switches SM2b to SM0b are used to selectively supply one of the analog input signal VIN, the first reference voltage VRP, the second reference voltage VRM, and the middle voltage VRC to the corresponding measurement capacitors CM2 to CM0.

First terminals of the main capacitors CA4 to CA0 and the measurement capacitors CM2 to CM0 are coupled to the common signal line LC. The common signal line LC is coupled to a first terminal of the reset switch SR0, and a second terminal of the reset switch SR0 is supplied with the common voltage VCM.

The main switches SA4b to SA0b and the measurement switches SM0b to SM2b, which are respectively coupled to second terminal of the main capacitors CA4 to CA0 and the measurement capacitors CM2 to CM0, selectively supply one of the analog input signal VIN, the first reference voltage VRP, the second reference voltage VRM, and the middle voltage VRC. The control signal CSW includes a plurality of signals that independently control the main switches SA4b to SA0b and the measurement switches SM2b to SM0b. Further, the control signal CSW includes a signal for controlling the reset switch SR0.

The switches are not restricted to the configuration illustrated in FIG. 24. For example, the main switch SA4b may be configured in any manner as long as it selectively supplies one of the analog input signal VIN, the first reference voltage VRP, the second reference voltage VRM, and the middle voltage VRC to the main capacitor CA4. For example, four switches may be coupled to the main capacitor CA4, and the switches may be controlled to selectively supply one of the analog input signal VIN, the first reference voltage VRP, the second reference voltage VRM, and the middle voltage VRC to the main capacitor CA4. The same applies to the main switches SA3b to SA0b and the measurement switches SM2b to SM0b.

Based on the determination signal Ka, the conversion control circuit 73 generates a latch signal CLa, a conversion control signal CSa, and a digital signal Db. For example, the conversion control circuit 73 includes a register that successively holds the value of the determination signal Ka and a logic circuit that generates the digital signal Db and the conversion control signal CSa. The conversion control circuit 73 outputs the digital signal Db in accordance with the value of the determination signal Ka held by the register. The digital signal Da includes five bit signals corresponding to the main capacitors CA4 to CA0.

Based on the determination signal Ka, the measurement control circuit 74 generates a latch signal CLb, a measurement control signal CSb, and a capacitance signal Wa. In the same manner as the above embodiments, the measurement control circuit 74 changes the value of the measurement control signal CSb to sequentially measure capacitances Wa4 to Wa2 of the main capacitors CA4 to CA2. Further, the measurement control circuit 74 outputs the capacitance signal Wa including one of the capacitances Wa4 to Wa2 that corresponds to the value of each measurement control signal CSb.

The selection circuit 76 is provided with the conversion control signal CSa from the conversion control circuit 73 and the measurement control signal CSb from the measurement control circuit 74. Further, the selection circuit 76 is provided with a selection signal SEL. When the selection signal SEL has a first level, the selection circuit 76 selects the conversion control signal CSa and outputs the conversion control signal CSa as the control signal CSW. When the selection signal SEL has a second level, the selection circuit 76 selects the measurement control signal CSb and outputs the measurement control signal CSb as the control signal CSW.

In the same manner, the selection circuit 77 is provided with the latch signal CLa from the conversion control circuit 73, the latch signal CLb from the measurement control circuit 74, and the selection signal SEL. When the selection signal SEL has a first level, the selection circuit 77 selects the latch signal CLa and outputs the latch signal CLa as the latch signal CL. When the selection signal SEL has a second level, the selection circuit 77 selects the latch signal CLb and outputs the latch signal CLb as the control signal CL.

The correction circuit 75 corrects the digital signal Db output from the conversion control circuit 73 based on the capacitance signal Wa output from the measurement control circuit 74 to generate the digital output signal DOUT. The correction circuit 75 calculates the voltage of the analog input signal VIN based on each bit value of the digital signal Db, the capacitances Wa4 to Wa2 of the main capacitors CA4 to CA2, and the pre-stored capacitances of the analog input signal VIN. The correction circuit 75 converts the voltage of the analog input signal VIN to the four-bit digital output signal DOUT.

The operation of the A/D conversion circuit 70 during A/D conversion will now be described. FIGS. 25A to 26B illustrate the capacitors CA4 to CA0, the measurement capacitors CM2 to CM0, and the comparator 72 but do not illustrate other components. To facilitate understanding, the capacitances of the main capacitors CA4 to CA0 and the measurement capacitors CM2 to CM0 will be described using the design values. Here, the capacitances of the capacitors CA4 to CA0 and CM2 to CM0 are respectively set to 8C, 5C, 3C, 2C, 1C, 0.5C, 0.25C, and 0.25C. Accordingly, the capacitances Wa4, Wa3, and Wa2 output from the measurement control circuit 74 are respectively 8, 5, and 3.

Figure 25A:
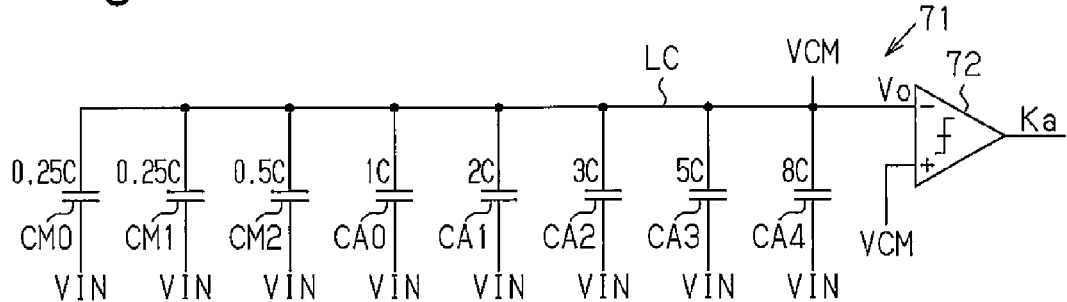
FIGS. 25A to 25D, 26A, and 26B are schematic circuit diagrams illustrating an A/D conversion process performed by the A/D conversion circuit of FIG. 24.

Referring to FIG. 25A, the D/A converter 71 samples the analog input signal VIN with the main capacitors CA4 to CA0 and the measurement capacitors CM2 to CM0. The main capacitors CA4 to CA0 and the measurement capacitors CM2 to CM0 are provided with the analog input signal VIN, and the common signal line LC is supplied with the common voltage VCM. Accordingly, the main capacitors CA4 to CA0 and the measurement capacitors CM2 to CM0 are charged in accordance with the analog input signal VIN.

Figure 25B:
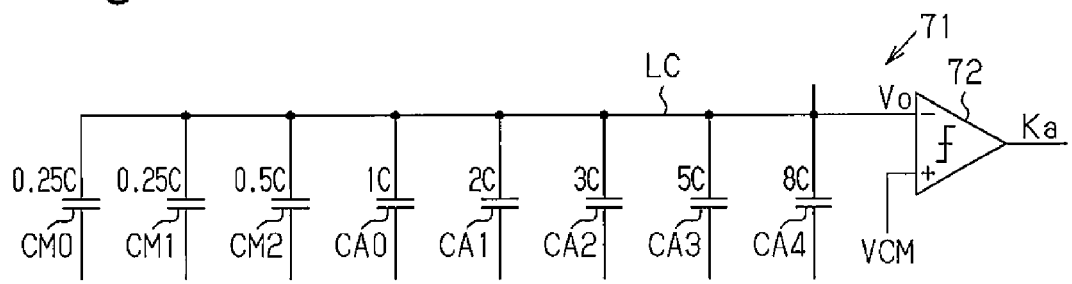

Then, referring to FIG. 25B, the main switches SA4 to SA0, the measurement switches SM2 to SM0, and the reset switch SR0 (refer to FIG. 24) are deactivated so that the capacitors CA4 to CA0 and CM2 to CM0 are held charged.

The charge Q stored through such sampling and holding is calculated through the next equation in the same manner as the first embodiment.

$$Q=(VCM-VIN)*(8C+5C+3C+2C+0.5C+0.25C+\\0.25C)=(Vo-CA4)*8C+(Vo-CA3)*5C+\\(Vo-CA2)*3C+(Vo-CA1)*2C+(Vo-CA0)*1C+\\(Vo-CM2)*0.5C+(Vo-CM1)*0.25C+\\(Vo-CM0)*0.25C$$

Accordingly, the output voltage Vo at the common signal line LC is calculated through the following equation.

$$Vo=-(VR/CAL)*(VINa-(8*Da4+5*Da3+3*Da2+\\2*Da1+1*Da0+0.5*DMa2+0.25*DMa1+\\0.25*DMa0))+VCM \quad (3)$$

where
VR=VRP−VRM
VINa=CAL*(VIN−VRM)/VR
CAL=8+5+3+2+1+0.5+0.25+0.25=20
Da4=(CA4−VRM)/VR
Da3=(CA3−VRM)/VR
Da2=(CA2−VRM)/VRDa1=(CA1−VRM)/VR
Da0=(CA0−VRM)/VR
DMa2=(CM2−VRM)/VR
DMa1=(CM1−VRM)/VR
DMa0=(CM0−VRM)/VR Equation (3) is transformed using the middle voltage VRC to obtain the following equation.

$$Vo=-(VR/CAL)*(VINa-(10+4*Db4+2.5*Db3+\\1.5*Db2+1*Db1+0.5*Db0+0.25*DMb2+\\0.125*DMb1+0.125*DMb0))+VCM \quad (4)$$

where
VR=VRP−VRM
VINa=CAL*(VIN−VRM)/VR
CAL=8+5+3+2+1+0.5+0.25+0.25=20
Db4=2*(CA4−VRC)/VR
Db3=2*(CA3−VRC)/VR
Db2=2*(CA2−VRC)/VR
Db1=2*(CA1−VRC)/VR
Db0=2*(CA0−VRC)/VR
DMb2=2*(CM2−VRC)/VR
DMb1=2*(CM1−VRC)/VR
DMb0=2*(CM0−VRC)/VR
VRC=(VRP+VRM)/2

Figure 25C:
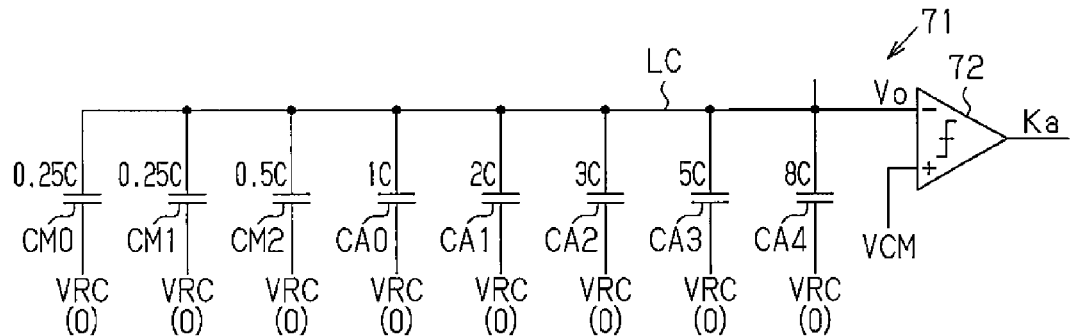

Then, referring to FIG. 25C, the main capacitors CA4 to CA0 and the measurement capacitors CM2 to CM0 are supplied with the middle voltage VRC. In FIG. 25C, the numerals (0 or 1) in parentheses indicate the values of the control signal CSW corresponding to the main switches SA4$a$ to SA0$a$ and the measurement switches SM2$a$ to SM0$a$.

In equation (4), the values of Db4 to Db0 and DMb2 to DMb0 are 0. Thus, the output voltage Vo at the common signal line LC is calculated from equation (4).

$$Vo=-(VR/CAL)*(VINa-10)+VCM$$

The comparator 72 compares the output voltage Vo and the common voltage VCM to generate the determination signal Ka. The value (−1 or +1) of the MSB (Db4) in the digital signal Db is determined in accordance with the level of the determination signal Ka (high or low).

Figure 25D:
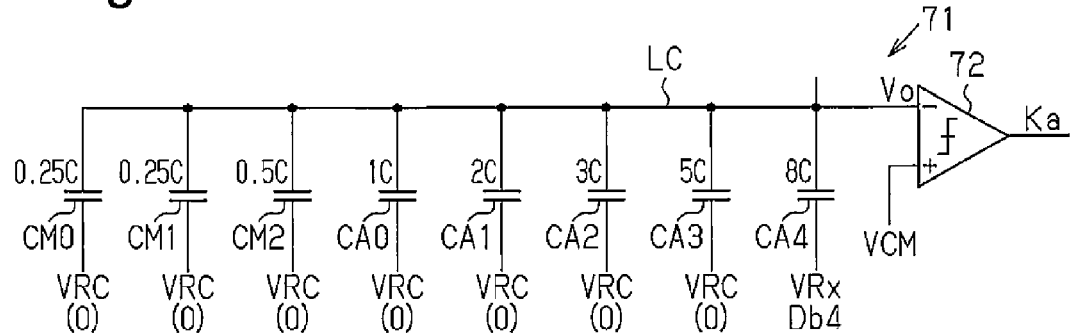

Referring to FIG. 25D, the main capacitor CA4 is supplied with the reference voltage VRx (first reference voltage VRP or second reference voltage VRM) based on the signal Db4 (−1 or +1). For example, when the signal Db4 is +1 (determination signal Ka is high), the output voltage Vo is calculated through the following equation.

$$Vo=-(VR/CAL)*(VINa-(10+4))+VCM$$

When the signal Db4 is −1 (determination signal Ka is low), the output voltage Vo is calculated through the following equation.

$$Vo=-(VR/CAL)*(VINa-(10-4))+VCM$$

The value of the signal Db3 is determined in accordance with the level of the determination signal Ka indicating the comparison result of the output voltage Vo and the common voltage VCM.

Figure 26A:
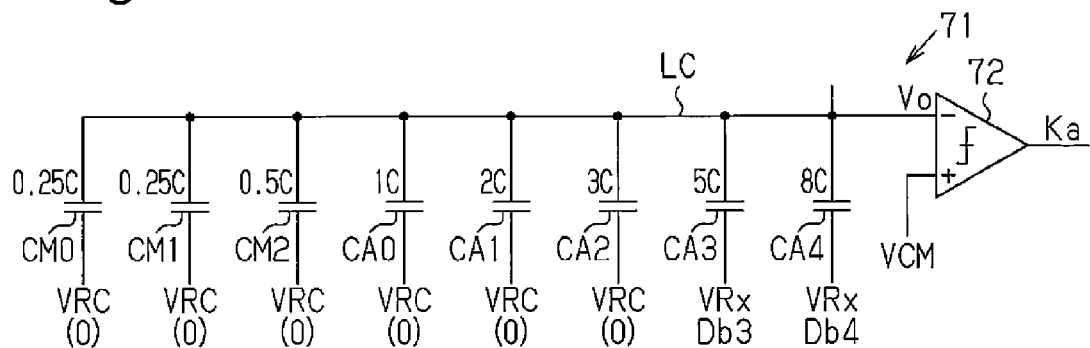

Referring to FIG. 26A, the main capacitor CA3 is supplied with the reference voltage VRx (first reference voltage VRP or second reference voltage VRM) based on the signal Db3 (−1 or +1). Further, the value of the signal Db2 is determined in accordance with the level of the determination signal Ka indicating the comparison result of the output voltage Vo and the common voltage VCM.

In the same manner, the main capacitor CA2 is supplied with the reference voltage VRx (first reference voltage VRP or second reference voltage VRM) based on the signal Db2 (−1 or +1). Further, the value of the signal Db1 is determined in accordance with the level of the determination signal Ka indicating the comparison result of the output voltage Vo and the common voltage VCM.

Figure 26B:
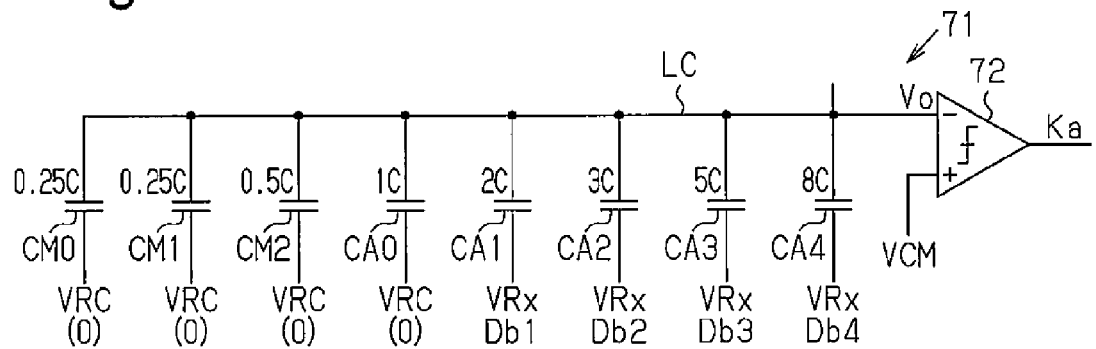

Accordingly, as illustrated in FIG. 26B, the main capacitors CA4 to CA1 are supplied with the reference voltage VRx (first reference voltage VRP and second reference voltage VRM) based on the signals Db4 to Db1 of the code (conversion control signal CSa). The value of the signal Db0 is determined in accordance with the level of the determination signal Ka, which indicates the comparison result of the output voltage Vo and the common voltage VCM.

Through these processes, the conversion control circuit illustrated in FIG. 24 outputs the digital signal Db including the signals Db4 to Db0.

The conversion control circuit 73 performs conversion so that VINa−(10+4*Db4+2.5*Db3+1.5*Db2+1*Db1+0.5*Db0+0.25*DMb2+0.125*DMb1+0.125*DMb0) in equation (4) approaches 0. As illustrated in FIGS. 25C and 26B, when conversion is performed with the main capacitors CA4 to CA0, DMb2 to DMb0 are 0. Further, the conversion control circuit 73 supplies the measurement capacitors CM2 to CM0 with the middle voltage VRC. Accordingly, the digital signal Db output from the conversion control circuit 73 is expressed by the following equation.

$$Db=10+4*Db4+2.5*Db3+1.5*Db2+1*Db1+0.5*Db0$$

The correction circuit 75 corrects the digital signal Db, which is output from the conversion control circuit 73, based on the capacitance value Wa (capacitances Wa4 to Wa2), which is output from the measurement control circuit 74, to generate the digital signal Dob. The digital signal Dob is expressed by the following equation using the capacitance Wa (Wa4 to Wa2).

$$DOb=10+Wa4/2*Db4+Wa3/2*Db3+Wa2/2*Db2+2/\\2*Db1+1/2*Db0$$

The correction circuit 75 uses the following equation to convert the digital value Dob to a digital output signal DOUT having a certain number of bits (e.g., four bits).

$$DOUT=16*DOb/20$$

In this equation, 16 is the code width of the four-bit digital signal, 20 is the code width of the D/A converter 71 (i.e., 8+5+3+2+1+0.5+0.25+0.25) based on the capacitances Wa4 to Wa2. Accordingly, when n represents the number of bits, and CAL represents the capacitance sum of the D/A converter 71, the digital output signal DOUT is calculated through the following equation.

$$DOUT=2^n*DOb/CAL$$

The operation of the A/C conversion circuit 70 during A/D conversion will now be described.

The comparator 72 compares the output voltage Vo and the common voltage VCM to generate the determination signal Ka. As will be understood from equation (4), the comparison is equivalent to comparing the analog input signal VINa with the median value of the code width of the D/A converter 71 or comparing the analog input signal VINa with a value obtained by sequentially adding or subtracting one-half of the capacitance of a capacitor to or from the median value of the code width based on the determination result. Hereafter, the median value of the value resulting from the addition or subtraction will be used as the determination value, and the determination value will be compared with the analog input signal VINa to describe the operation of the comparator 72.

In the third embodiment, the capacitance sum of the capacitors is 20. Accordingly, the code width of the D/A converter 71 is 20, and the first determination value is 10.

Figure 27:
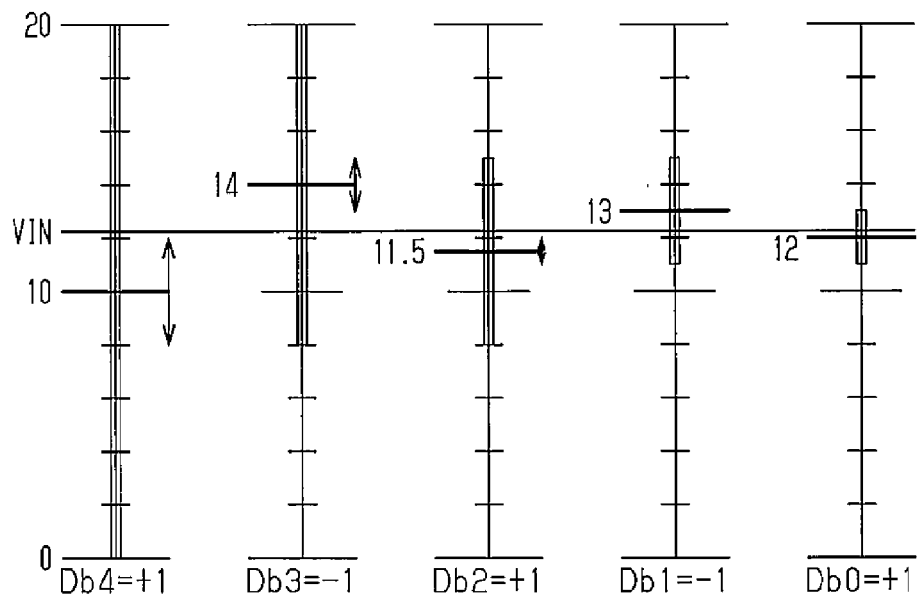
FIGS. 27 to 29 are diagrams illustrating the operation of the A/D conversion circuit illustrated in FIG. 24.

Referring to FIG. 27, the analog input signal VINa is first compared with the determination value of 10. Here, the value of the analog input signal VINa is 12.25. In this case, the signal Db4 is set to +1 based on the determination signal Ka. Then, the analog input value VINa is compared with the determination value of 14 (i.e., 10+4(=8/2)), and the signal Db3 is set to −1 based on the determination signal Ka, which indicates the comparison result. Then, the analog input value VINa is compared with the determination value of 11.5 (i.e., 14−2.5(=5/2)), and the signal Db2 is set to +1 based on the determination signal Ka, which indicates the comparison result. Then, the analog input value VINa is compared with the determination value of 13 (i.e., 11.5+1.5(=3/2)), and the signal Db3 is set to −1 based on the determination signal Ka, which indicates the comparison result. Then, the analog input value VINa is compared with the determination value of 12 (i.e., 13−1(=2/2)), and the signal Db3 is set to +1 based on the determination signal Ka, which indicates the comparison result.

The bit values Db4 to Db0 in the digital signal Db of the conversion control circuit 73 are set in this manner. The correction circuit 75 calculates the digital signal DOa based on the digital signal Db and the capacitances Wa4 to Wa1, which are output from the measurement control circuit 74. The digital signal DOa is calculated through the following equation.

$$DOa=10+4*(+1)+2.5*(-1)+1.5*(+1)+1*(-1)+0.5*(+1)=12.5$$

The correction circuit 75 converts the digital signal DO1 to the four-bit digital output signal DOUT. The digital output signal DOUT is calculated through the following equation.

$$DOUT=16*12.5/20=10(\text{rounded})$$

In FIG. 27, the vertical axis represents the code of the D/A conversion circuit 71, and the horizontal axis represents the number of determinations. In the vertical axis, the portions illustrated by triple lines indicate the range of the analog input signal in each determination, and the arrows indicate redundant ranges.

The redundant ranges are where determination errors of the analog input signal VINa is able to be corrected based on the determination result that uses the lower order side capacitors. That is, the redundant ranges are where determination errors are tolerable.

In the D/A converter 71, the capacitance of the main capacitor CA4 is set to be lower than or equal to the sum of the capacitances of the lower order side main capacitors CA3 to CA0 and the capacitances of the measurement capacitors CM2 to CM0. Accordingly, the use of the lower order side main capacitors CA3 to CA0 enables the generation of voltage that is about the same as the output voltage Vo, which is generated with the main capacitor CA4, at the common signal line LC. Thus, voltage determination that is similar to that performed with the main capacitor CA4 may be performed using the main capacitors CA3 to CA0. The same applies the main capacitors CA3 to CA2.

In the third embodiment, redundant ranges are set centered about determination values. For example, power supply noise or heat noise randomly changes the voltage of the analog input signal VIN at a high potential side or a low potential side. A redundant range set as described above enables the correction of a determination error caused by a random voltage change of the analog input signal VIN.

Figure 28:
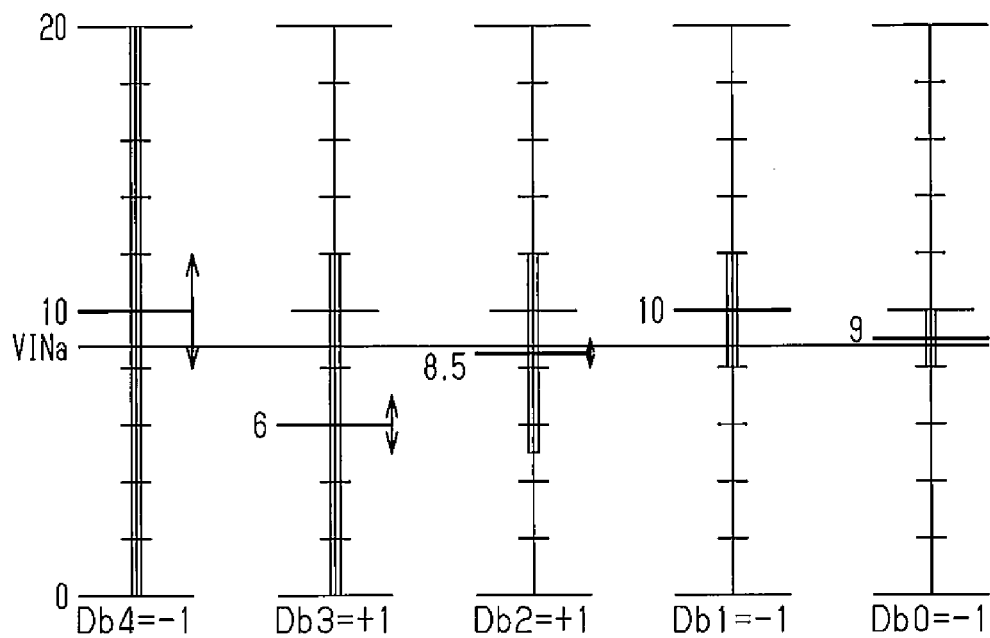

For example, in FIG. 28, the analog input signal VINa has a value of 8.75, which is in the redundant range. When a determination error does not occur, in the first determination, the signal Db4 is set to −1. Then, the analog input value VINa is compared with the determination value of 6 (i.e., 10−4(=8/2)), and the signal Db3 is set to +1 based on the determination signal Ka, which indicates the comparison result. Then, the analog input value VINa is compared with the determination value of 8.5 (i.e., 6+2.5(=5/2)), and the signal Db2 is set to +1 based on the determination signal Ka, which indicates the comparison result. Then, the analog input value VINa is compared with the determination value of 10 (i.e., 8.5+1.5(=3/2)), and the signal Db1 is set to −1 based on the determination signal Ka, which indicates the comparison result. Further, the analog input value VINa is compared with the determination value of 9 (i.e., 10−1(=2/2)), and the signal Db0 is set to −1 based on the determination signal Ka, which indicates the comparison result. The bits (Db4 to Db0) of the digital signal Db are set in this manner. The digital signal DOa is calculated through the following equation.

$$DOa=10+4*(-1)+2.5*(+1)+1.5*(+1)+1*(-1)+0.5*(-1)=8.5$$

A case in which a determination error occurs will now be described.

Figure 29:
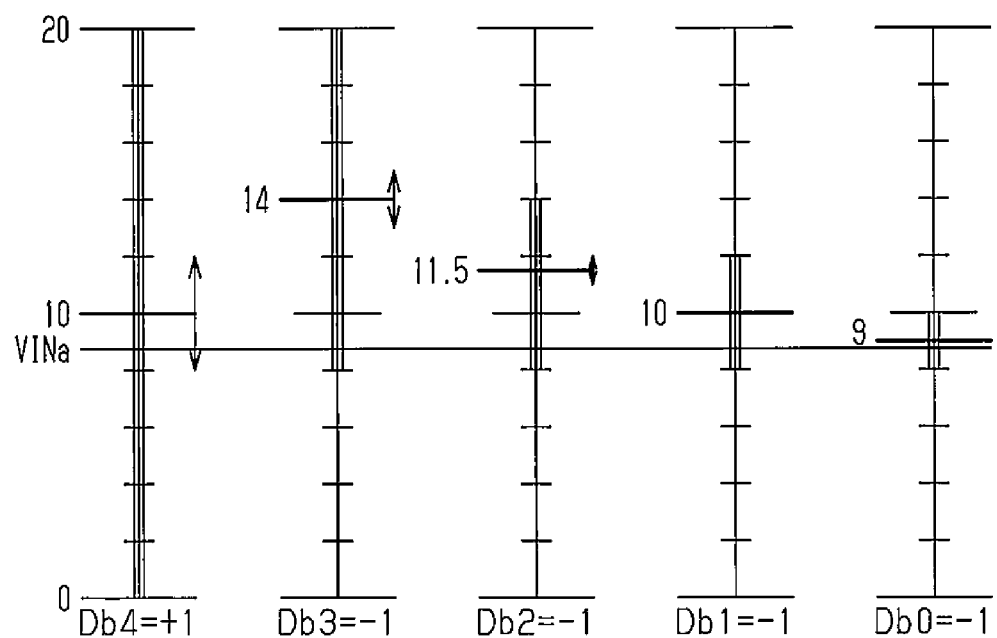

Referring to FIG. 29, for example, when a determination error occurs in the first determination, the signal Db4 is set to +1 due to the determination error. In the next determination, the analog input signal VINa is compared with the determination value of 14 (i.e., 10+4(=8/2)), and the signal Db3 is set to −1 based on the determination signal Ka, which indicates the comparison result. Then, the analog input value VINa is compared with the determination value of 11.5 (i.e., 14−2.5(=5/2)), and the signal Db2 is set to −1 based on the determination signal Ka, which indicates the comparison result. Then, the analog input value VINa is compared with the determination value of 10 (i.e., 11.5−1.5(=3/2)), and the signal Db1 is set to −1 based on the determination signal Ka, which indicates the comparison result. Further, the analog input value VINa is compared with the determination value of 9 (i.e., 10−1(=2/2)), and the signal Db0 is set to −1 based on the determination signal Ka, which indicates the comparison result. The bits (Db4 to Db0) of the digital signal Db are set in this manner. The digital signal DOa is calculated through the following equation.

DOa=10+4*(+1)+2.5*(−1)+1.5*(−1)+1*(−1)+0.5*(−1)=8.5

The value of the digital signal DOa is equivalent to the result of FIG. 28. That is, the error in the first determination determining that the voltage of the analog input signal VINa is smaller than the determination value is corrected in a subsequent determination process.

The operation of an A/D conversion circuit that does not use the middle voltage VRC will now be described as a comparative example. For example, the A/D conversion circuit 70 illustrated in FIG. 1 is used. In the description hereafter, the design values of the capacitors are used.

Figure 30:
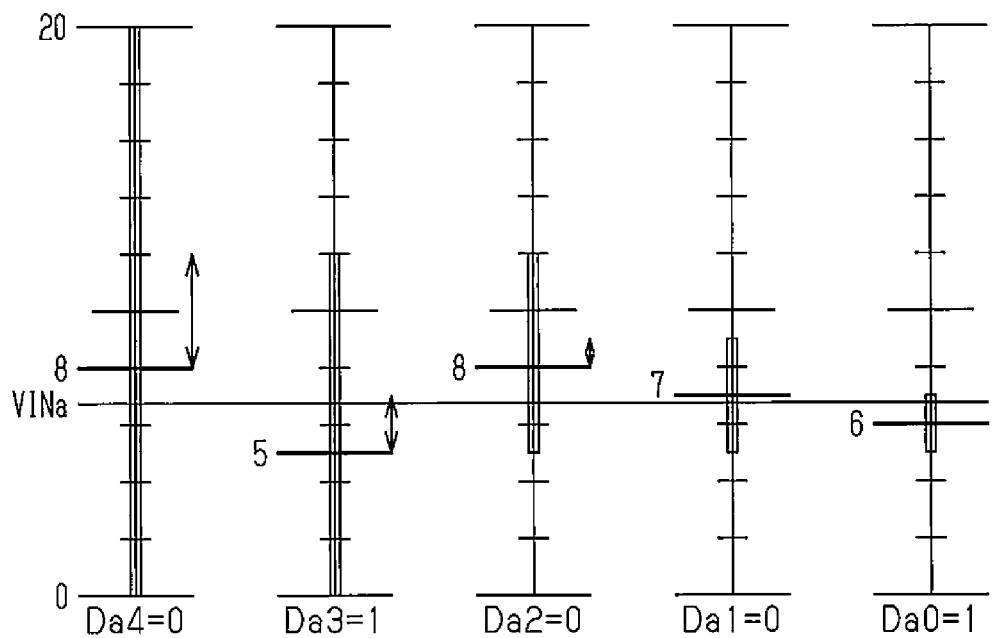
FIGS. 30 and 31 are diagrams illustrating the operation of an A/D conversion circuit in a comparative example with respect to the configuration of the third embodiment.

A case in which there is no determination error will now be described. In FIG. 30, the value of the input signal VINa is 6.75.

First, the analog input signal VINa is compared with the determination value of 8, and the signal Da4 is set to 0 based on the determination signal Ka, which indicates the comparison result. Then, the analog input signal VINa is compared with the determination value of 5, and the signal Da3 is set to 1 based on the determination signal Ka, which indicates the comparison result. Then, the analog input signal VINa is compared with the determination value of 8 (i.e., 5+3), and the signal Da2 is set to 0 based on the determination signal Ka, which indicates the comparison result. Then, the analog input signal VINa is compared with the determination value of 7 (i.e., 5+2), and the signal Da1 is set to 0 based on the determination signal Ka, which indicates the comparison result. Further, the analog input signal VINa is compared with the determination value of 6 (i.e., 5+1), and the signal Da0 is set to 1 based on the determination signal Ka, which indicates the comparison result. Accordingly, the digital signal DOa is calculated through the following equation.

DOa=8*0+5*1+3*0+2*0+1=6

A case in which a determination error occurs will now be described.

Figure 31:
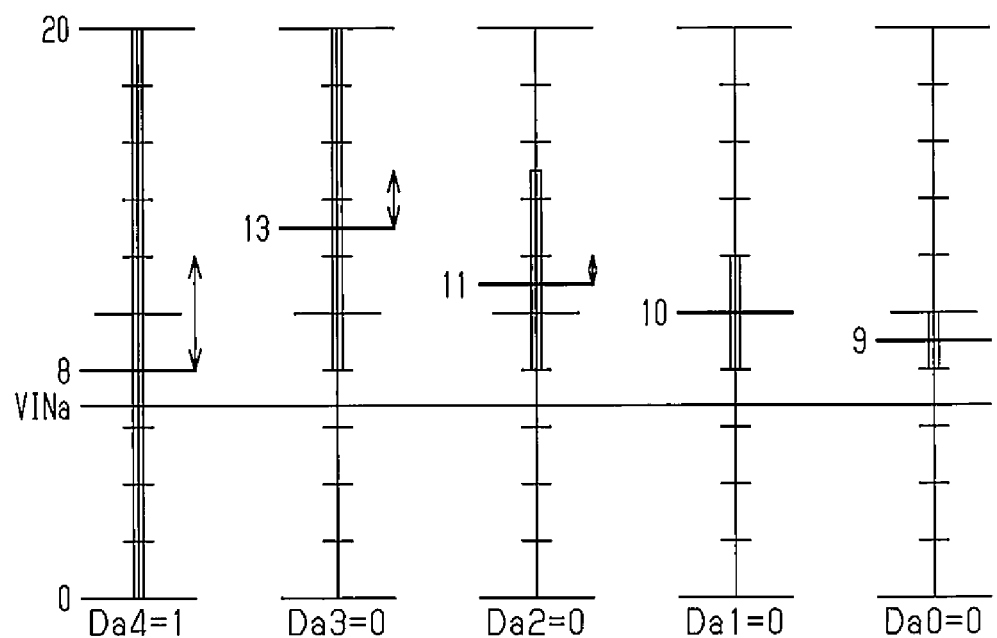

For example, as illustrated in FIG. 31, when a determination error occurs in the first determination, the signal Da4 is set to 1 due to the determination error. In the next determination, the determination value is set to 13 (i.e., 8+5). Further, the analog input signal VINa is compared with the determination value of 13, and the signal Da3 is set to 0 based on the determination signal Ka, which indicates the comparison result. Then, the analog input value VINa is compared with the determination value of 11 (i.e., 8+3), and the signal Da2 is set to 0 based on the determination signal Ka, which indicates the comparison result. Then, the analog input value VINa is compared with the determination value of 10 (i.e., 8+2), and the signal Da1 is set to 0 based on the determination signal Ka, which indicates the comparison result. Further, the analog input value VINa is compared with the determination value of 9 (i.e., 8+1), and the signal Da0 is set to 0 based on the determination signal Ka, which indicates the comparison result. The digital signal DOa is calculated through the following equation.

DOa=8*1+5*0+3*0+2*0+0=8

In this manner, an A/D conversion circuit that does not use the middle voltage VRC cannot correct a determination error that occurs when determining that the voltage of the analog input signal VINa is smaller than the determination value.

The third embodiment has the advantages described below.

(3-1) In the same manner as the first and second embodiments, the digital signal Db, which is converted from the analog input signal VIN, is corrected with the capacitances Wa4 to Wa1 of the main capacitors CA4 to CA2 measured by the measurement control circuit 74 to generate the digital output signal DOUT. Accordingly, the A/D conversion time may be shortened.

(3-2) The main capacitors CA4 to CA0 are supplied with the middle voltage VRC, and the bit value of the digital signal Db is determined based on the output voltage Vo at the common signal line LC. The first reference voltage VRP or the second reference voltage VRM is supplied to the main capacitors CA4 to CA0 based on the determination result of the bit value to determine the next bit value. For example, in the first determination, the median value of the code width of the digital signal Db corresponding to the main capacitors CA4 to CA0 and the measurement capacitors CM2 to CM0 is used as a determination value to determine the voltage of the analog input signal VIN based on the determination value. Based on the first determination result, the next determination value is determined by adding or subtracting one-half of the charge stored in the lower order side main capacitors to or from the determination value. Accordingly, the A/D conversion circuit sets the redundant range based on the determination value. This allows for correction of a determination error when determining a lower order bit and allows for a high conversion accuracy to be obtained.

[Fourth Embodiment]

A fourth embodiment will now be described. Same reference numerals are given to those components that are the same or similar in the above embodiments. Such components will not be described in detail.

Figure 32:
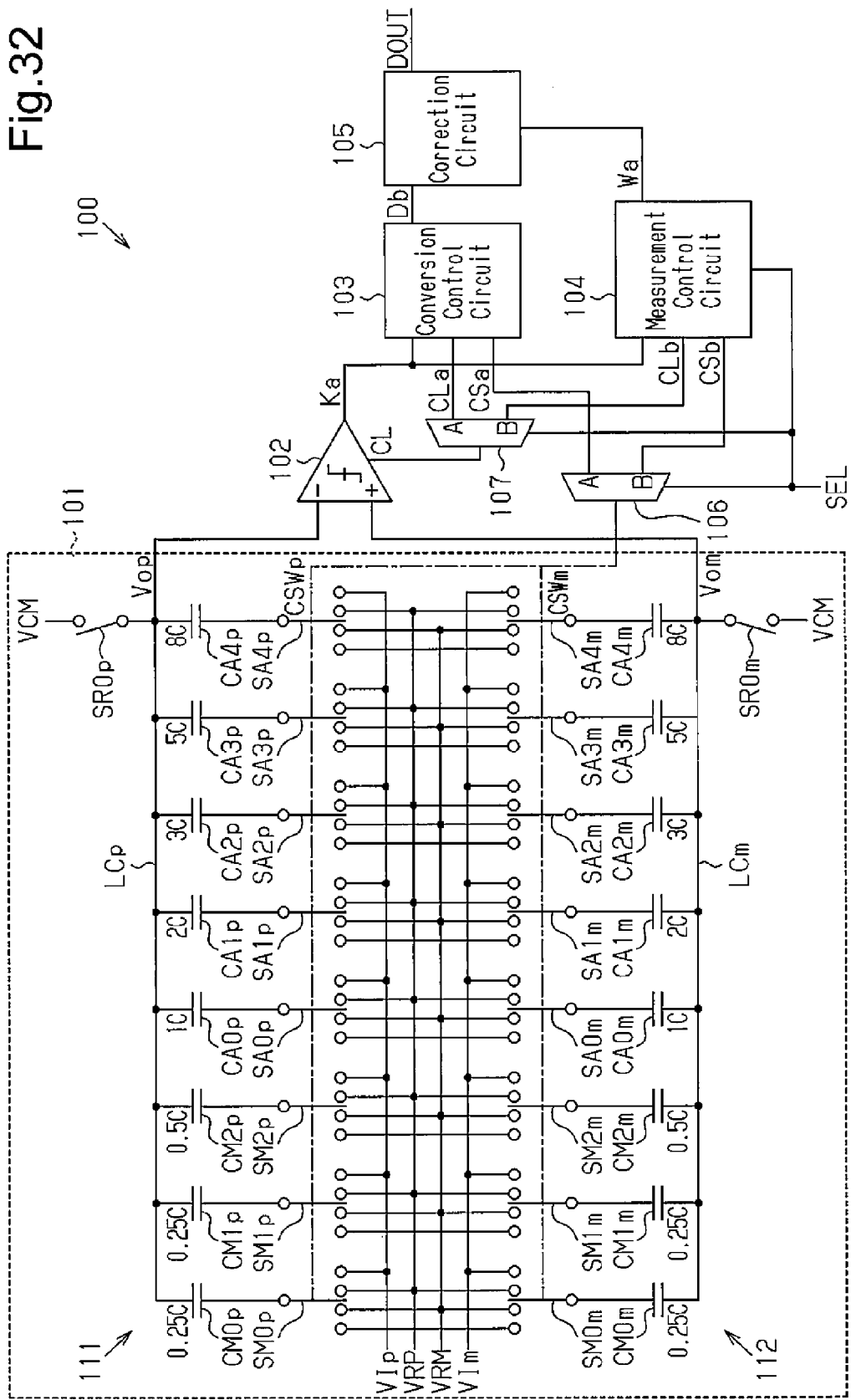
FIG. 32 is a schematic circuit diagram illustrating a fourth embodiment of an A/D conversion circuit.

Referring to FIG. 32, a successive approximation type A/D conversion circuit 100, which is a full differential of the A/D conversion circuit 70 of the third embodiment, converts a differential analog input signal VIN (VIp−VIm) to a digital output signal DOUT having a plurality of bits (e.g., four bits).

The A/D conversion circuit 100 includes a D/A converter 101, a comparator 102, a conversion control circuit 103, a measurement control circuit 104, a correction circuit 105, and selection circuits 106 and 107.

The D/A converter 101 generates differential output voltages Vop and Vom based on the analog input signals VIp and VIm supplied as the differential analog input signal VIN, the first reference voltage VRP, the second reference voltage VRM, the common voltage VCM, and the control signal CSW. In the fourth embodiment, the common voltage VCM is an arbitrary voltage.

The D/A converter 101 is a charge redistribution type CDAC. The D/A converter 101 includes a first conversion unit 111 and a second conversion unit 112.

The first conversion unit 111 includes main capacitors CA4$p$, CA3$p$, CA2$p$, CA1$p$, and CA0$p$ that are weighted in a predetermined ratio, for example, 8:5:3:2:1, in the same manner as the first embodiment. In FIG. 32, the capacitances of the main capacitors CA4$p$ to CA0$p$ are respectively expressed as 8C, 5C, 3C, 2C, and 1C. Here, C represents capacitance. The main capacitors CA4$p$ to CA0$p$ each include a first terminal coupled to a common signal line LC$p$. The common signal line LC$p$ is coupled to a first terminal of the first reset switch SR0$p$, and a second terminal of the first reset switch SR0$p$ is supplied with the common voltage VCM.

Second terminals of the main capacitors CA4p, CA3p, CA2p, CA1p, and CA0p are respectively coupled to main switches SA4p, SA3p, SA2p, SA1p, and SA0p. The main switch SA4p includes a common terminal coupled to the main capacitor CA4p, a terminal provided with the analog input signal VIp, a terminal supplied with the first reference voltage VRP, and a terminal supplied with the second reference voltage VRM. In response to a control signal CSWp, the main switch SA4p selectively supplies one of the analog input signal VIp, the first reference voltage VRP, and the second reference voltage VRM to the main capacitor CA4p.

In the same manner, in response to the control signal CSWp, the main switches SA3p to SA0p selectively supply one of the analog input signal VIp, the first reference voltage VRP, and the second reference voltage VRM to the main capacitors CA3p to CA0p. The control signal CSWp includes control signals for respectively controlling the main switches SA4p to SA0p and the reset switch SR0p.

The second conversion unit 112 includes main capacitors CA4m, CA3m, CA2m, CA1m, and CA0m that are weighted in a predetermined ratio, for example, 8:5:3:2:1, in the same manner as the first conversion unit 111. In FIG. 32, the capacitances of the main capacitors CA4m to CA0m are respectively expressed as 8C, 5C, 3C, 2C, and 1C. Here, C represents capacitance. The main capacitors CA4m to CA0m each include a first terminal coupled to a common signal line LCm. The common signal line LCm is coupled to a first terminal of a second reset switch SR0m, and a second terminal of the second reset switch SR0m is supplied with the common voltage VCM.

Second terminals of the main capacitors CA4m, CA3m, CA2m, CA1m, and CA0m are respectively coupled to main switches SA4m, SA3m, SA2m, SA1m, and SA0m. In response to a control signal CSWm, the main switch SA4m selectively supplies one of an analog input signal VIm, the first reference voltage VRP, and the second reference voltage VRM to the main capacitor CA4m. In the same manner, in response to the control signal CSWm, the main switches SA3m to SA0m selectively supply one of the analog input signal VIm, the first reference voltage VRP, and the second reference voltage VRM to the main capacitors CA3m to CA0m. The control signal CSWm includes control signals for respectively controlling the main switches SA4m to SA0m and the reset switch SR0m.

Further, the main switch SA4p of the first conversion unit 111 is coupled to the main switch SA4m of the second conversion unit 112. In response to the control signals CSWp and CSWm, the main switches SA4p and SA4m couple the main capacitor CA4p of the first conversion unit 111 and the main capacitor CA4m of the second conversion unit 112 to each other. In the same manner, the main switches SA3p to SA0p of the first conversion unit 111 are coupled to the main switches SA3m to SA0m of the second conversion unit 112 to couple the main capacitors CA3p to CA0p of the first conversion unit 111 and the main capacitors CA3m to CA0m of the second conversion unit 112.

The first conversion unit 111 also includes measurement capacitors CM2p, CM1p, and CM0p used to measure the capacitances of the main capacitors CA4p to CA2p, which are subject to measurement. The capacitances of the measurement capacitors CM2p to CM0p are weighted in a predetermined ratio, for example, 0.5:0.25:0.25 based on the capacitance of the main capacitor CA0p, which corresponds to the least significant bit. In FIG. 32, the capacitances of the measurement capacitors CM2p, CM1p, and CM0p are respectively expressed as 0.5C, 0.25C, and 0.25C. Here, C represents capacitance. First terminals of the measurement capacitors CM2p to CM0p are coupled to the common signal line LCp.

Second terminals of the measurement capacitors CM2p, CM1p, and CM0p are respectively coupled to the measurement switches SM2p, SM1p, and SM0p. In response to the control signal CSWp, the measurement switches SM2p to SM0p selectively supply one of the analog input signal VIp, the first reference voltage VRP, and the second reference voltage VRM to the measurement capacitors CM2p to CM0p. The control signal CSWp includes control signals for respectively controlling the measurement switches SM2p to SM0p.

In the same manner, the second conversion unit 112 includes measurement capacitors CM2m, CM1m, and CM0m used to measure the capacitances of the main capacitors CA4m to CA2m, which are subject to measurement. The capacitances of the measurement capacitors CM2m to CM0m are weighted in a predetermined ratio, for example, 0.5:0.25:0.25 based on the capacitance of the main capacitor CA0m, which corresponds to the least significant bit. In FIG. 32, the capacitances of the measurement capacitors CM2m, CM1m, and CM0m are respectively expressed as 0.5C, 0.25C, and 0.25C. Here, C represents capacitance. First terminals of the measurement capacitors CM2m to CM0m are coupled to the common signal line LCm.

Second terminals of the measurement capacitors CM2m, CM1m, and CM0m are respectively coupled to the measurement switches SM2m, SM1m and SM0m. In response to the control signal CSWm, the measurement switches SM2m to SM0m selectively supply one of the analog input signal VIm, the first reference voltage VRP, and the second reference voltage VRM to the measurement capacitors CM2m to CM0m. The control signal CSWm includes control signals for respectively controlling the measurement switches SM2m to SM0m.

Further, the measurement switch SM2p of the first conversion unit 111 is coupled to the measurement switch SM2m of the second conversion unit 112. In response to the control signals CSWp and CSWm, the measurement switches SM2p and SM2m couple the measurement capacitor CM2p of the first conversion unit 111 and the measurement capacitor CM2m of the second conversion unit 112 to each other. In the same manner, the measurement switches SM1p and SM0p of the first conversion unit 111 are coupled to the measurement switches SM1m and SA0m of the second conversion unit 112 to couple the measurement capacitors CM1p and CM0p of the first conversion unit 111 and the measurement capacitors CM1m and CM0m of the second conversion unit 112.

Each switch is not restricted to the configuration illustrated in FIG. 32. For example, the main switch SA4p may have any configuration as long as it is able to selectively supply one of the analog input signal VIp, the first reference voltage VRP, and the second reference voltage VRM to the main capacitor CA4p or as long as it is able to couple the main capacitor CA4p to the main capacitor CA4m. For example, the main switch SA4p may be configured by four switches coupled to the main capacitor CA4p. The same applies to the other switches SA3p to SA0p, SM2p to SM0p, SA4m to SA0m, and SM2m to SM0m.

The common signal line LCp of the first conversion unit 111 is coupled to an inverting input terminal of the comparator 102. The common signal line LCm of the second conversion unit 112 is coupled to a non-inverting input terminal of the comparator 102. The first conversion unit 111 generates the output voltage Vop at the common signal line LCp based on the analog input signal VIp. The second conversion unit 112 generates the output voltage Vom at the common signal line LCm based on the analog input signal VIm. The comparator 102 compares the output voltages Vop and Vom output from the D/A converter 101 and generates the determination signal Ka in accordance with the comparison result. The determination signal Ka is provided to the conversion control circuit 103 and the measurement control circuit 104.

The conversion control circuit 103 generates a latch signal CLa, a conversion control signal CSa, and a digital signal Db based on the determination signal Ka. For example, the conversion control circuit 103 includes a register that successively holds the value of the determination signal Ka and a logic circuit that generates the digital signal Db and the conversion control signal CSa. The conversion control circuit 103 outputs the digital signal Db in accordance with the value of the determination signal Ka held by the register. The digital signal Db includes five bit signals corresponding to the main capacitors CA4p to CA0p and CA4m to CA0m of the D/A converter 101.

Based on the determination signal Ka, the measurement control circuit 104 generates a latch signal CLb, a measurement control signal CSb, and a capacitance signal Wa. For example, the measurement control circuit 104 includes a logic circuit that generates the measurement control signal CSb based on the determination signal Ka and a register that holds the value of the measurement control signal CSb. In the fourth embodiment, the measurement control circuit 104 changes the value of the measurement control signal CSb to sequentially measure capacitances of the main capacitors CA4p to CA2p and CA4m to CA2m and store the value of the measurement control signal CSb whenever measuring each capacitance. Further, the measurement control circuit 104 outputs the capacitance signal Wa including the capacitance of one of the main capacitors CA4p to CA2p and CA4m to CA2m.

The measurement control circuit 104 measures the capacitances of the main capacitors CA2p and CA2m using the main capacitors CA1p, CA0p, CA1m, and CA0m and the measurement capacitors CM2p to CM0p and CM2m to CM0m. Further, the measurement control circuit 104 measures the capacitances of the main capacitors CA3p and CA3m using the main capacitors CA2p to CA0p and CA2m to CA0m and the measurement capacitors CM2p to CM0p and CM2m to CM0m. The measurement control circuit 104 also measures the capacitances of the main capacitors CA4p and CA4m using the main capacitors CA3p to CA0p and CA3m to CA0m and the measurement capacitors CM2p to CM0p and CM2m to CM0m.

The selection circuit 106 is provided with the conversion control signal CSa from the conversion control circuit 103 and the measurement control signal CSb from the measurement control circuit 104. The selection circuit 106 is also provided with a selection signal SEL. The selection circuit 106 selects the conversion control signal CSa when the selection signal SEL has the first level and outputs the conversion control signal CSa as the control signal CSW. The selection circuit 106 selects the measurement control signal CSb when the selection signal SEL has the second level and outputs the measurement control signal CSb as the control signal CSW. The control signal CSW includes a control signal CSWp that controls the switches SA4p to SA0p and SM2p to SM0p of the first conversion unit 111 and a control signal CSWm that controls the switches SA4m to SA0m and SM2m to SM0m of the second conversion unit 112. Although not illustrated in the drawings, the conversion control signal CSa and the measurement control signal CSb each include control signals that respectively control the switches SA4p to SA0p and SM2p to SM0p of the first conversion unit 111 and control signals that respectively control the switches SA4m to SA0m and SM2m to SM0m of the second conversion unit 112.

In the same manner, the selection circuit 107 is provided with the latch signal CLa from the conversion control circuit 103, the latch signal CLb from the measurement control circuit 104, and the selection signal SEL. When the selection signal SEL has a first level, the selection circuit 107 selects the latch signal CLa and outputs the latch signal CLa as a latch signal CL. When the selection signal SEL has a second level, the selection circuit 107 selects the latch signal CLb and outputs the latch signal CLb as the latch signal CL. Accordingly, during the A/D conversion process, the conversion control circuit 103 controls the D/A converter 101 and the comparator 102. During the capacitance measurement process, the measurement control circuit 104 controls the D/A converter 101 and the comparator 102.

The correction circuit 105 corrects the digital signal Db, which is output from the conversion control circuit 103, based on the capacitance signal Wa, which is output from the measurement control circuit 104, to generate the digital output signal DOUT. The correction circuit 105 calculates the voltage of the analog input signal VIN based on the digital signal Db and the capacitance signal Wa. The correction circuit 105 converts the voltage of the analog input signal VIN to the four-bit digital output signal DOUT. Then, the correction circuit 105 outputs the digital output signal DOUT.

The correction circuit 105 stores the capacitances of those other than the main capacitors CA4p to CA2p and CA4m to CA2m subject to measurement, namely, the main capacitors CA1p, CA0p, CA1m, and CA0m. The correction circuit 105 calculates the voltage of the analog input signal VIN based on each bit value of the digital signal Db, the capacitances (capacitance signal Wa) of the main capacitors CA4p to CA2p and CA4m to CA2m, and the pre-stored capacitances of the main capacitors CA1p, CA0p, CA1m, and CA0m. In other words, instead of the design values of the main capacitors CA4p to CA2p and CA4m to CA2m, the correction circuit 105 uses the capacitances (capacitance signal Wa) of the main capacitors CA4p to CA2p and CA4m to CA2m to correct the voltage of the analog input signal VIN. The resolution of the A/D conversion circuit 100 is set by the capacitances of the main capacitors CA4p to CA0p and CA4m to CA0m of the D/A converter 101 for the input range of the analog input signal VIN that corresponds to the potential difference of the first reference voltage VRP and the second reference voltage VRM. The correction circuit 105 converts the voltage of the analog input signal VIN to the four-bit digital output signal DOUT. Then, the correction circuit 105 outputs the digital output signal DOUT.

The operation of the A/D conversion circuit 100 will now be described. FIGS. 33A to 34C illustrate the main capacitors CA4p to CA0p and CA4m to CA0m, the measurement capacitors CM2p to CM0p and CM2m to CM0m, and the comparator 102 but do not illustrate the other components.

Figure 33A:
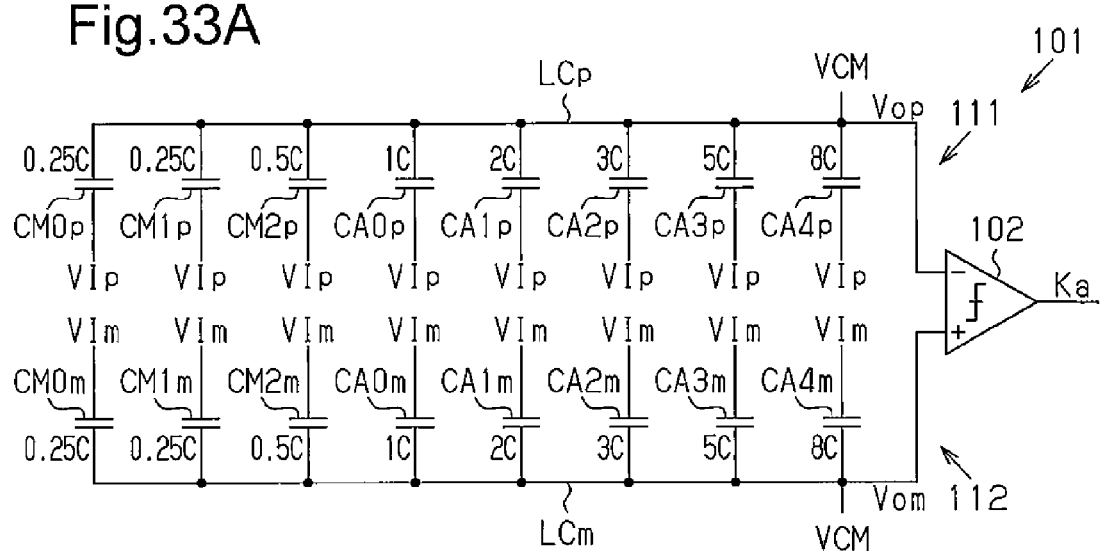
FIGS. 33A to 33C and 34A to 34C are schematic circuit diagrams illustrating an A/D conversion process performed by the A/D conversion circuit of FIG. 32.

Referring to FIG. 33A, the D/A converter 111 first samples the analog input signals VIp and VIm. In the first conversion unit 111, the second terminals of the main capacitors CA4p to CA0p and the measurement capacitors CM2p to CM0p are provided with the analog input signal VIp, and the common signal line LCp is supplied with the common voltage VCM. Likewise, in the second conversion unit 112, the second terminals of the main capacitors CA4m to CA0m and the measurement capacitors CM2m to CM0m are provided with the analog input signal VIm, and the common signal line LCm is supplied with the common voltage VCM.

Figure 33B:
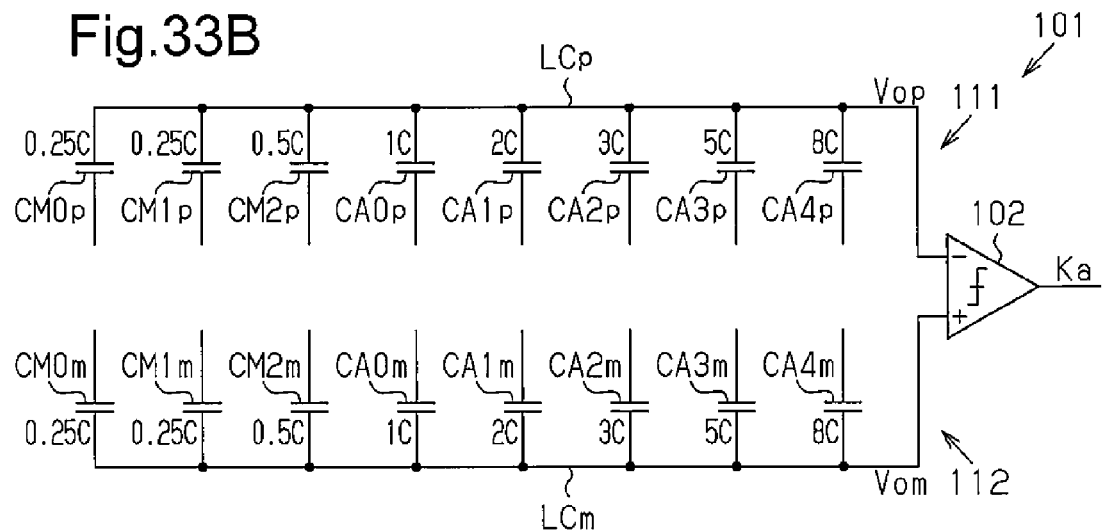

Then, referring to FIG. 33B, the switches SA4p to SA0p, SM2p to SM0p, and SR0p of the first conversion unit 111 and the switches SA4m to SA0m, SM2m to SM0m, and SR0m of the second conversion unit 112 (refer to FIG. 32) are deactivated to hold charge.

Here, the output voltages Vop and Vom are calculated through the following equations.

$$Vop = -(VR/CAL)*(VIpa-(8*D4p+5*D3p+3*D2p+2*D1p+1*D0p+0.5*DM2p+0.25*DM1p+0.25*DM0p))+VCM \quad (5)$$

$$Vom = -(VR/CAL)*(VIma-(8*D4m+5*D3m+3*D2m+2*D1m+1*D0m+0.5*DM2m+0.25*DM1m+0.25*DM0m))+VCM \quad (6)$$

where
VR=VRP−VRM
VIpa=CAL*(VIp−VRM)/VR
VIma=CAL*(VIm−VRM)/VR
CAL=8+5+3+2+1+0.5+0.25+0.25=20
D4p=(CA4p−VRM)/VR
D3p=(CA3p−VRM)/VR
D2p=(CA2p−VRM)/VR
D1p=(CA1p−VRM)/VR
D0p=(CA0p−VRM)/VR
DM2p=(CM2p−VRM)/VR
DM1p=(CM1p−VRM)/VR
DM0p=(CM0p−VRM)/VR
D4m=(CA4m−VRM)/VR
D3m=(CA3m−VRM)/VR
D2m=(CA2m−VRM)/VR
D1m=(CA1m−VRM)/VR
D0m=(CA0m−VRM)/VR
DM2m=(CM2m−VRM)/VR
DM1m=(CM1m−VRM)/VR
DM0m=(CM0m−VRM)/VR The comparator 102 illustrated in FIG. 32 compares the differential output voltages Vop and Vom. Accordingly, the following equation is obtained from equations (5) and (6).

$$Vop-Vom = -(VR/CAL)*(VIpa-VIma-(8*Db4+5*Db3+3*Db2+2*Db1+1*Db0+0.5*DMb2+0.25*DMb1+0.25*DMb0))$$

Db4=(CA4p−CA4m)/VR
Db3=(CA3p−CA3m)/VR
Db2=(CA2p−CA2m)/VR
Db1=(CA1p−CA1m)/VR
Db0=(CA0p−CA0m)/VR
DMb2=(CM2p−CM2m)/VR
DMb1=(CM1p−CM1m)/VR
DMb0=(CM0p−CM0m)/VR

Here, VINa represents the analog input signal VIN in voltage corresponding to 1 LSB. Further, VIpa and VIma are values respectively representing the analog input signals VIpa and VIma in voltages corresponding to 1 LSB. Accordingly, the following equation is derived from the above equation.

$$Vop-Vom = -(2*VR/CAL)*(VINa-(10+4*Db4+2.5*Db3+1.5*Db2+1*Db1+0.5*Db0+0.25*DMb2+0.125*DMb1+0.125*DMb0)) \quad (7)$$

$$VINa = (VIpa-VIma+20)/2 = (CAL*(VIp-VIm)+20)/(2*VR) = (CAL*VIN+20)/(2*VR)$$

The ranges of the convertible analog input signals VIp and VIm are expressed by the following expressions.

$$VRM \le VIp \le VRP$$

VRM≤VIm≤VRP, whereby the range of the analog input signal VINa is represented by 0≤VINa≤20.

Figure 33C:
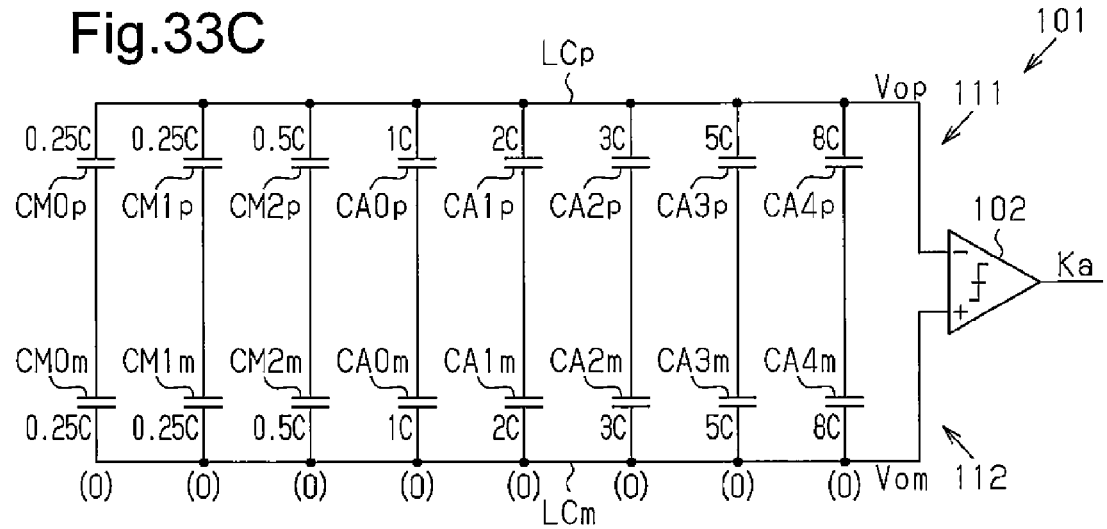

As illustrated in FIG. 33C, in the first and second conversion units 111 and 112, two capacitors that are in a differential relationship are coupled to each other. For example, the second terminal of the main capacitor CA4p and the second terminal of the main capacitor CA4m are coupled to each other. In FIG. 33C, the numerals in parentheses (0) indicate the control signals CSWp and CSWm provided to the main switches SA4p to SA0p and SA4m to SA0m and the measurement switches SM2p to SM0p and SM2m to SM0m illustrated in FIG. 32. This equalizes the voltages at the second terminals of the main capacitors CA4p and CA4m. The comparator 102 compares the output voltage Vop at the common signal line LCp with the output voltage Vom of the common signal line LCm to output the determination signal Ka, which indicates the comparison result.

The voltage at the second terminals of the capacitors CA4p to CA0p and CM2p to CM0p of the first conversion unit 111 is equal to the voltage at the second terminals of the capacitors CA4m to CA0m and CM2m to CM0m of the second conversion unit 112. Thus, equation (7) is expressed by the following equation.

$$Vop-Vom = -(2*VR/CAL)*(VINa-10)$$

The MSB (Db4) of the digital signal Db has a value (−1 or +1) that is determined in accordance with the level (high or low) of the determination signal Ka. For example, when the signal Db4 is −1, the main capacitor CA4p is supplied with the first reference voltage VRP, and the main capacitor CA4m is supplied with the second reference voltage VRM. In this case, equation (7) is expressed by the following equation.

Figure 34A:
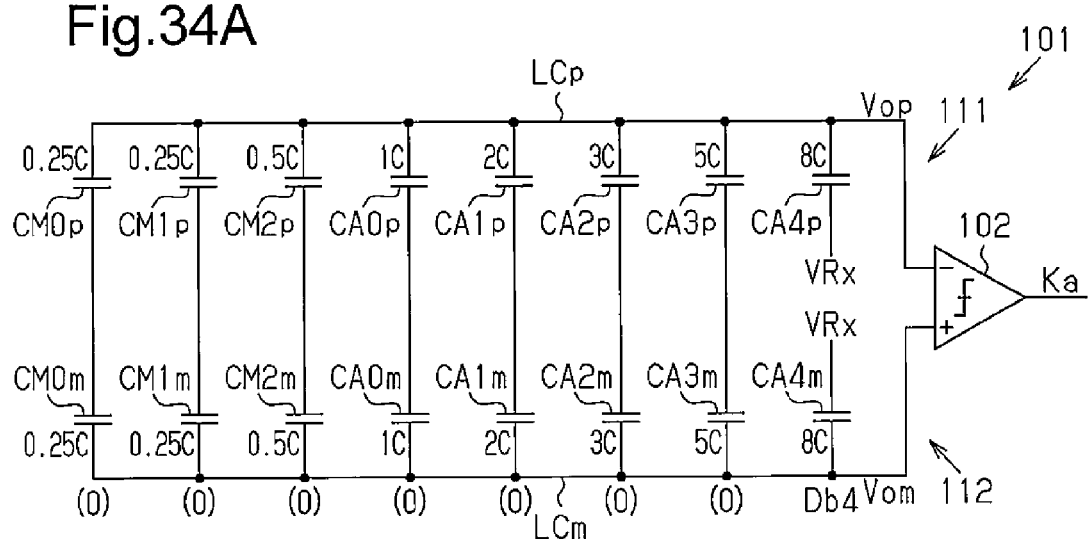

Then, referring to FIG. 34A, based on the signal Db4 (−1 or +1), the main capacitors CA4p and CA4m are supplied with the reference voltage VRx (first reference voltage VRP or second reference voltage VRM) in a complementary manner. For example, when the signal DB4 is −1, the main capacitor CA4p is supplied with the first reference voltage VRP and the main capacitor CA4m is supplied with the second reference voltage VRM. In this case, equation (7) is expressed by the following equation.

$$Vop-Vom = -(2*VR/CAL)*(VINa-(10+4))$$

When the signal Db4 is +1, the main capacitor CA4p is supplied with the second reference voltage VRM, and the main capacitor CA4m is supplied with the first reference voltage VRP. In this case, equation (7) is expressed by the following equation.

$$Vop-Vom = -(2*VR/CAL)*(VINa-(10-4))$$

In this manner, the output voltages Vop and Vom are changed in accordance with the reference voltages VRP and VRM supplied to the main capacitors CA4p and CA4m. The comparator 102 compares the output voltages Vop and Vom to generate the determination signal Ka and then determines the value of the signal Db3 in accordance with the level of the determination signal Ka.

Figure 34B:
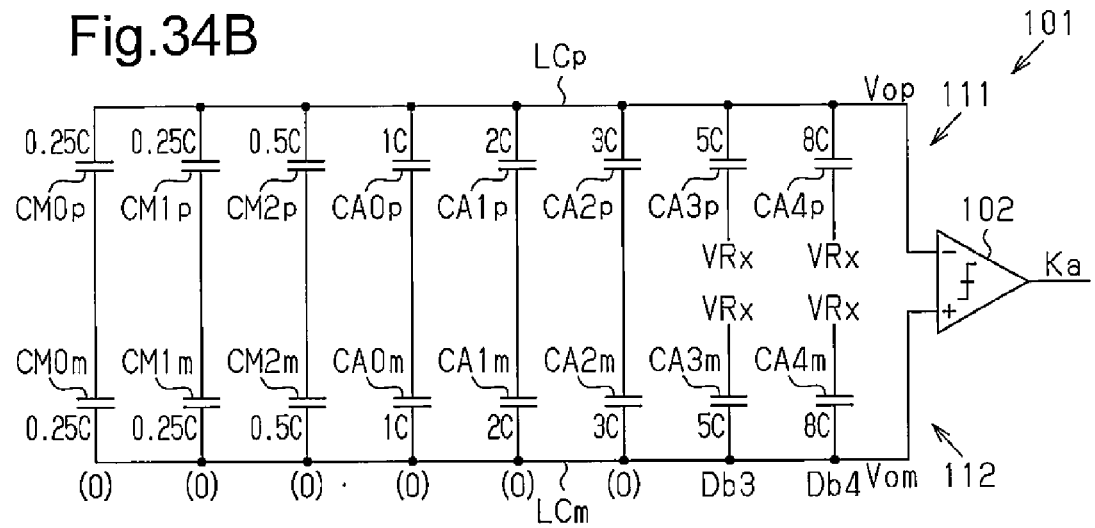

Then, referring to FIG. 34B, based on the signal Db3 (−1 or +1), the main capacitors CA3p and CA3m are supplied with the reference voltages VRx (first reference voltage VRP or second reference voltage VRM) in a complementary manner. This changes the output voltages Vop and Vom in accordance with the reference voltages VRP and VRM supplied to the main capacitors CA3p and CA3m. The comparator 102 compares the output voltages Vop and Vom to generate the determination signal Ka and then determines the value of the signal Db2 in accordance with the level of the determination signal Ka.

Figure 34C:
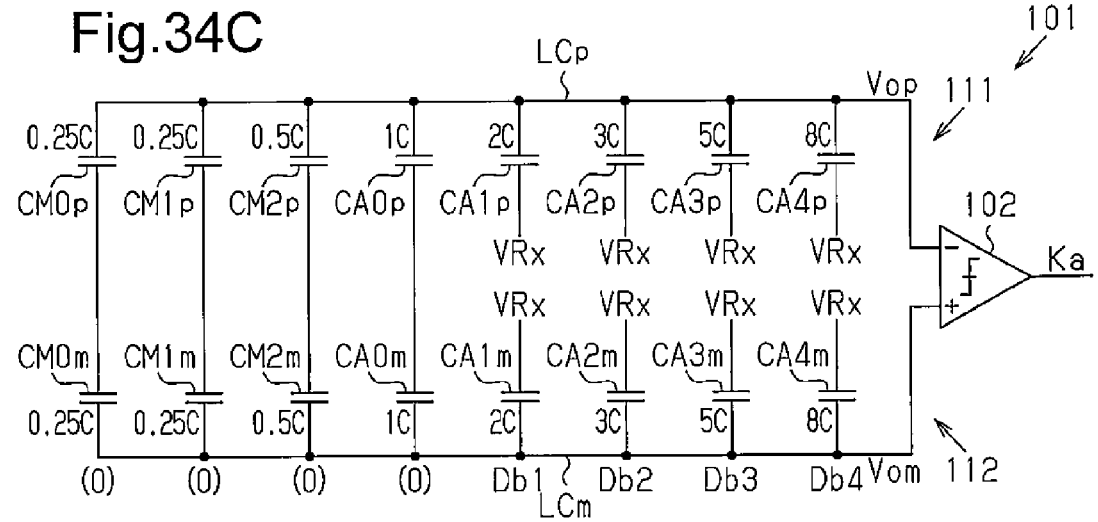

Then, referring to FIG. 34C, based on the signal Db2, the main capacitors CA2p and CA2m are supplied with the reference voltages VRx (first reference voltage VRP or second reference voltage VRM) in a complementary manner. This changes the output voltages Vop and Vom in accordance with the reference voltages VRP and VRM supplied to the main capacitors CA4p to CA1p and CA4m to CA1m. The comparator 102 compares the output voltages Vop and Vom to generate the determination signal Ka and then determines the value of the signal Db0 in accordance with the level of the determination signal Ka.

Through the above processes, the conversion control circuit 103 illustrated in FIG. 32 outputs the digital signal Db that includes the signals Db4 to Db0.

The fourth embodiment has the advantages described below.

(4-1) In the same manner as the first to third embodiments, the digital signal Db, which is converted from the analog input signals VIp and VIm, is corrected with the capacitances of the main capacitors CA4p to CA2p and CA4m to CM2m to generate the digital output signal DOUT. This shortens the A/D conversion time.

(4-2) The A/D conversion circuit 100 converts the analog input signals VIp and VIm to the digital output signal DOUT. In the same manner as the third embodiment, the A/D conversion circuit 100 sets the redundant range about the determination value. Accordingly, a determination error is corrected when determining a lower order bit, and high conversion accuracy is obtained.

(4-3) The A/D conversion circuit 100 is of a fully differential type. Thus, the differential voltage of the output voltages Vop and Vom of the D/A conversion circuit 101 is not affected by in-phase noise. This reduces erroneous determinations caused by in-phase noise.

[Fifth Embodiment]

A fifth embodiment will now be described. Same reference numerals are given to those components that are the same or similar in the above embodiments. Such components will not be described in detail.

Figure 35:
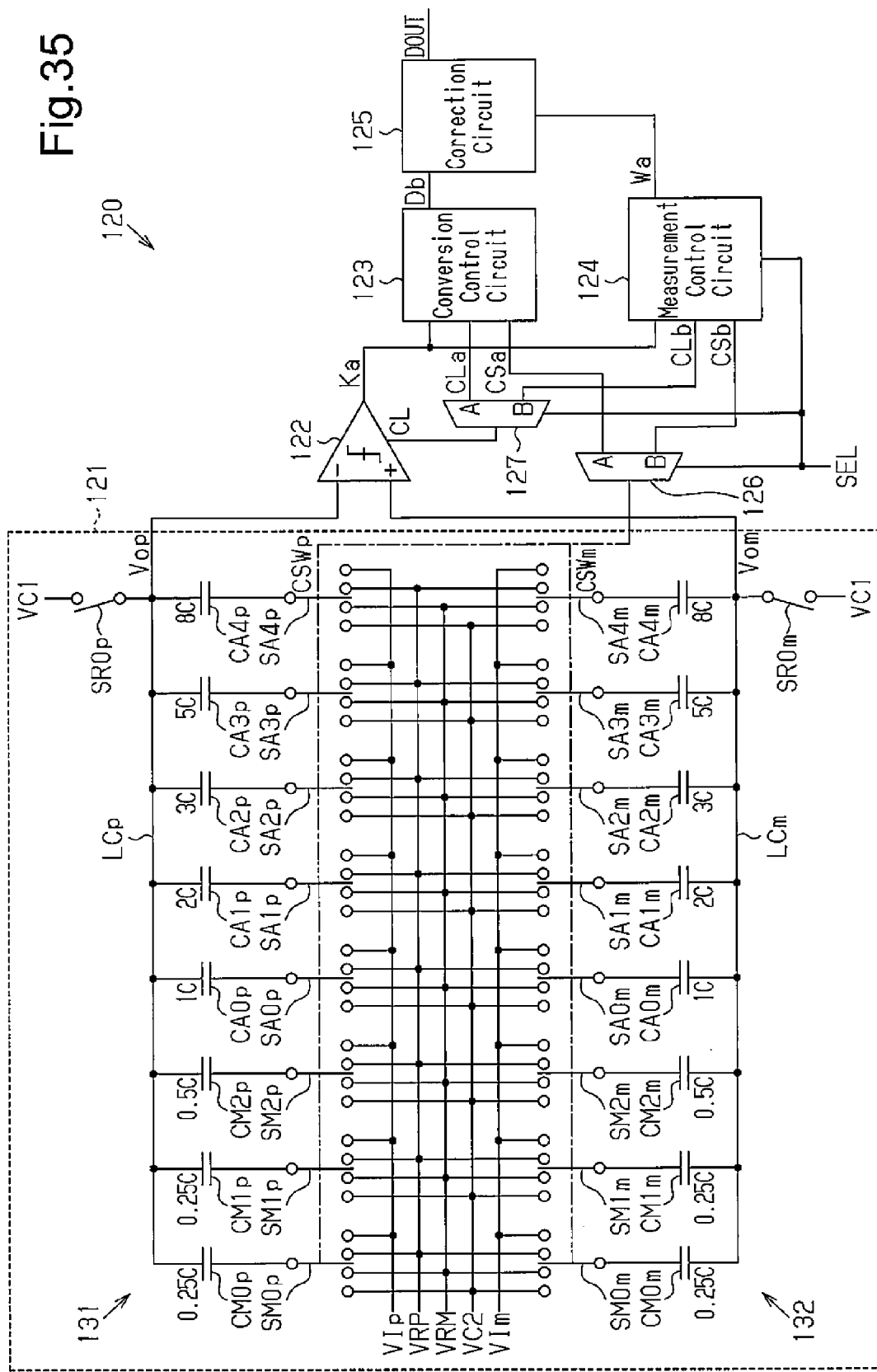
FIG. 35 is a schematic circuit diagram illustrating a fifth embodiment of an A/D conversion circuit.

Referring to FIG. 35, a successive approximation type A/D conversion circuit 120, which is a full differential of the A/D conversion circuit 70 of the third embodiment, converts a differential analog input signal VIN (i.e., VIp−Vim) to a digital output signal DOUT having a plurality of bits (e.g., four bits).

The A/D conversion circuit 120 includes a D/A converter 121, a comparator 122, a conversion control circuit 123, a measurement control circuit 124, a correction circuit 125, and selection circuits 126 and 127.

The D/A converter 121 generates output voltages Vop and Vom based on the analog input signals VIp and VIm supplied as the differential analog input signal VIN, the first reference voltage VRP, the second reference voltage VRM, a first common voltage VC1, a second common voltage VC2, and the control signal CSW. The first and second common voltages VC1 and VC2 are arbitrary voltages.

The D/A converter 121 is a charge redistribution type CDAC. The D/A converter 121 includes a first conversion unit 131 and a second conversion unit 132.

The first conversion unit 131 includes main capacitors CA4p, CA3p, CA2p, CA1p, and CA0p that are weighted in a predetermined ratio, for example, 8:5:3:2:1, in the same manner as the first embodiment. In FIG. 35, the capacitances of the main capacitors CA4p to CA0p are respectively expressed as 8C, 5C, 3C, 2C, and 1C. Here, C represents capacitance. The main capacitors CA4p to CA0p each include a first terminal coupled to a common signal line LCp. Second terminals of the main capacitors CA4p, CA3p, CA2p, CA1p, and CA0p are respectively coupled to main switches SA4p, SA3p, SA2p, SA1p, and SA0p.

The main switch SA4p includes a common terminal coupled to the main capacitor CA4p, a terminal provided with the analog input signal VIp, a terminal supplied with the first reference voltage VRP, a terminal supplied with the second reference voltage VRM, and a terminal supplied with the second common voltage VC2. In response to a control signal CSWp, the main switch SA4p selectively supplies one of the analog input signal VIp, the first reference voltage VRP, the second reference voltage VRM, and the second common voltage VC2 to the main capacitor CA4p. The main switches SA3p to SA0p are configured in the same manner as the main switch SA4p. Accordingly, in response to the control signal CSWp, the main switches SA3p to SA0p selectively supply one of the analog input signal VIp, the first reference voltage VRP, the second reference voltage VRM, and the second common voltage VC2 to the main capacitor CA3p to CA0p. The common signal line LCp is coupled to a first terminal of a first reset switch SR0p, and a second terminal of the first reset switch SR0p is supplied with the first common voltage VC1. The control signal CSWp includes control signals for respectively controlling the main switches SA4p to SA0p and the reset switch SR0p.

The first conversion unit 131 also includes measurement capacitors CM2p, CM1p, and CM0p used to measure the capacitances of the main capacitors CA4p to CA2p, which are subject to measurement. The capacitances of the measurement capacitors CM2p to CM0p are weighted in a predetermined ratio, for example, 0.5:0.25:0.25 based on the capacitance of the main capacitor CA0p, which corresponds to the least significant bit. In FIG. 35, the capacitances of the measurement capacitors CM2p, CM1p, and CM0p are respectively expressed as 0.5C, 0.25C, and 0.25C. Here, C represents capacitance. First terminals of the measurement capacitors CM2p to CM0p are coupled to the common signal line LCp. Second terminals of the measurement capacitors CM2p, CM1p, and CM0p are respectively coupled to the measurement switches SM2p, SM1p, and SM0p. The measurement switches SM2p to SM0p are configured in the same manner as the main switch SA4p. Accordingly, in response to the control signal CSWp, the measurement switches SM2p to SM0p selectively supply one of the analog input signal VIp, the first reference voltage VRP, the second reference voltage VRM, and the second common voltage VC2 to the measurement capacitors CM2p to CM0p. The control signal CSWp includes control signals for respectively controlling the measurement switches SM2p to SM0p.

In the same manner, the second conversion unit 132 includes main capacitors CA4m, CA3m, CA2m, CA1m, and CA0m that are weighted in a predetermined ratio, for example, 8:5:3:2:1. In FIG. 35, the capacitances of the main capacitors CA4m to CA0m are respectively expressed as 8C, 5C, 3C, 2C, and 1C. Here, C represents capacitance. The main capacitors CA4m to CA0m each include a first terminal coupled to a common signal line LCm. Second terminals of the main capacitors CA4m, CA3m, CA2m, CA1m, and CA0$m$ are respectively coupled to main switches SA4$m$, SA3$m$, SA2$m$, SA1$m$, and SA0$m$.

The main switch SA4$m$ includes a common terminal coupled to the main capacitor CA4$m$, a terminal provided with the analog input signal VIm, a terminal supplied with the first reference voltage VRP, a terminal supplied with the second reference voltage VRM, and a terminal supplied with the second common voltage VC2. In response to a control signal CSWm, the main switch SA4$m$ selectively supplies one of the analog input signal VIm, the first reference voltage VRP, the second reference voltage VRM, and the second common voltage VC2 to the main capacitor CA4$m$. The main switches SA3$m$ to SA0$m$ are configured in the same manner as the main switch SA4$m$. Accordingly, in response to the control signal CSWm, the main switches SA3$m$ to SA0$m$ selectively supply one of the analog input signal VIm, the first reference voltage VRP, the second reference voltage VRM, and the second common voltage VC2 to the main capacitor CA3$m$ to CA0$m$. The common signal line LCm is coupled to a first terminal of a second reset switch SROm, and a second terminal of the second reset switch SROm is supplied with the first common voltage VC1. The control signal CSWm includes control signals for respectively controlling the main switches SA4$m$ to SA0$m$ and the reset switch SROm.

The second conversion unit 132 also includes measurement capacitors CM2$m$ to CM0$m$ used to measure the capacitances of the main capacitors CA4$m$ to CA2$m$, which are subject to measurement. The capacitances of the measurement capacitors CM2$m$ to CM0$m$ are weighted in a predetermined ratio, for example, 0.5:0.25:0.25 based on the capacitance of the main capacitor CA0$m$, which corresponds to the least significant bit. In FIG. 35, the capacitances of the measurement capacitors CM2$m$, CM1$m$, and CM0$m$ are respectively expressed as 0.5C, 0.25C, and 0.25C. Here, C represents capacitance. First terminals of the measurement capacitors CM2$m$ to CM0$m$ are coupled to the common signal line LCm. Second terminals of the measurement capacitors CM2$m$ to CM0$m$ are respectively coupled to the measurement switches SM2$m$ to SM0$m$. In response to the control signal CSWm, the measurement switches SM2$m$ to SM0$m$ selectively supply one of the analog input signal VIm, the first reference voltage VRP, the second reference voltage VRM, and the second common voltage VC2 to the measurement capacitors CM2$p$ to CM0$p$. The control signal CSWm includes control signals for respectively controlling the measurement switches SM2$m$ to SM0$m$.

Each switch is not restricted to the configuration illustrated in FIG. 35. For example, the main switch SA4$p$ may have any configuration as long as it is able to selectively supply one of the analog input signal VIp, the first reference voltage VRP, the second reference voltage VRM, and the second common voltage VC2 to the main capacitor CA4$p$. For example, the main switch SA4$p$ may be configured by four switches coupled to the main capacitor CA4$p$. The same applies to the other switches SA3$p$ to SA0$p$, SM2$p$ to SM0$p$, SA4$m$ to SA0$m$, and SM2$m$ to SM0$m$.

The common signal line LCp of the first conversion unit 131 is coupled to an inverting input terminal of the comparator 122. The common signal line LCm of the second conversion unit 132 is coupled to a non-inverting input terminal of the comparator 122. The first conversion unit 131 generates the output voltage Vop at the common signal line LCp based on the analog input signal VIp. The second conversion unit 132 generates the output voltage Vom at the common signal line LCm based on the analog input signal VIm. The comparator 122 compares the output voltages Vop and Vom output from the D/A converter 101 and generates the determination signal Ka in accordance with the comparison result. The determination signal Ka is provided to the conversion control circuit 123 and the measurement control circuit 124.

The conversion control circuit 123 generates a latch signal CLa, a conversion control signal CSa, and a digital signal Db based on the determination signal Ka. For example, the conversion control circuit 123 includes a register that successively holds the value of the determination signal Ka and a logic circuit that generates the digital signal Db and the conversion control signal CSa. The conversion control circuit 123 outputs the digital signal Db in accordance with the value of the determination signal Ka held by the register. The digital signal Db includes five bit signals corresponding to the main capacitors CA4$p$ to CA0$p$ and CA4$m$ to CA0$m$ of the D/A converter 121.

Based on the determination signal Ka, the measurement control circuit 124 generates a latch signal CLb, a measurement control signal CSb, and a capacitance signal Wa. For example, the measurement control circuit 124 includes a logic circuit that generates the measurement control signal CSb based on the determination signal Ka and a register that holds the value of the measurement control signal CSb. In the fifth embodiment, the measurement control circuit 124 changes the value of the measurement control signal CSb to sequentially measure capacitances of the main capacitors CA4$p$ to CA2$p$ and CA4$m$ to CA2$m$ and store the value of the measurement control signal CSb whenever measuring each capacitance. Further, the measurement control circuit 124 outputs the capacitance signal Wa including the capacitance of one of the main capacitors CA4$p$ to CA2$p$ and CA4$m$ to CA2$m$.

In the same manner as the fourth embodiment, the measurement control circuit 124 measures the capacitances of the main capacitors CA2$p$ and CA2$m$ using the main capacitors CA1$p$, CA1$m$, CA0$p$, and CA0$m$ and the measurement capacitors CM2$p$ to CM0$p$ and CM2$m$ to CM0$m$. Further, the measurement control circuit 124 measures the capacitances of the main capacitors CA3$p$ and CA3$m$ using the main capacitors CA2$p$ to CA0$p$ and CA2$m$ to CA0$m$ and the measurement capacitors CM2$p$ to CM0$p$ and CM2$m$ to CM0$m$. The measurement control circuit 124 also measures the capacitances of the main capacitors CA4$p$ and CA4$m$ using the main capacitors CA3$p$ to CA0$p$ and CA3$m$ to CA0$m$ and the measurement capacitors CM2$p$ to CM0$p$ and CM2$m$ to CM0$m$.

The selection circuit 126 is provided with the conversion control signal CSa from the conversion control circuit 123 and the measurement control signal CSb from the measurement control circuit 124. The selection circuit 126 is also provided with a selection signal SEL. The selection circuit 126 selects the conversion control signal CSa when the selection signal SEL has the first level and outputs the conversion control signal CSa as the control signal CSW. The selection circuit 126 selects the measurement control signal CSb when the selection signal SEL has the second level and outputs the measurement control signal CSb as the control signal CSW. The control signal CSW includes a control signal CSWp that controls the switches SA4$p$ to SA0$p$ and SM2$p$ to SM0$p$ of the first conversion unit 131 and a control signal CSWm that controls the switches SA4$m$ to SA0$m$ and SM2$m$ to SM0$m$ of the second conversion unit 132. Although not illustrated in the drawings, the conversion control signal CSa and the measurement control signal CSb each include control signals that respectively control the switches SA4$p$ to SA0$p$ and SM2$p$ to SM0$p$ of the first conversion unit 131 and control signals that respectively control the switches SA4m to SA0m and SM2m to SM0m of the second conversion unit 132.

In the same manner, the selection circuit 127 is provided with the latch signal CLa from the conversion control circuit 123, the latch signal CLb from the measurement control circuit 124, and the selection signal SEL. When the selection signal SEL has a first level, the selection circuit 127 selects the latch signal CLa and outputs the latch signal CLa as a latch signal CL. When the selection signal SEL has a second level, the selection circuit 127 selects the latch signal CLb and outputs the latch signal CLb as the latch signal CL. Accordingly, during the A/D conversion process, the conversion control circuit 123 controls the D/A converter 121 and the comparator 122. During the capacitance measurement process, the measurement control circuit 124 controls the D/A converter 121 and the comparator 122.

The correction circuit 125 corrects the digital signal Db, which is output from the conversion control circuit 123, based on the capacitance signal Wa, which is output from the measurement control circuit 124, to generate the digital output signal DOUT. The correction circuit 125 calculates the voltage of the analog input signal VIN based on the digital signal Db and the capacitance signal Wa. The correction circuit 125 converts the voltage of the analog input signal VIN to the four-bit digital output signal DOUT. Then, the correction circuit 125 outputs the digital output signal DOUT.

The operation of the A/D conversion circuit 120 will now be described. FIGS. 36A to 37C illustrate the main capacitors CA4p to CA0p and CA4m to CA0m, the measurement capacitors CM2p to CM0p and CM2m to CM0m, and the comparator 122 but do not illustrate the other components.

Figure 36A:
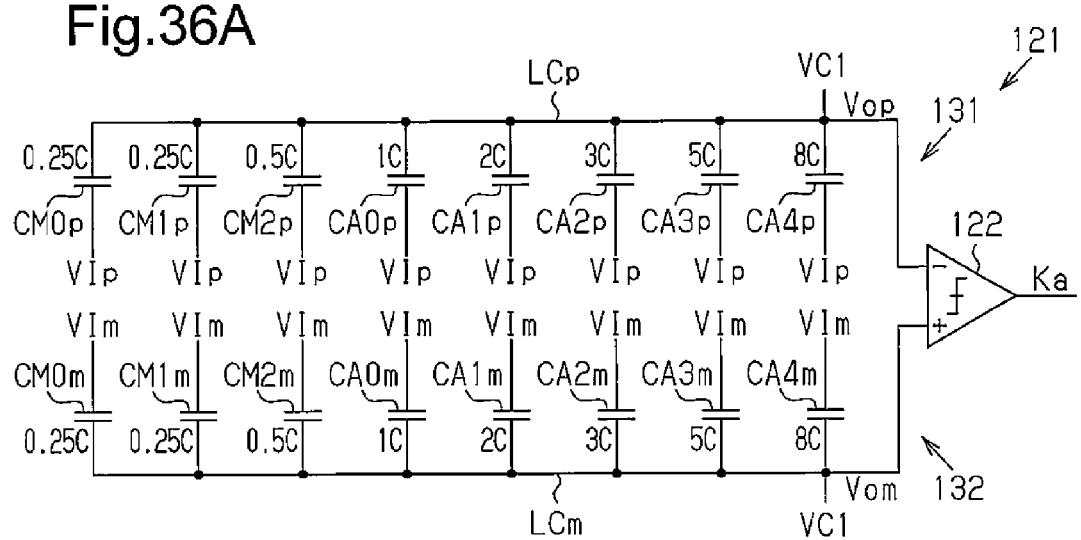
FIGS. 36A to 36C and 37A to 37C are schematic circuit diagrams illustrating an A/D conversion process performed by the A/D conversion circuit of FIG. 35.

Referring to FIG. 36A, the D/A converter 121 first samples the analog input signals VIp and VIm. In the first conversion unit 131, the second terminals of the main capacitors CA4p to CA0p and the measurement capacitors CM2p to CM0p are provided with the analog input signal VIp, and the common signal line LCp is supplied with the first common voltage VC1. Likewise, in the second conversion unit 132, the second terminals of the main capacitors CA4m to CA0m and the measurement capacitors CM2m to CM0m are provided with the analog input signal VIm, and the common signal line LCm is supplied with the first common voltage VC1.

Figure 36B:
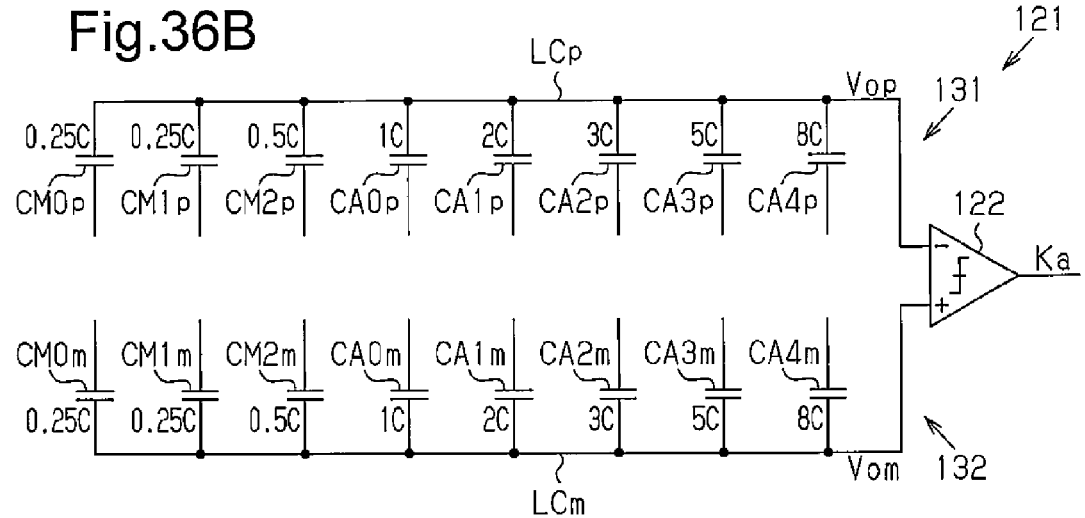

Then, referring to FIG. 36B, the switches SA4p to SA0p, SM2p to SM0p, and SR0p of the first conversion unit 131 and the switches SA4m to SA0m, SM2m to SM0m, and SR0m of the second conversion unit 132 (refer to FIG. 35) are deactivated to hold charge.

Figure 36C:
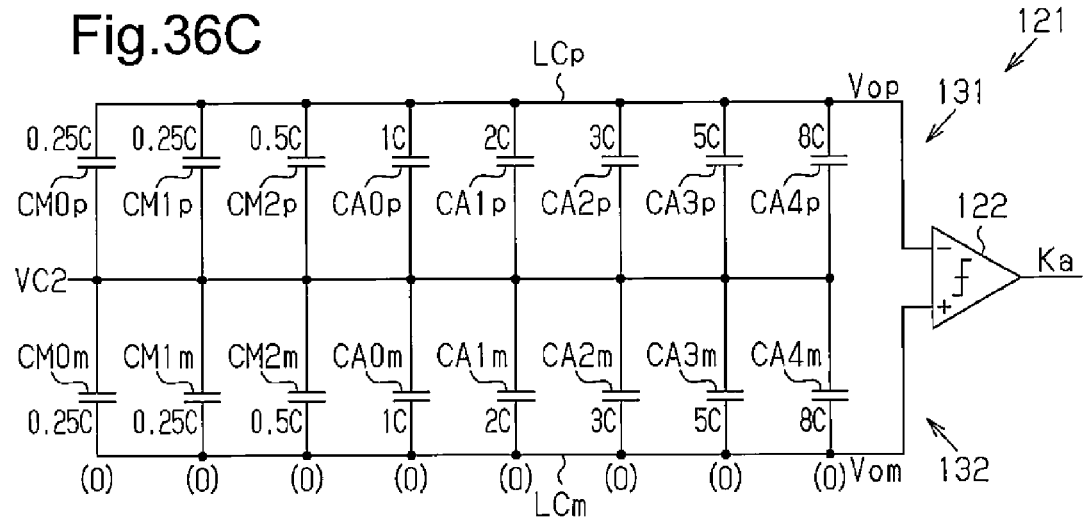

Referring to FIG. 36C, in the first conversion unit 131, the second common voltage VC2 is supplied to the second terminals of the main capacitors CA4p to CA0p and the measurement capacitors CM2p to CM0p. In the same manner, in the second conversion unit 132, the second common voltage VC2 is supplied to the second terminals of the main capacitors CA4m to CA0m and the measurement capacitors CM2m to CM0m. In FIG. 36C, the numerals in parentheses (0) indicate the control signals CSWp and CSWm provided to the main switches SA4p to SA0p and SA4m to SA0m and the measurement switches SM2p to SM0p and SM2m to SM0m illustrated in FIG. 35.

The comparator 122 compares the output voltage Vop at the common signal line LCp with the output voltage Vom of the common signal line LCm to output the determination signal Ka, which indicates the comparison result. The MSB (Db4) of the digital signal Db has a value (−1 or +1) that is determined in accordance with the level (high or low) of the determination signal Ka. For example, when the determination signal Ka has a high level, the signal Db4 is set to −1. When the determination signal Ka has a low level, the signal Db4 is set to +1.

Figure 37A:
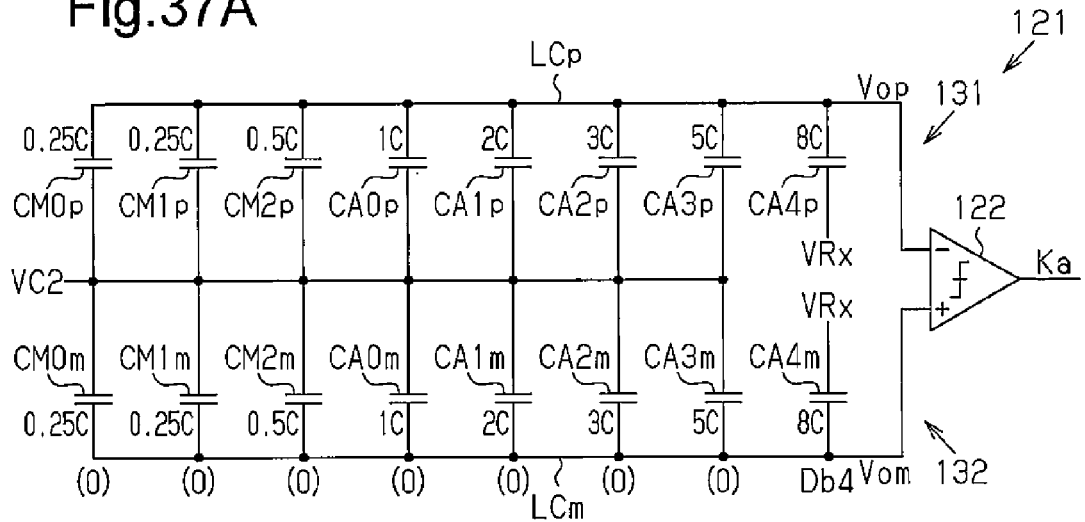

Then, referring to FIG. 37A, based on the signal Db4 (−1 or +1), the main capacitors CA4p and CA4m, which are in a differential relationship, are supplied with the reference voltages VRx (first reference voltage VRP or second reference voltage VRM) in a complementary manner. For example, when the signal Db4 is −1, the main capacitor CA4p is supplied with the first reference voltage VRP, and the main capacitor CA4m is supplied with the second reference voltage VRM. When the signal Db4 is +1, the main capacitor CA4p is supplied with the second reference voltage VRM, and the main capacitor CA4m is supplied with the first reference voltage VRP. This changes the output voltages Vop and Vom in accordance with the reference voltages VRP and VRM supplied to the main capacitors CA4p and CA4m. The comparator 122 compares the output voltages Vop and Vom to generate the determination signal Ka and then determines the value of the signal Db3 in accordance with the level of the determination signal Ka.

Figure 37B:
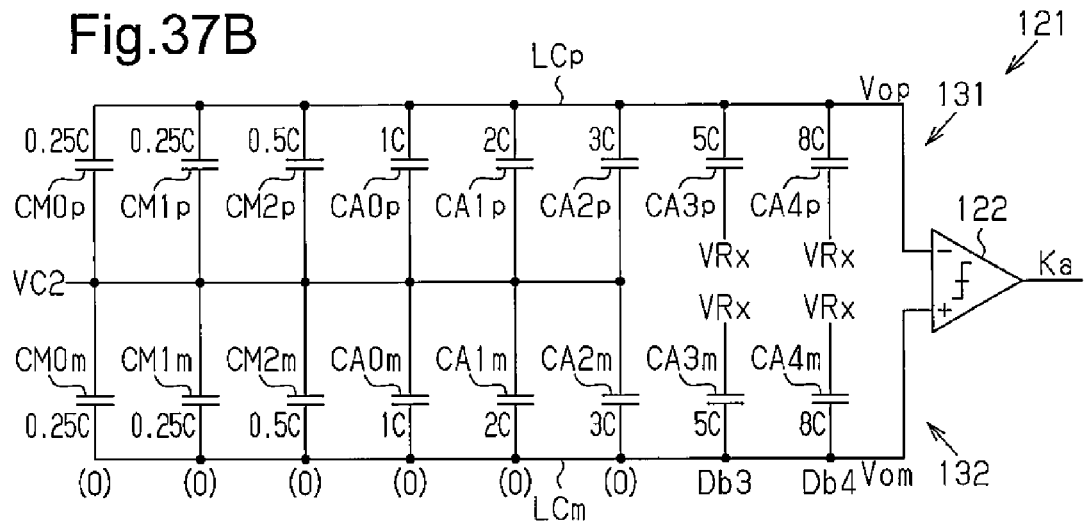

Then, referring to FIG. 37B, based on the signal Db3, the main capacitors CA3p and CA3m are supplied with the reference voltages VRx (first reference voltage VRP or second reference voltage VRM) in a complementary manner. This changes the output voltages Vop and Vom in accordance with the reference voltages VRP and VRM supplied to the main capacitors CA3p and CA3m. The comparator 122 compares the output voltages Vop and Vom to generate the determination signal Ka and then determines the value of the signal Db2 in accordance with the level of the determination signal Ka.

Figure 37C:
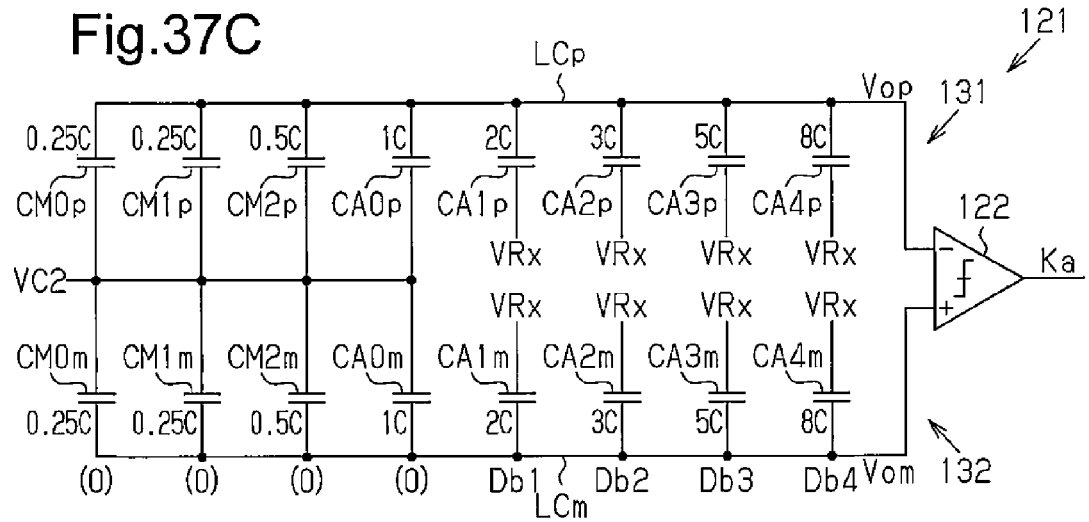

Then, referring to FIG. 37C, based on the signal Db2, the main capacitors CA2p and CA2m are supplied with the reference voltages VRx (first reference voltage VRP or second reference voltage VRM) in a complementary manner. After determining the value of the signal Db1, the main capacitors CA1p and CA1m are supplied with the reference voltages VRx (first reference voltage VRP or second reference voltage VRM) in a complementary manner based on the signal Db1. This changes the output voltages Vop and Vom in accordance with the reference voltages VRP and VRM supplied to the main capacitors CA4p to CA1p and CA4m to CA1m. The comparator 122 compares the output voltages Vop and Vom to generate the determination signal Ka and then determines the value of the signal Db0 in accordance with the level of the determination signal Ka.

Through the above processes, the conversion control circuit 123 of FIG. 35 outputs digital signal Db including the digital signals Db4 to Db0.

The fifth embodiment has the advantages described below.

(5-1) In the same manner as the first to fourth embodiments, the digital signal Db, which is converted from the analog input signals VIp and VIm, is corrected with the capacitances of the main capacitors CA4p to CA2p and CA4m to CM2m to generate the digital output signal DOUT. This shortens the A/C conversion time.

(5-2) The A/C conversion circuit 120 converts the analog input signals VIp and VIm to digital output signals DOUT. In the same manner as the third and fourth embodiments, the A/D conversion circuit 120 sets the redundant range about the determination value. Accordingly, a determination error is corrected when determining a lower order bit, and high conversion accuracy is obtained.

(5-3) The A/D conversion circuit 120 is of a fully differential type. Thus, the differential voltage of the output voltages Vop and Vom of the D/A conversion circuit 121 is not affected by in-phase noise. This reduces erroneous determinations caused by in-phase noise.

(5-4) The second common voltage VC2 is supplied to the second terminals of the main capacitors CA4p to CA0p and CA4m to CA0m and the measurement capacitors CM2p to CM0p and CM2m to CM0m. This limits potential changes at the common signal lines LCp and LCm. Accordingly, the DC potential of the output voltages Vop and Vom at the common signal lines LCp and LCm may be stabilized.

It should be apparent to those skilled in the art that the present invention may be embodied in many other specific forms without departing from the spirit or scope of the invention. Particularly, it should be understood that the present invention may be embodied in the following forms.

In the first embodiment, the correction signal 15 may output a five-bit digital output signal DOUT. The conversion control circuit 13 outputs a five-bit digital signal Da. The bits of the digital signal Da are non-binary weighted in accordance with the capacitance ratio of the main capacitors CA4 to CA0 in the D/A converter 11. The correction circuit 15 converts the bits of the digital signal Da to binary-weighted bits and generates the output signal DOUT. The second to fifth embodiments may be modified in the same manner.

In each of the above embodiments, the correction circuit 15 rounds off the value of the digital output signal DOUT after the decimal point to the nearest whole number. Instead the correction circuit 15 may simply round up or round down the value of the digital output signal DOUT after the decimal point.

The fourth and fifth embodiments are modifications of the third embodiment. However, the circuits of the first and second embodiments may be changed to differential A/D conversion circuits.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a illustrating of the superiority and inferiority of the invention. Although embodiments of the present invention have been described in detail, it should be understood that various changes, substitutions, and alterations could be made hereto without departing from the spirit and scope of the invention.

The invention claimed is:

1. An analog-to-digital conversion circuit that converts an analog input signal to a digital output signal, the analog-to-digital conversion circuit comprising:
  a digital-to-analog converter including
    a plurality of capacitors, each including a first terminal and a second terminal, wherein the first terminal is coupled to a common signal line, and each of the capacitors has a capacitance that is less than or equal to a sum of the capacitances of one or more lower order capacitors,
    a plurality of switches respectively coupled to the second terminals of the capacitors, wherein each of the switches is configured to selectively supply, in response to a control signal, one of the analog input signal, a first reference voltage, and a second reference voltage to the second terminal of the corresponding capacitor, and
    a reset switch that supplies the common signal line with a first voltage that is between the first reference voltage and the second reference voltage;
  a comparator that compares the first voltage with a second voltage at the common signal line to generate a determination signal;
  a conversion control circuit that generates the control signal and a multiple-bit digital signal in accordance with the determination signal;
  a measurement control circuit that generates the control signal in accordance with the determination signal, wherein the measurement control circuit is configured to measure the capacitance of one of the capacitors that corresponds to an upper order bit of the multiple-bit digital signal using one or more lower order capacitors; and
  a correction circuit that corrects the multiple-bit digital signal based on the capacitance measured by the measurement control circuit to generate the digital output signal, wherein:
  the plurality of capacitors include a plurality of main capacitors corresponding to the multiple-bit digital signal; and
  the conversion control circuit is configured to
    generate the control signal to supply the second terminals of the plurality of capacitors with a middle voltage that is between the first reference voltage and the second reference voltage, and
    selectively supply the first reference voltage or the second reference voltage to the second terminal of each of the main capacitors in accordance with the multiple-bit digital signal that is determined based on the determination signal.

2. The analog-to-digital conversion circuit according to claim 1, wherein:
  the digital-to-analog converter further includes a plurality of coupling capacitors, each coupled between two adjacent ones of the main capacitors;
  the main capacitors have equivalent capacitances based on capacitances of the coupling capacitors; and
  the equivalent capacitance of each of the main capacitors is less than or equal to a sum of the equivalent capacitances of one or more lower order main capacitors.

3. The analog-to-digital conversion circuit according to claim 1, wherein:
  the plurality of capacitors further include
    a plurality of measurement capacitors, each having a smaller capacitance than the one of the main capacitors corresponding to the least significant bit of the multiple-bit digital signal;
  the plurality of switches include
    a plurality of main switches respectively coupled to the second terminals of the plurality of main capacitors, and
    a plurality of measurement switches respectively coupled to the second terminals of the plurality of measurement capacitors;
  a sum of the capacitances of the measurement capacitors is equal to the capacitance of the main capacitor corresponding to the least significant bit;
  the capacitance of one of the main capacitors corresponding to an upper order bit of the multiple-bit digital signal is less than or equal to a sum of the capacitances of one or more lower order main capacitors and the capacitances of the plurality of measurement capacitors; and the measurement control circuit is configured to measure the capacitance of the main capacitor corresponding to the upper order bit of the multiple-bit digital signal using the one or more lower order main capacitors and the plurality of measurement capacitors.

4. The analog-to-digital conversion circuit according to claim 1, wherein
the multiple-bit digital signal generated based on the capacitances of the plurality of capacitors has a code width that is larger than or equal to a code width of the digital output signal, and
the correction circuit is configured to generate the digital output signal based on the capacitances measured by the measurement control circuit, the code width of the multiple-bit digital signal, and the code width of the digital output signal.

5. An analog-to-digital conversion circuit that converts a differential analog input signal to a digital output signal, the analog-to-digital conversion circuit comprising:
a digital-to-analog converter including a first conversion unit and a second conversion unit, wherein
the first conversion unit includes
a plurality of first capacitors, each including a first terminal and a second terminal, wherein the first terminal is coupled to a first common signal line, and one of the first capacitors that corresponds to an upper order bit of a multiple-bit digital signal has a capacitance that is less than or equal to a sum of the capacitances of one or more lower order first capacitors,
a plurality of first switches respectively coupled to the second terminals of the first capacitors, wherein each of the first switches is configured to selectively supply, in response to a first control signal, one of a first input signal of the differential analog input signal, a first reference voltage, and a second reference voltage to the second terminal of the corresponding first capacitor, and
a first reset switch that supplies the first common signal line with a first voltage having a given voltage value, and
the second conversion unit includes
a plurality of second capacitors, each including a first terminal and a second terminal, wherein the first terminal is coupled to a second common signal line, and one of the second capacitors that corresponds to an upper order bit of the multiple-bit digital signal has a capacitance that is less than or equal to a sum of the capacitances of one or more lower order second capacitors,
a plurality of second switches respectively coupled to the second terminals of the second capacitors, wherein each of the second switches is configured to selectively supply, in response to a second control signal, one of a second input signal of the differential analog input signal, the first reference voltage, and the second reference voltage to the second terminal of the corresponding second capacitor, and
a second reset switch that supplies the second common signal line with the first voltage;
a comparator that compares a second voltage at the first common signal line with a third voltage at the second common signal line to generate a determination signal;
a conversion control circuit that generates the first control signal, the second control signal, and the multiple-bit digital signal in accordance with the determination signal;
a measurement control circuit that generates the first control signal and the second control signal in accordance with the determination signal, wherein the measurement control circuit is configured to measure the capacitances of one of the first capacitors and one of the second capacitors, which are selected as measurement subjects, using one or more lower order first capacitors and one or more lower order second capacitors; and
a correction circuit that corrects the multiple-bit digital signal based on the capacitances measured by the measurement control circuit to generate the digital output signal, wherein:
the plurality of first capacitors include a plurality of first main capacitors corresponding to the multiple-bit digital signal;
the plurality of second capacitors include a plurality of second main capacitors corresponding to the multiple-bit digital signal; and
the conversion control circuit is configured to
supply a fourth voltage having a given voltage value to the second terminals of the first main capacitors and the second terminals of the second main capacitors, and
selectively supply the first reference voltage or the second reference voltage to the second terminal of each of the first main capacitors and the second terminal of each of the second main capacitors in accordance with the multiple-bit digital signal that is determined based on the determination signal.

6. The analog-to-digital conversion circuit according to claim 5, wherein:
the first conversion unit further includes a plurality of first coupling capacitors, each coupled between two adjacent ones of the first main capacitors;
the first main capacitors have equivalent capacitances based on capacitances of the first coupling capacitors;
the equivalent capacitance of each of the first main capacitors is less than or equal to a sum of the equivalent capacitances of one or more lower order first main capacitors;
the second conversion unit further includes a plurality of second coupling capacitors, each coupled between two adjacent ones of the second main capacitors;
the second main capacitors have equivalent capacitances based on capacitances of the second coupling capacitors;
the equivalent capacitance of each of the second main capacitors is less than or equal to a sum of the equivalent capacitances of one or more lower order second main capacitors.

7. The analog-to-digital conversion circuit according to claim 5, wherein:
the plurality of first capacitors further include a plurality of first measurement capacitors, each having a smaller capacitance than the one of the first main capacitors corresponding to the least significant bit of the multiple-bit digital signal;
the plurality of first switches include
a plurality of first main switches respectively coupled to the second terminals of the plurality of first main capacitors, and a plurality of first measurement switches respectively coupled to the second terminals of the plurality of first measurement capacitors;

the plurality of second capacitors further include a plurality of second measurement capacitors, each having a smaller capacitance than the one of the second main capacitors corresponding to the least significant bit of the multiple-bit digital signal;

the plurality of second switches include
- a plurality of second main switches respectively coupled to the second terminals of the plurality of second main capacitors, and
- a plurality of second measurement switches respectively coupled to the second terminals of the plurality of second measurement capacitors; and the measurement control circuit is configured to measure the capacitances of the first main capacitor and the second main capacitor that correspond to an upper order bit of the multiple-bit digital signal using one or more lower order first main capacitors, one or more lower order second main capacitors, the plurality of first measurement capacitors, and the plurality of second measurement capacitors.

8. The analog-to-digital conversion circuit according to claim 5, wherein the multiple-bit digital signal generated based on the capacitances of the plurality of first capacitors and the capacitances of the plurality of second capacitors has a code width that is larger than or equal to a code width of the digital output signal, and the correction circuit is configured to generate the digital output signal based on the capacitances measured by the measurement control circuit, the code width of the multiple-bit digital signal, and the code width of the digital output signal.

* * * * *